(12) United States Patent
Miyairi et al.

(10) Patent No.: US 10,074,672 B2
(45) Date of Patent: Sep. 11, 2018

(54) DEVICE, MANUFACTURING METHOD THEREOF, AND ELECTRONIC DEVICE

(71) Applicant: Semiconductor Energy Laboratory Co., Ltd., Atsugi-shi, Kanagawa-ken (JP)

(72) Inventors: Hidekazu Miyairi, Kanagawa (JP); Tomoaki Moriwaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/622,255

(22) Filed: Jun. 14, 2017

(65) Prior Publication Data

US 2017/0287940 A1   Oct. 5, 2017

Related U.S. Application Data

(62) Division of application No. 15/011,848, filed on Feb. 1, 2016, now Pat. No. 9,728,559.

(30) Foreign Application Priority Data

Feb. 6, 2015   (JP) ................................ 2015-022396
Mar. 17, 2015  (JP) ................................ 2015-053431

(51) Int. Cl.
   *H01L 27/12*   (2006.01)
   *H01L 29/786*  (2006.01)

(52) U.S. Cl.
   CPC ........ *H01L 27/124* (2013.01); *H01L 27/1225* (2013.01); *H01L 27/1262* (2013.01);
   (Continued)

(58) Field of Classification Search
   CPC ....... H01L 2924/00; H01L 2924/00014; H01L 2924/0002; H01L 2924/1305;
   (Continued)

(56) References Cited

U.S. PATENT DOCUMENTS 5,282,162 A    1/1994  Ochii
5,451,543 A *  9/1995  Woo .................. H01L 21/76816
                                            257/E21.577
(Continued)

FOREIGN PATENT DOCUMENTS

CN    103022012 A    4/2013
EP      1737044 A   12/2006
(Continued)

OTHER PUBLICATIONS

Berthelot.A et al., "Highly Reliable TiN/ZrO2/TiN 3D Stacked Capacitors for 45 nm Embedded DRAM Technologies", Proceedings of 36th European Solid-State Device Research Conference 2006, Sep. 19, 2006, pp. 343-346.

(Continued)

*Primary Examiner* — Jonathan Han
(74) *Attorney, Agent, or Firm* — Fish & Richardson P.C.

(57) ABSTRACT

A wiring having excellent electrical characteristics is provided. A wiring having stable electrical characteristics is provided. A device is manufactured through the steps of forming a first insulating film over a substrate, forming a second insulating film over the first insulating film, removing part of the first insulating film and part of the second insulating film to form a first opening, forming a first conductor in the first opening and over a top surface of the second insulating film, and forming a second conductor by planarizing a surface of the first conductor so as to remove part of the first conductor.

12 Claims, 57 Drawing Sheets

(52) U.S. Cl.
CPC .... *H01L 29/7869* (2013.01); *H01L 29/78603* (2013.01); *H01L 29/78696* (2013.01)

(58) Field of Classification Search
CPC ..... H01L 2924/13091; H01L 2924/014; H01L 29/7869; H01L 27/0688
USPC ... 257/E21.575–E21.597, E21.627, E21.641, 257/774, E23.011, E21.585, E21.59, 257/E23.068, E23.145, E23.168
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,886,375 A * | 3/1999 | Sun | H01L 27/1108 257/296 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,183,630 B2 | 5/2012 | Batude et al. | |
| 8,264,083 B2 * | 9/2012 | Nawata | H01L 21/76802 257/211 |
| 8,314,637 B2 * | 11/2012 | Kato | G11C 14/0063 326/102 |
| 8,389,417 B2 | 3/2013 | Yamazaki et al. | |
| 8,432,187 B2 | 4/2013 | Kato et al. | |
| 8,575,985 B2 | 11/2013 | Ohmaru et al. | |
| 8,773,906 B2 | 7/2014 | Ohmaru | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0294822 A1 | 12/2009 | Batude et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0227143 A1 | 9/2011 | Lee et al. | |
| 2011/0248270 A1 | 10/2011 | Fukumoto et al. | |
| 2012/0170355 A1 | 7/2012 | Ohmaru et al. | |
| 2013/0020570 A1 | 1/2013 | Yamazaki | |
| 2013/0048977 A1 | 2/2013 | Watanabe et al. | |
| 2013/0069132 A1 | 3/2013 | Atsumi et al. | |
| 2013/0140569 A1 | 6/2013 | Yoneda et al. | |
| 2013/0193433 A1 | 8/2013 | Yamazaki | |
| 2013/0234131 A1 | 9/2013 | Tanaka et al. | |
| 2013/0270552 A1 | 10/2013 | Yamazaki et al. | |
| 2013/0299818 A1 | 11/2013 | Tanaka | |
| 2013/0320330 A1 | 12/2013 | Yamazaki | |
| 2014/0004656 A1 | 1/2014 | Sasagawa et al. | |
| 2014/0035935 A1 * | 2/2014 | Shenoy | H01L 23/15 345/501 |
| 2014/0048802 A1 | 2/2014 | Ohmaru et al. | |
| 2014/0325249 A1 | 10/2014 | Toyotaka | |
| 2014/0326992 A1 | 11/2014 | Hondo et al. | |
| 2014/0326994 A1 | 11/2014 | Tanaka | |
| 2014/0332800 A1 | 11/2014 | Hanaoka | |
| 2015/0108470 A1 | 4/2015 | Yamazaki et al. | |
| 2015/0187823 A1 | 7/2015 | Miyairi et al. | |
| 2015/0214256 A1 | 7/2015 | Miyairi | |

FOREIGN PATENT DOCUMENTS

| | | |
|---|---|---|
| EP | 2131397 A | 12/2009 |
| EP | 2226847 A | 9/2010 |
| JP | 60-198861 A | 10/1985 |
| JP | 63-210022 A | 8/1988 |
| JP | 63-210023 A | 8/1988 |

(56) References Cited

FOREIGN PATENT DOCUMENTS

| | | |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 05-275613 A | 10/1993 |
| JP | 05-347360 A | 12/1993 |
| JP | 08-264794 A | 10/1996 |
| JP | 11-505377 | 5/1999 |
| JP | 2000-012686 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-200640 A | 7/2004 |
| JP | 2004-273614 A | 9/2004 |
| JP | 2004-273732 A | 9/2004 |
| JP | 2005-109063 A | 4/2005 |
| JP | 2007-096055 A | 4/2007 |
| JP | 2007-123861 A | 5/2007 |
| JP | 2009-302530 A | 12/2009 |
| JP | 2010-056227 A | 3/2010 |
| JP | 2010-062378 A | 3/2010 |
| JP | 2013-009297 A | 1/2013 |
| JP | 2013-102133 A | 5/2013 |
| JP | 2013-110360 A | 6/2013 |
| JP | 2014-187378 A | 10/2014 |
| KR | 2012-0079817 A | 7/2012 |
| KR | 2013-0031794 A | 3/2013 |
| TW | 201239882 | 10/2012 |
| TW | 201330231 | 7/2013 |
| WO | WO-2004/114391 | 12/2004 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID DIGEST '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O Tfts", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)5$ Films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage controlled amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 35, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-IN. AMOLED Display With Driver Circuit Using Amorphous In—Ga—Zn—Oxide TFTS", IDW '09 : Proceedings of the 16th International Display Workshops, 2009, pp. 689-692.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 33, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 IN. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

(56) References Cited

OTHER PUBLICATIONS

International Search Report (Application No. PCT/IB2016/050366) dated May 10, 2016.
Written Opinion (Application No. PCT/IB2016/050366) dated May 10, 2016.

* cited by examiner

500

500

FIG. 34A
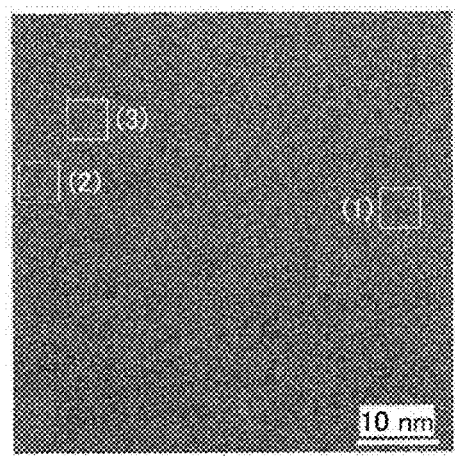
FIG. 34B    FIG. 34C    FIG. 34D
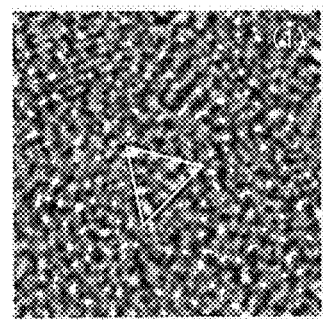 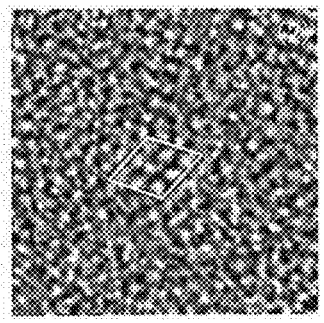 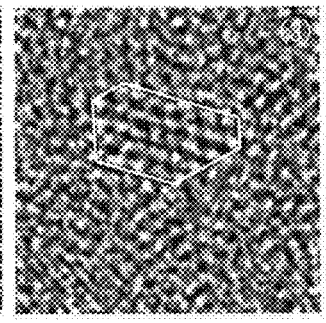

FIG. 41A
FIG. 41B
FIG. 41C
FIG. 41D
FIG. 41E
FIG. 41F
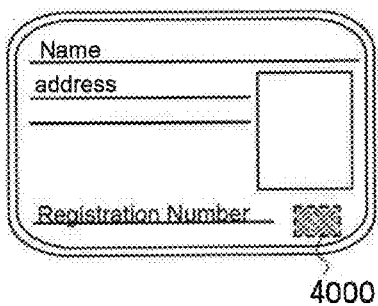
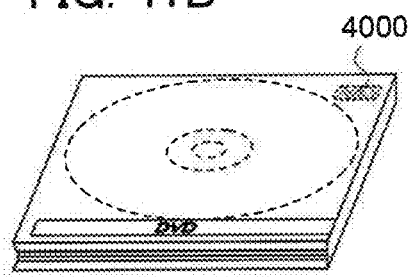
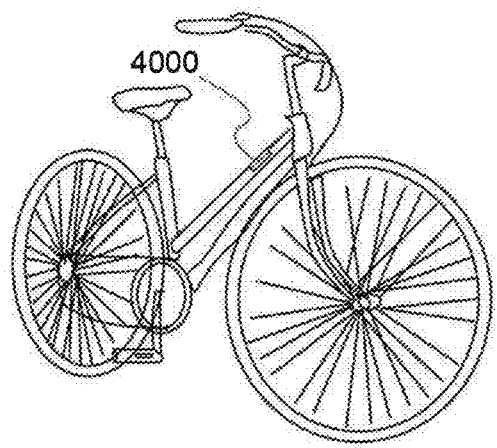
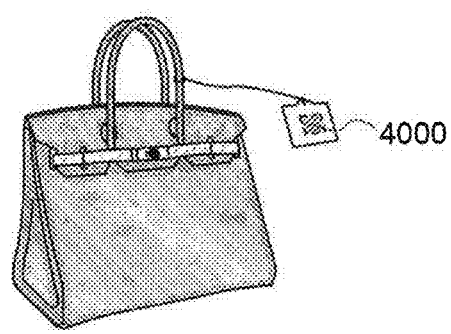
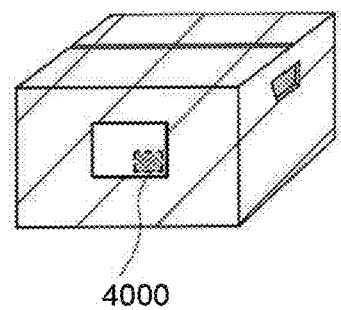

DEVICE, MANUFACTURING METHOD THEREOF, AND ELECTRONIC DEVICE

CROSS-REFERENCE TO RELATED APPLICATIONS

This application is a divisional of U.S. application Ser. No. 15/011,848, filed Feb. 1, 2016, now allowed, which claims the benefit of foreign priority applications filed in Japan as Serial No. 2015-022396 on Feb. 6, 2015, and Serial No. 2015-053431 on Mar. 17, 2015, all of which are incorporated by reference.

TECHNICAL FIELD

The present invention relates to an object, a method, or a manufacturing method. Further, the present invention relates to a process, a machine, manufacture, or a composition of matter. In particular, the present invention relates to, for example, an electrode, a device, a semiconductor, a semiconductor device, a display device, a light-emitting device, a lighting device, a power storage device, a mirror image device, a memory device, or a processor. The present invention relates to a method for manufacturing an electrode, a semiconductor, a semiconductor device, a display device, a light-emitting device, a lighting device, a power storage device, a mirror image device, a memory device, or a processor. The present invention relates to a method for driving an electrode, a semiconductor device, a display device, a light-emitting device, a lighting device, a power storage device, a mirror image device, a memory device, or a processor.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

Recently, devices including miniaturized elements have been required for electronic devices with higher performance, smaller size, and lighter weight. With the miniaturization of the devices, requirements for the miniaturization of wiring layers have become stricter. Moreover, for example, wiring layers with low resistance are necessary to form devices having excellent properties (see Patent Document 1).

REFERENCE

Patent Document

[Patent Document 1] Japanese Published Patent Application No. H05-347360

DISCLOSURE OF INVENTION

An object of one embodiment of the present invention is to provide a method for forming a wiring having excellent electrical characteristics. Another object of one embodiment of the present invention is to provide a method for forming a wiring having stable electrical characteristics. Another object of one embodiment of the present invention is to provide a method for forming a minute wiring. Another object of one embodiment of the present invention is to provide a method for embedding a conductor in an insulator. Another object of one embodiment of the present invention is to provide a miniaturized semiconductor device.

Another object of one embodiment of the present invention is to provide a method for manufacturing a device having excellent electrical characteristics. Another object of one embodiment of the present invention is to provide a method for manufacturing a device having stable electrical characteristics. Another object of one embodiment of the present invention is to provide a method for manufacturing a highly reliable device. Another object of one embodiment of the present invention is to provide a method for manufacturing a device with a high yield.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a method for manufacturing a device which includes an element, an electrode, and a region where the electrode and the element are connected, including the steps of forming a first insulating film over a substrate, forming a second insulating film over the first insulating film, removing part of the first insulating film and part of the second insulating film to form a first opening, forming a first conductor in the first opening and over a top surface of the second insulating film, forming a second conductor by planarizing a surface of the first conductor so as to remove part of the first conductor, forming a third insulating film over the second insulating film and the second conductor, removing part of the second insulating film and part of the third insulating film to form a second opening so as to expose part of a top surface and part of a side surface of the second conductor, forming a third conductor over a top surface of the third insulating film and in the second opening so as to be in contact with the second conductor, and removing part of the third conductor to form a fourth conductor.

One embodiment of the present invention is a method for manufacturing a device which includes an element, an electrode, and a region where the electrode and the element are connected, including the steps of forming a first insulating film over a substrate, forming a second insulating film over the first insulating film, removing part of the first insulating film and part of the second insulating film to form a first opening, forming a first conductor in the first opening and over a top surface of the second insulating film, removing part of the first conductor by a chemical mechanical polishing method to make a surface of the first conductor parallel to a bottom surface of the substrate, so that a second conductor is formed in the first opening, forming a third insulating film over the second insulating film and the second conductor, removing part of the second insulating film and part of the third insulating film to form a second opening so as to expose part of a top surface and part of a side surface of the second conductor, forming a third conductor over a top surface of the third insulating film and in the second opening so as to be in contact with the second conductor, and removing part of the third conductor to form a fourth conductor.

One embodiment of the present invention is a method for manufacturing a device which includes an element, an electrode, and a region where the electrode and the element are connected, including the steps of forming a first insulating film over a substrate, forming a second insulating film over the first insulating film, removing part of the first insulating film and part of the second insulating film to form a first opening, forming a first conductor in the first opening and over a top surface of the second insulating film, removing part of the first conductor by a chemical mechanical polishing method to make a surface of the first conductor parallel to a bottom surface of the substrate, so that a second conductor is formed in the first opening, forming a third insulating film over the second insulating film and the second conductor, removing part of the second insulating film and part of the third insulating film to form a second opening so as to expose part of a top surface and part of a side surface of the second conductor, forming a third conductor over a top surface of the third insulating film and in the second opening so as to be in contact with the second conductor, and removing part of the third conductor by a chemical mechanical polishing method to make a surface of the third conductor parallel to a bottom surface of the substrate, so that a fourth conductor is formed in the second opening.

In the above-described structures, the element preferably includes an oxide semiconductor. Furthermore, in the above-described structures, the second insulating film preferably includes aluminum, and the first insulating film preferably includes silicon. In the above-described structures, the second insulating film preferably has a lower hydrogen-transmitting property than the first insulating film.

One embodiment of the present invention is a device which includes a first conductor, a second conductor, a first insulating film, and a second insulating film. In the device, the second insulating film includes a region in contact with a top surface of the first insulating film and a region in contact with a side surface of the second conductor, the side surface of the second conductor includes a region in contact with the first insulating film, and the second conductor is in contact with a side surface of the first conductor, a top surface of the first conductor, and the top surface of the first insulating film.

One embodiment of the present invention is a device which includes a first conductor, a second conductor, a first insulating film, and a second insulating film. In the device, the second insulating film includes a region in contact with a top surface of the first insulating film and a region in contact with a side surface of the second conductor, the second conductor includes a first region having a first thickness and a second region having a second thickness, the first region is in contact with a top surface of the first conductor, the second region is in contact with the top surface of the first insulating film, and the first thickness is smaller than the second thickness.

One embodiment of the present invention is a device which includes a first conductor, a second conductor, a first insulating film, and a second insulating film. In the device, the second insulating film includes a region in contact with a top surface of the first insulating film and a region in contact with a side surface of the second conductor, the first conductor includes a third conductor and a fourth conductor, a side surface of the third conductor includes a region in contact with the first insulating film, the fourth conductor is in contact with a top surface of the third conductor, a side surface of the second conductor is in contact with the second insulating film, and the second conductor is in contact with the side surface of the third conductor, a top surface of the fourth conductor, and a top surface of the first insulating film.

In the above-described structures, the device preferably includes an oxide semiconductor, and the oxide semiconductor is preferably stacked over the second conductor.

Furthermore, in the above-described structures, the second insulating film preferably includes aluminum, and the first insulating film preferably includes silicon. In the above-described structures, the second insulating film preferably has a lower hydrogen-transmitting property than the first insulating film.

One embodiment of the present invention is a device which includes a first conductor, a second conductor, a first insulating film, and a second insulating film. In the device, the second insulating film includes a region in contact with a top surface of the first insulating film, the second conductor includes a region positioned over the first conductor, a region that is the highest of a top surface of the first conductor is higher than a region that is the highest of a top surface of the second insulating film, and a region that is the lowest of a bottom surface of the second conductor is lower than a region that is the highest of the top surface of the second insulating film.

One embodiment of the present invention is an electronic device including the device according to any one of the above-described structures.

With one embodiment of the present invention, a method for forming a wiring having excellent electrical characteristics can be provided. With one embodiment of the present invention, a method for forming a wiring having stable electrical characteristics can be provided. With one embodiment of the present invention, a method for embedding a conductor in an insulator can be provided.

With one embodiment of the present invention, a method for manufacturing a device having excellent electrical characteristics can be provided. Furthermore, a method for forming a minute wiring can be provided. With one embodiment of the present invention, a method for manufacturing a device having stable electrical characteristics can be provided. With one embodiment of the present invention, a method for manufacturing a highly reliable device can be provided. With one embodiment of the present invention, a method for manufacturing a device with a high yield can be provided. Furthermore, a miniaturized semiconductor device can be provided.

Note that the description of these effects does not disturb the existence of other effects. One embodiment of the present invention does not necessarily have all the effects described above. Other effects will be apparent from and can be derived from the description of the specification, the drawings, the claims, and the like.

BRIEF DESCRIPTION OF DRAWINGS

In the accompanying drawings:

FIGS. 34A to 34D are Cs-corrected high-resolution TEM images of a plane of a CAAC-OS;

FIGS. 41A to 41F each illustrate an application example of an RF tag of an embodiment;

BEST MODE FOR CARRYING OUT THE INVENTION

Figure 1A:
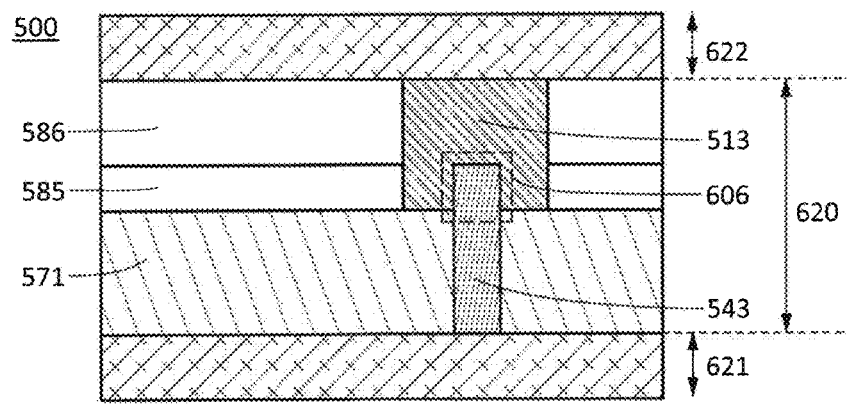
FIGS. 1A to 1C are cross-sectional views illustrating examples of a device of one embodiment of the present invention.

Embodiments of the present invention will be described in detail with reference to the drawings. However, the present invention is not limited to the following description, and it is easily understood by those skilled in the art that modes and details disclosed herein can be modified in various ways. Furthermore, the present invention is not construed as being limited to description of the following embodiments. In describing structures of the invention with reference to the drawings, common reference numerals are used for the same portions in different drawings. Note that the same hatched pattern is applied to similar parts, and the similar parts are not especially denoted by reference numerals in some cases. In the case where the description of a component denoted by a different reference numeral is referred to, the description of the thickness, the composition, the structure, the shape, or the like of the component can be used as appropriate.

Note that the size, the thickness of films (layers), or regions in drawings is sometimes exaggerated for simplicity.

A voltage usually refers to a potential difference between a given potential and a reference potential (e.g., a source potential or a ground potential (GND)). A voltage can be referred to as a potential and vice versa. In general, a potential (a voltage) is a relative value and is determined depending on the difference relative to a reference potential. Therefore, even a "ground potential" is not necessarily 0 V. For example, in some cases, a "ground potential" is the lowest potential in a circuit. In other cases, a "ground potential" is a moderate potential in a circuit. In those cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

Note that a "semiconductor" has characteristics of an "insulator" in some cases when the conductivity is sufficiently low, for example. Further, a "semiconductor" and an "insulator" cannot be strictly distinguished from each other in some cases because a border therebetween is not clear. Accordingly, a "semiconductor" in this specification can be called an "insulator" in some cases. Similarly, an "insulator" in this specification can be called a "semiconductor" in some cases.

Further, a "semiconductor" has characteristics of a "conductor" in some cases when the conductivity is sufficiently high, for example. Further, a "semiconductor" and a "conductor" cannot be strictly distinguished from each other in some cases because a border therebetween is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is a silicon layer, examples of an impurity which changes characteristics of the semiconductor include oxygen, Group 1 elements except hydrogen, Group 2 elements, Group 13 elements, and Group 15 elements.

Note that in this specification, the description "A has a shape such that an end portion extends beyond an end portion of B" may indicate, for example, the case where at least one of end portions of A is positioned on an outer side than at least one of end portions of B in a plan view or a cross-sectional view. Thus, the description "A has a shape such that an end portion extends beyond an end portion of B" can be read as the description "one end portion of A is positioned on an outer side than one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

In this specification, a term "semiconductor" can be referred to as an "oxide semiconductor." As the semiconductor, a Group 14 semiconductor such as silicon or germanium; a compound semiconductor such as silicon carbide, germanium silicide, gallium arsenide, indium phosphide, zinc selenide, cadmium sulfide, or an oxide semiconductor; or an organic semiconductor can be used.

In this specification, the term "oxide" can be referred to as an "oxide semiconductor," an "oxide insulator," or an "oxide conductor."

In this specification, a device may refer to, for example, a semiconductor device, a display device, a light-emitting device, a lighting device, a power storage device, a mirror image device, a memory device, an electro-optical device, and the like.

Embodiment 1

In this embodiment, a method for manufacturing a device including a conductive layer that establishes an electrical connection between elements will be described. Here, the conductive layer refers to a layer including a conductor, for example. Examples of the conductive layer are an electrode and a plug. A device of one embodiment of the present invention includes an element and an electrode, for example, where the electrode has a region connected to the element.

[Example of Device]

FIG. 1A illustrates an example of a cross section of a device 500 of one embodiment of the present invention. The device 500 illustrated in FIG. 1A includes a layer 621, a layer 622, and a layer 620 between the layer 621 and the layer 622. The layer 620 includes an insulating film 571 in contact with a top surface of the layer 621, a conductive layer 543, a conductive layer 513 in contact with a top surface of the insulating film 571 and a top surface of the conductive layer 543, an insulating film 585 in contact with the top surface of the insulating film 571, and an insulating film 586 in contact with a top surface of the insulating film 585. The layer 622 is provided in contact with a top surface of the insulating film 586 and a top surface of the conductive layer 513.

A side surface of the conductive layer 543 includes a region in contact with the insulating film 571 and a region in contact with the conductive layer 513. The top surface of the conductive layer 543 includes a region in contact with the conductive layer 513.

A side surface of the conductive layer 513 includes a region in contact with the insulating film 585 and a region in contact with the insulating film 586.

Here, the conductive layer 543 includes a projection portion 606 which is a region projecting from the top surface of the insulating film 571. The conductive layer 513 includes a region in contact with a top surface and a side surface of the projection portion 606. A bottom surface of the conductive layer 513 preferably has a depression portion.

When the conductive layer 543 includes the projection portion 606, the contact area between the conductive layer 543 and the conductive layer 513 can be increased, for example. This enables a reduction of contact resistance between the conductive layer 543 and the conductive layer 513 in some cases. When the bottom surface of the conductive layer 513 has a depression portion, the contact area between the conductive layer 513 and the conductive layer 543 can be increased to lower the contact resistance in some cases.

The layer 621 and the layer 622 preferably include a conductor and an insulator. Furthermore, the layer 621 and the layer 622 preferably include an element and further preferably include a semiconductor element. Here, the semiconductor element refers to, for example, an element including a semiconductor and a conductor. The conductive layer 543 is preferably electrically connected to the conductor or the semiconductor included in the layer 621. The conductive layer 513 is preferably electrically connected to the conductor or the semiconductor included in the layer 622.

Figure 1B:
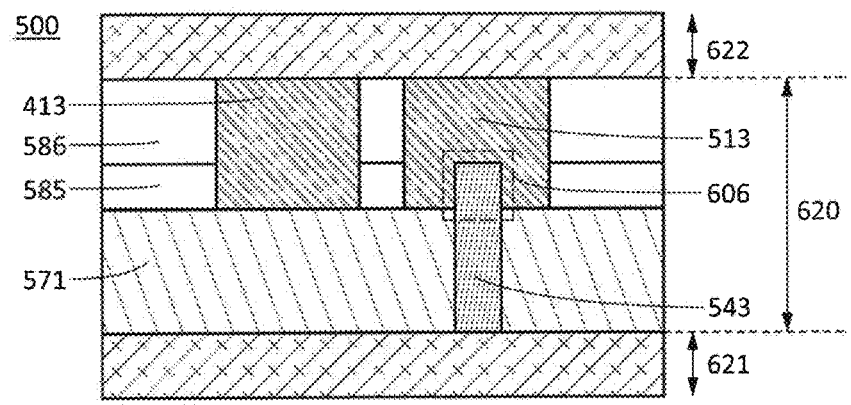

As illustrated in FIG. 1B, the layer 620 may include a plurality of conductors that are in contact with the top surface of the insulating film 571. The device 500 illustrated in FIG. 1B is different from the device 500 illustrated in FIG. 1A in including a conductive layer 413 that is in contact with the top surface of the insulating film 571. Here, because the conductive layer 413 is formed over a region not including a projection portion such as the projection portion 606, a bottom surface of the conductive layer 413 has a higher flatness than the bottom surface of the conductive layer 513 in the cross section illustrated in FIG. 1B. The conductive layer 513 and the conductive layer 413 preferably include a first region located over a region including a projection portion such as the projection portion 606 and a second region located over a region not including such a projection portion.

Figure 1C:
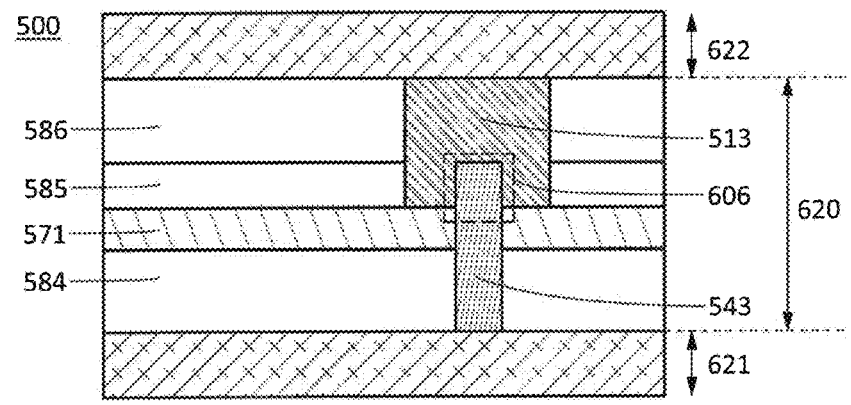

The layer 620 may include an insulating film 584 between the insulating film 571 and the layer 621, as illustrated in FIG. 1C. In FIG. 1C, the side surface of the conductive layer 543 is in contact with the insulating film 571 and the insulating film 584.

Figure 2A:
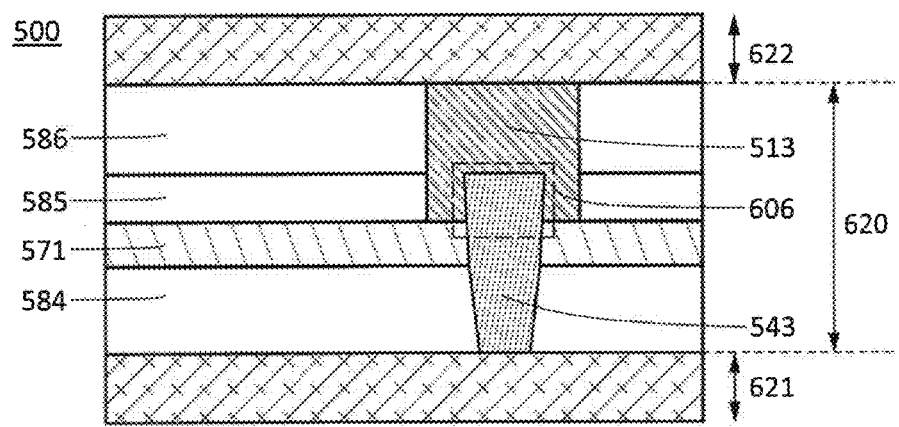
FIGS. 2A and 2B are cross-sectional views illustrating examples of a device of one embodiment of the present invention.

FIG. 2A illustrates an example in which the shape of the conductive layer 543 included in the layer 620 is different from that in FIG. 1C. In the cross section illustrated in FIG. 2A, the width of the conductive layer 543 gets narrower from its top surface toward its bottom surface.

Figure 2B:
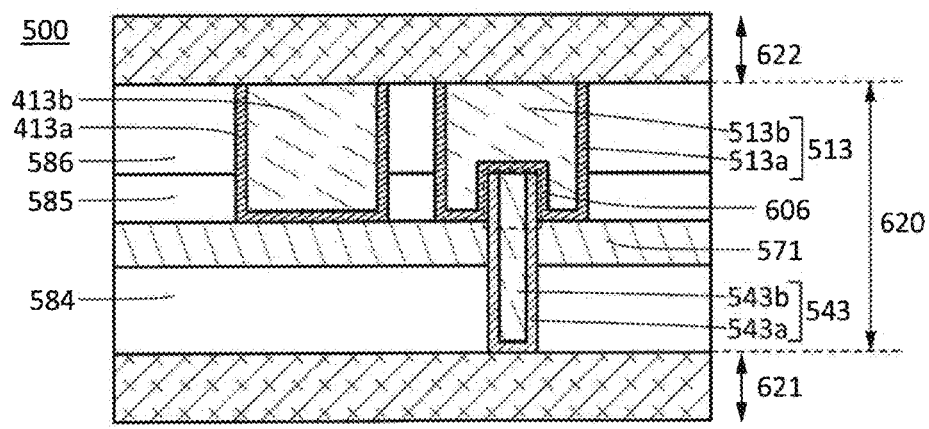

As illustrated in FIG. 2B, the conductive layer 543 and the conductive layer 513 included in the layer 620 may be formed of two or more conductive layers. In FIG. 2B, the conductive layer 543 includes a conductive layer 543a that is in contact with the insulating film 584, the insulating film 571, and the conductive layer 513 and a conductive layer 543b that is formed so as to be embedded in contact with an inner surface of the conductive layer 543a. The conductive layer 513 includes a conductive layer 513a that is in contact with the insulating film 585 and the insulating film 586 and a conductive layer 513b that is formed so as to be embedded in contact with an inner surface of the conductive layer 513a.

Figure 3A:
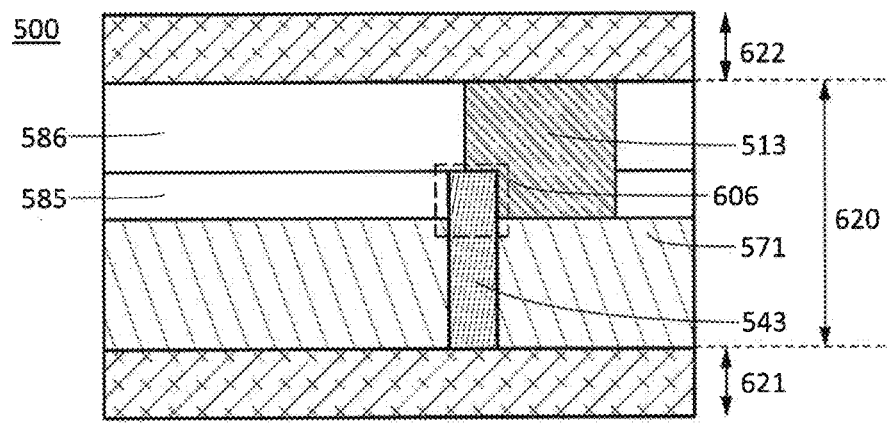
FIGS. 3A and 3B are cross-sectional views illustrating examples of a device of one embodiment of the present invention.

The device 500 illustrated in FIG. 3A is different from the device 500 illustrated in FIG. 1A in that the top surface of the projection portion 606 included in the layer 620 is partly covered and partly not covered with the conductive layer 513 and in that the side surface of the projection portion 606 is partly covered and partly not covered with the conductive layer 513.

Figure 3B:
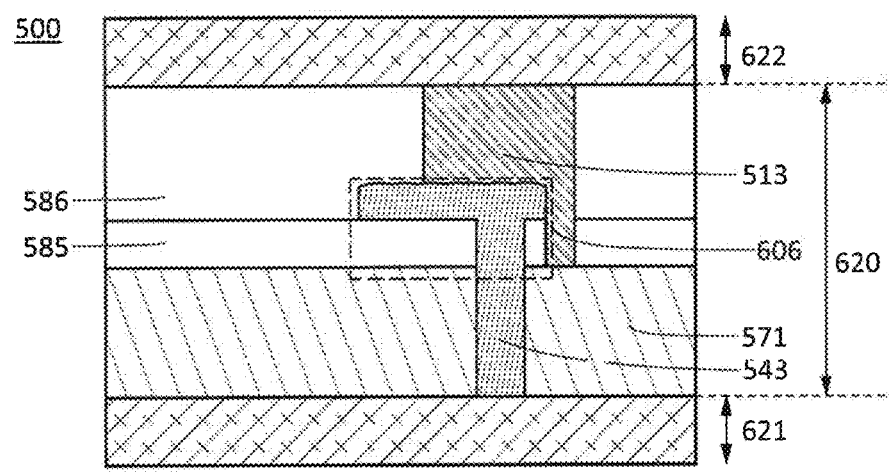

FIG. 3B illustrates an example in which the shape of the projection portion 606 included in the layer 620 is different from that in FIG. 1A. The device 500 illustrated in FIG. 3B is different from the device 500 illustrated in FIG. 1A in that the projection portion 606 includes a region in contact with the top surface of the insulating film 585 and includes a side surface in contact with the insulating film 586.

In FIGS. 1A to 1C, FIGS. 2A and 2B, and FIGS. 3A and 3B, the conductive layer 543 is electrically connected to a conductive layer included in the layer 621 and the conductive layer 513, for example. The conductive layer 513 preferably functions as a wiring layer that is lead inside the device, for example. The layer 622 preferably includes a plurality of conductive layers electrically connected to the conductive layer 513. An example of the case will be described with reference to FIG. 4.

Figure 4:
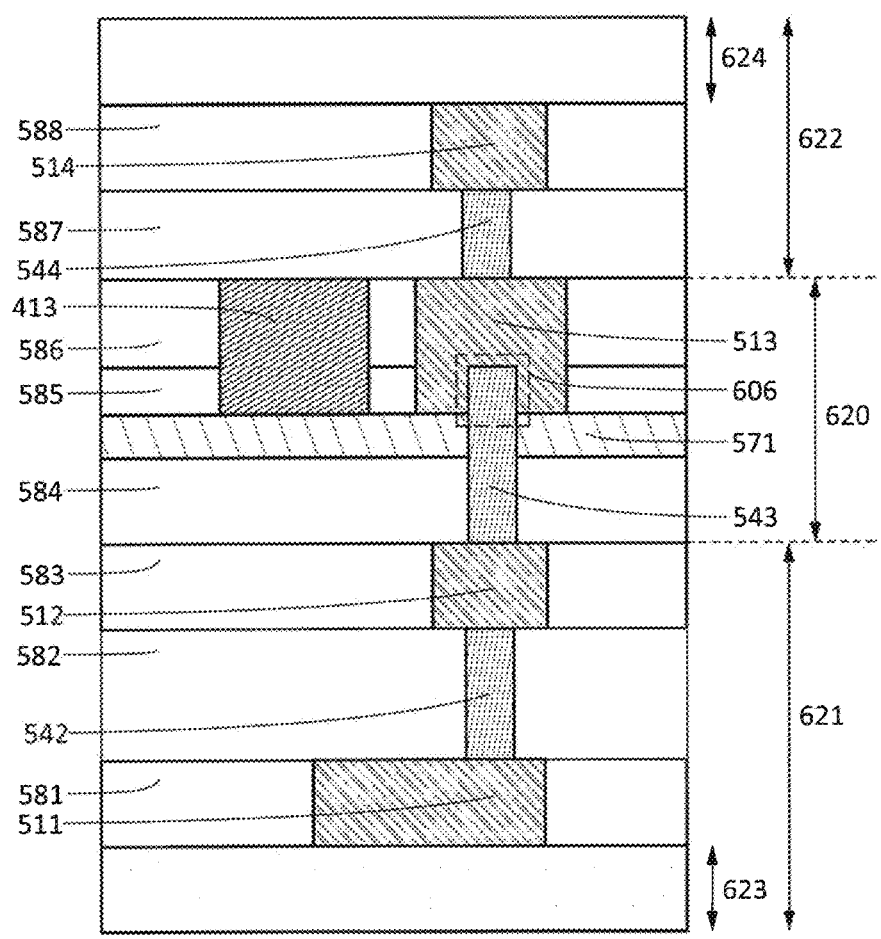
FIG. 4 is a cross-sectional view illustrating an example of a device of one embodiment of the present invention.

FIG. 4 includes the layer 621, the layer 622, and the layer 620 that connects the layer 621 to the layer 622. The layer 621 includes a layer 623 including a semiconductor element, an insulating film 581 in contact with a top surface of the layer 623, a conductive layer 511 in contact with the top surface of the layer 623, an insulating film 582 in contact with a top surface of the insulating film 581, a conductive layer 542 in contact with a top surface of the conductive layer 511, an insulating film 583 in contact with a top surface of the insulating film 582, and a conductive layer 512 in contact with a top surface of the conductive layer 542. The conductive layer 543 is in contact with a top surface of the conductive layer 512. The conductive layer 511 is preferably electrically connected to the semiconductor element included in the layer 623.

The insulating film 582 is preferably in contact with the top surface of the conductive layer 511. Furthermore, the conductive layer 512 is preferably in contact with the top surface of the insulating film 582.

A side surface of the conductive layer 511 is in contact with the insulating film 581, a side surface of the conductive layer 542 is in contact with the insulating film 582, and a side surface of the conductive layer 512 is in contact with the insulating film 583.

The layer 622 includes an insulating film 587 in contact with the top surface of the insulating film 586, a conductive layer 544 in contact with the top surface of the conductive layer 513, an insulating film 588 in contact with a top surface of the insulating film 587, a conductive layer 514 in contact with a top surface of the conductive layer 544, and a layer 624 in contact with a top surface of the insulating film 588 and a top surface of the conductive layer 514. The layer 624 includes a semiconductor element. Furthermore, the conductive layer 514 is preferably electrically connected to the semiconductor element included in the layer 624.

The insulating film 587 is preferably in contact with the top surface of the conductive layer 513. The insulating film 587 is preferably in contact with a top surface of the conductive layer 413. The conductive layer 514 is preferably in contact with the top surface of the insulating film 587.

The conductive layer 543 electrically connects the conductive layer 512 included in the layer 621 to the conductive layer 513. The layer 622 includes the conductive layer 544 which electrically connects the conductive layer 513 to the conductive layer 514 included in the layer 622. The conductive layers such as the conductive layers 542 to 544 are referred to as plugs in some cases. In some cases, it is preferable that the conductive layers 511 to 514 function as wiring layers that are lead inside the device, for example. Such wiring layers preferably have small variation in resistance within the device.

<Insulating Film 571>

Here, the insulating film 571 preferably has a function of blocking hydrogen and water. For example, the insulating film 571 preferably has lower hydrogen- and water-transmitting properties than at least any one of the insulating films 584 to 586. The insulating film 571 preferably has a function of blocking oxygen. For example, the insulating film 571 preferably has a lower oxygen-transmitting property than at least any one of the insulating films 584 to 586. Here, "low hydrogen- and water-transmitting properties" refers to the hydrogen- and water-transmitting properties which are lower than those of silicon oxide or the like that is generally used as an insulator. Furthermore, "a low oxygen-transmitting property" refers to the oxygen-transmitting property which is lower than that of silicon oxide or the like that is generally used as an insulator.

Owing to the hydrogen blocking function of the insulating film 571, hydrogen contained in an insulator or the like in the layer 621 can be prevented from being diffused into the layer 622. For example, in the case where the layer 622 includes a semiconductor element including an oxide semiconductor, the prevention of the hydrogen diffusion into the oxide semiconductor might suppress a degradation in semiconductor element characteristics.

Owing to the oxygen blocking function of the insulating film 571, the outward diffusion of oxygen from the layer 622 might be suppressed, leading to easy supply of oxygen to the layer 622. For example, in the case where the layer 622 includes a semiconductor element including an oxide semiconductor, easy supply of oxygen to the oxide semiconductor might improve semiconductor element characteristics.

The insulating film 571 can be formed using a single-layer structure or a stacked-layer structure using, for example, aluminum oxide, hafnium oxide, tantalum oxide, zirconium oxide, lead zirconate titanate (PZT), strontium titanate (SrTiO$_3$), (Ba,Sr)TiO$_3$ (BST), silicon nitride, or the like. Alternatively, aluminum oxide, bismuth oxide, germanium oxide, niobium oxide, silicon oxide, titanium oxide, tungsten oxide, yttrium oxide, zirconium oxide, or gallium oxide may be added to the insulating film, for example. Alternatively, the insulating film may be subjected to nitriding treatment to be an oxynitride film. A layer of silicon oxide, silicon oxynitride, or silicon nitride may be stacked over the insulating film. Aluminum oxide is particularly preferable because of its excellent barrier property against water or hydrogen.

The insulating film 571 may be a stack including a layer of a material that does not easily transmit water and hydrogen and a layer containing an insulating material. The insulating film 571 may be, for example, a stack including a layer containing silicon oxide or silicon oxynitride, a layer containing a metal oxide, or the like.

<Insulating Film 581 and the Like>

The insulating films 581 to 588 illustrated in FIG. 1A to FIG. 4 is formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like.

The insulating films 581 to 588 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

The insulating films 581 to 588 can be formed using a silicon carbonitride film (SiCN film). Alternatively, undoped silicate glass (USG), boron phosphorus silicate glass (BPSG), borosilicate glass (BSG), or the like can be used. USG, BPSG, and the like may be formed by an atmospheric pressure CVD method. Alternatively, hydrogen silsesquioxane (HSQ) or the like may be applied by a coating method.

Figure 10:
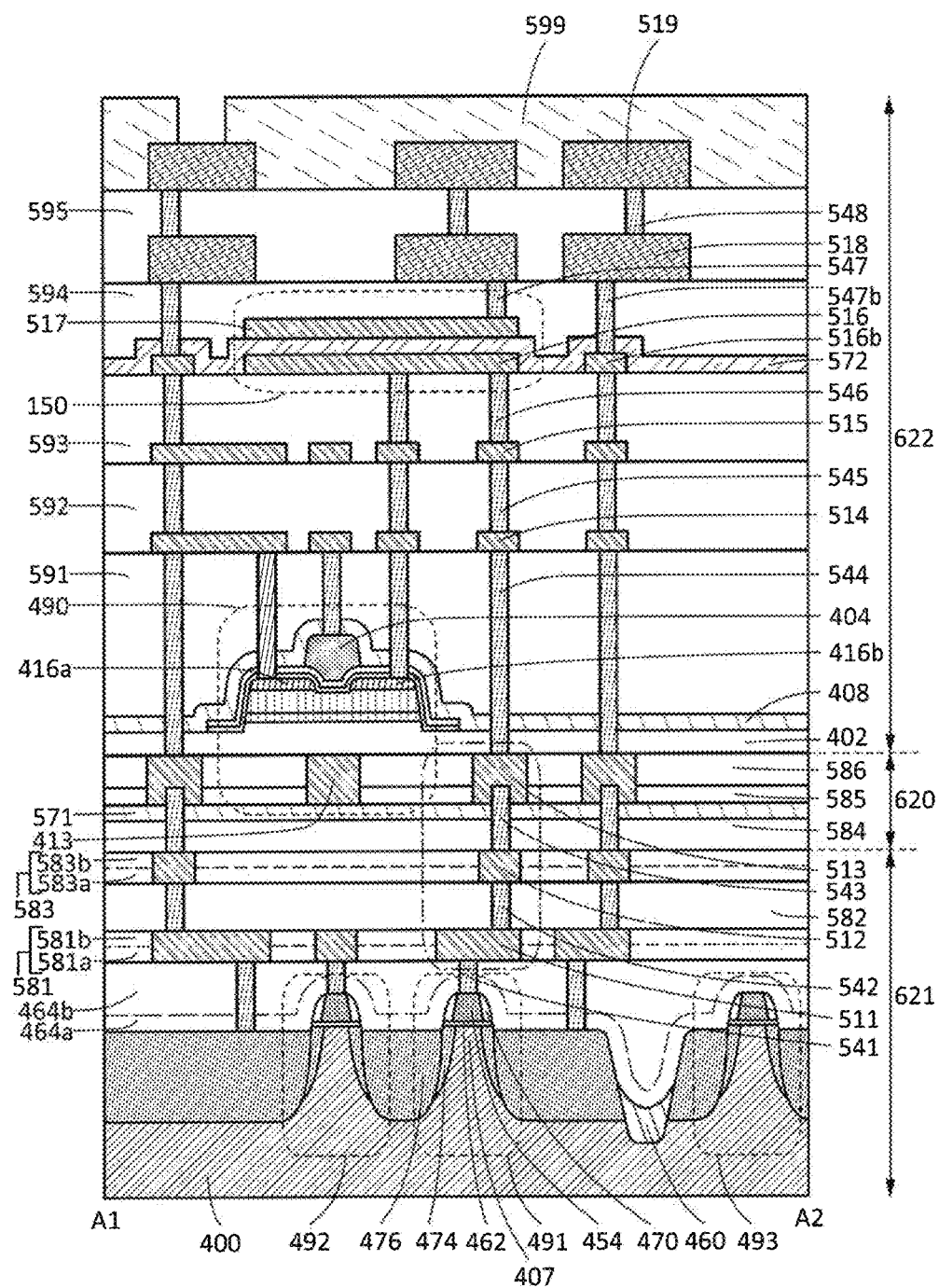
FIG. 10 is a cross-sectional view illustrating an example of a device of one embodiment of the present invention.

Note that as shown in FIG. 10 and the like, the insulating film 581, the insulating film 583, and the like may have two or more stacked layers. FIG. 10 illustrates an example in which the insulating film 581 includes two layers of an insulating film 581a and an insulating film 581b, and the insulating film 583 includes two layers of an insulating film 583a and an insulating film 583b. For example, the insulating film 581a and the insulating film 583a may be formed using an insulating film containing nitrogen and silicon, the insulating film 581b and the insulating film 583b may be formed using USG, and those insulating films may be stacked.

<Conductive Layer 511, Conductive Layer 542, and the Like>

As the conductive layers 511 to 514 and the conductive layers 542 to 544 illustrated in FIG. 1A to FIG. 4, a conductive material such as a metal material, an alloy material, or a metal oxide material can be used. For example, the conductive layers are formed to have a single-layer structure or a stacked-layer structure using any of metals such as aluminum, titanium, chromium, nickel, copper, yttrium, zirconium, niobium, molybdenum, silver, tantalum, and tungsten, or an alloy containing any of these metals as a main component. Alternatively, the conductive layers can be formed using a metal nitride such as tungsten nitride, molybdenum nitride, or titanium nitride.

As an example, a stack of a material such as titanium nitride or titanium and another material may be used. For example, stacking of another metal after titanium nitride or titanium is deposited in an opening might improve adhesion to the opening.

Alternatively, for example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

[Method for Manufacturing Device]

Next, an example of a method for manufacturing the device 500 illustrated in FIG. 2B will be described with reference to FIG. 5A to FIG. 8C.

Figure 5A:
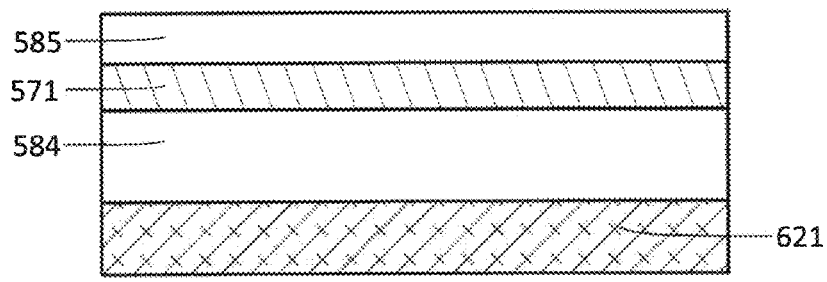
FIGS. 5A to 5D are cross-sectional views illustrating an example of a method for manufacturing a device of one embodiment of the present invention.
Figure 5B:
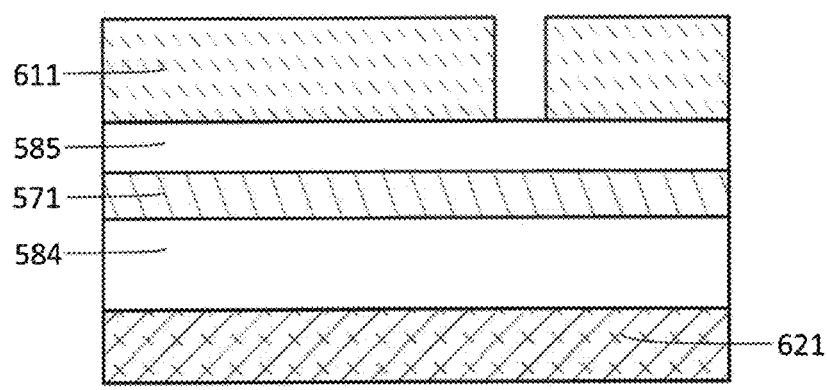
Figure 5C:
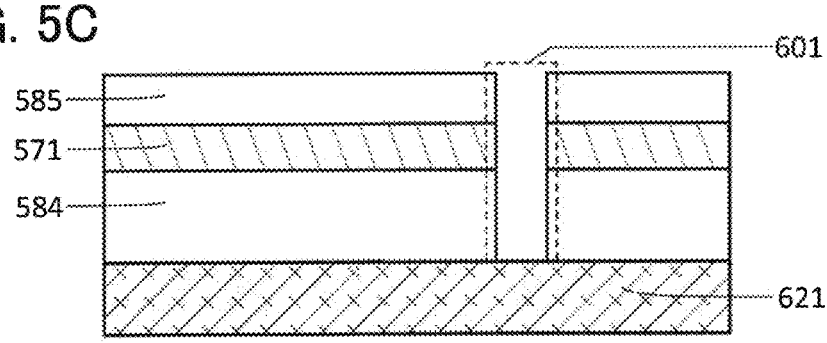
Figure 5D:
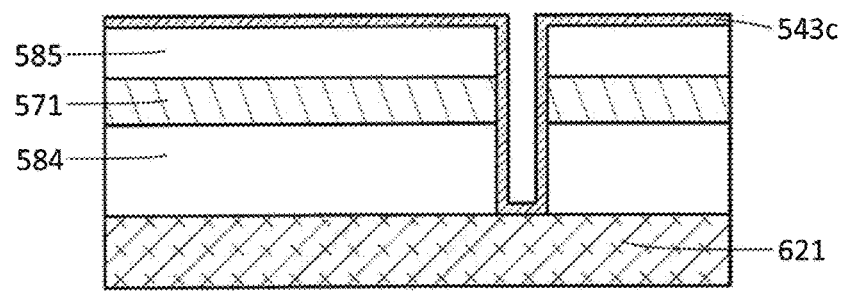

First, the insulating film 584, the insulating film 571, and the insulating film 585 are sequentially formed over the layer 621 (see FIG. 5A). The insulating film 584, the insulating film 571, and the insulating film 585 can be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like, for example. In particular, it is preferable that the insulating films be formed by a CVD method, further preferably a plasma CVD method because coverage can be further improved. It is preferable to use a thermal CVD method, an MOCVD method, or an ALD method in order to reduce plasma damage.

Then, a mask 611 is formed over the insulating film 585. The mask may be formed by, for example, a lithography method with the use of a resist. Alternatively, a hard mask formed of an inorganic film or a metal film may be used (see FIG. 5B).

Then, the insulating film 585, the insulating film 571, and the insulating film 584 are etched with the mask 611 to form an opening 601. Then, the mask is removed (see FIG. 5C). The etching of the insulators may be conducted by a dry etching method, for example. In the case where aluminum oxide is used as the insulating film 571, dry etching with the use of gas such as boron trichloride may be conducted, for example.

Next, a conductive film to be the conductive layer 543 is formed over the insulating film 585 and in the opening 601. Here, an example of using a stacked film of the conductive layer 543a and the conductive layer 543b as the conductive layer 543 is described. A conductive film 543c to be the conductive layer 543a is formed (see FIG. 5D). Then, a conductive film 543d to be the conductive layer 543b is formed (see FIG. 6A). Note that the conductive layer 543 may be a single-layer film or a stacked-layer film of three or more layers.

Then, surfaces of the conductive film 543d and the conductive film 543c are planarized (the conductive film 543d and the conductive film 543c are partly removed), so that the insulating film 585 is exposed. Thus, the conductive layer 543a and the conductive layer 543b are formed (see FIG. 6B). For the removal of the conductive film 543d and the conductive film 543c, a polishing method such as a chemical mechanical polishing (CMP) method is preferably used, for example. Alternatively, dry etching may be used. For example, a method such as etch-back may be used. When a polishing method such as a CMP method is used, the polishing rate of the conductive film 543d and the conductive film 543c might have variations on the plane of the device. In this case, in a region where the polishing rate is high, a period during which the insulating film 585 is exposed might be long. The polishing rate of the conductive film 543d and the conductive film 543c is preferably lower than that of the insulating film 585. The low polishing rate of the insulating film 585 allows it to serve as a polishing stopper film in the polishing step of the conductive films 543d and 543c, and further can increase the planarity of a surface of the insulating film 585.

Here, the CMP method is a method in which a surface of a processing object is planarized by a combination of chemical and mechanical actions. In general, a polishing cloth is attached to a polishing stage, the polishing stage and the processing object are each rotated or swung while slurry (abrasives) is supplied between the processing object and the polishing cloth, and the surface of the processing object is polished by chemical reaction between the slurry and the surface of the processing object and by action of mechanical polishing of the processing object with the polishing cloth.

As the polishing cloth for the CMP method, for example, polyurethane foam, nonwoven fabric, suede, or the like can be used. As abrasive particles, for example, silica (silicon oxide), cerium oxide, manganese oxide, aluminum oxide, or the like can be used. As silica, for example, fumed silica or colloidal silica can be used.

The pH of the slurry used for the CMP method may be adjusted in view of removability of the processing object or stability of the slurry solution. For example, in the case where acidic slurry is used, the insulating film 585 serving as the stopper film preferably has high resistance to acid. Alternatively, in the case where alkaline slurry is used, the insulating film 585 preferably has high resistance to alkali.

As an oxidizer in the slurry, for example, hydrogen peroxide or the like may be used.

Here, an example of the case where the conductive layer 543 contains tungsten and the insulating film 585 contains silicon oxide is described. In the slurry, fumed silica or colloidal silica, for example, is preferably used as the abrasive particles. For example, acidic slurry is preferably used, and, for example, aqueous hydrogen peroxide is preferably used as an oxidizer.

Here, for example, a titanium nitride film and a tungsten film may be used as the conductive layer 543a and the conductive layer 543b, respectively. Furthermore, titanium or the like may be deposited between the conductive layer 543a and the conductive layer 543b.

Alternatively, copper may be included in the conductive layer 543.

The insulating film 585 preferably includes silicon, and further preferably includes silicon and oxygen. For example, silicon oxide, silicon oxynitride, or the like is preferably included.

Figure 6A:
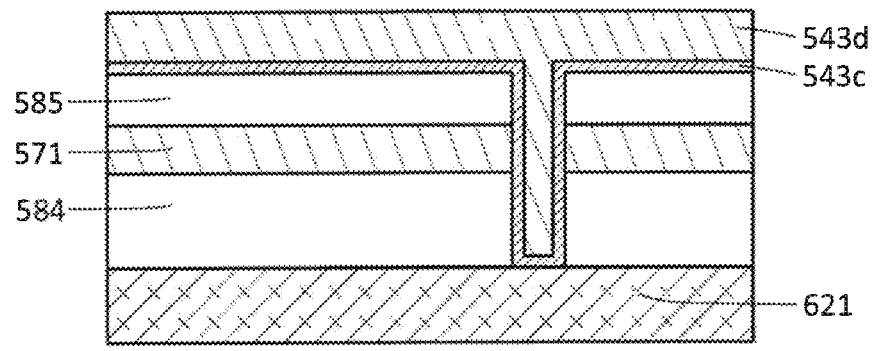
FIGS. 6A to 6C are cross-sectional views illustrating an example of a method for manufacturing a device of one embodiment of the present invention.
Figure 6B:
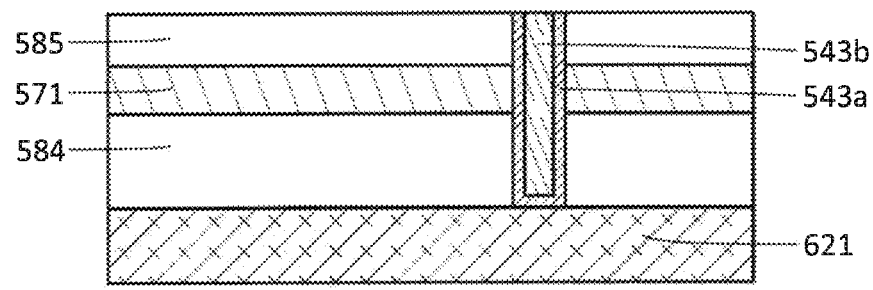
Figure 6C:
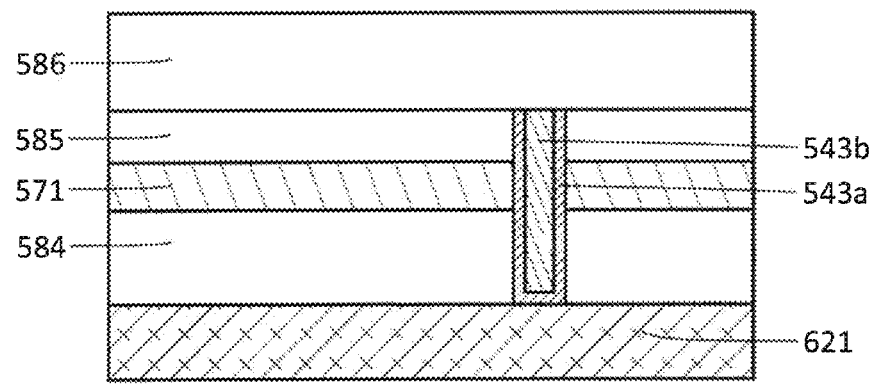

Next, the insulating film 586 is formed (see FIG. 6C). For the formation method of the insulating film 586, the formation method of the insulating film 584 or the like may be referred to.

Figure 7A:
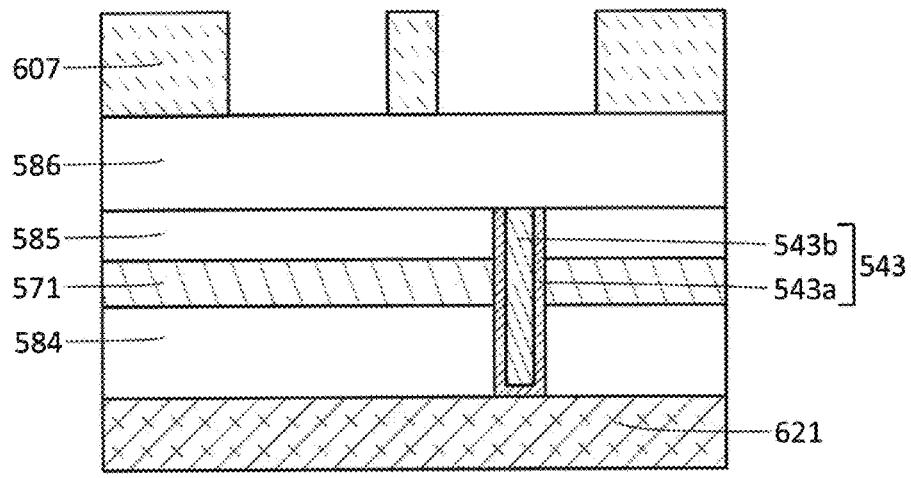
FIGS. 7A to 7C are cross-sectional views illustrating an example of a method for manufacturing a device of one embodiment of the present invention.

Then, a mask 607 is formed over the insulating film 586 (see FIG. 7A). For the mask 607, the description of the mask 611 may be referred to.

Then, the insulating film 586 and the insulating film 585 are etched with the use of the mask 607 to provide an opening 602 and an opening 603. Then, the mask is removed (see FIG. 7B). The etching of the insulators may be conducted by, for example, dry etching. Here, the etching rate of the insulating film 571 is preferably lower than that of the insulating film 585 with a large difference between the etching rates. In other words, it is preferable that the insulating film 571 be etched as little as possible when the opening 602 and the opening 603 are formed.

Figure 7B:
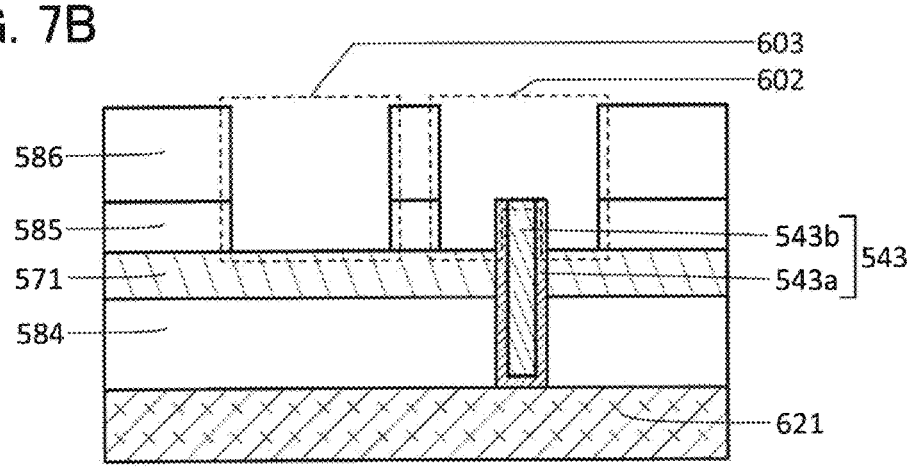
Figure 7C:
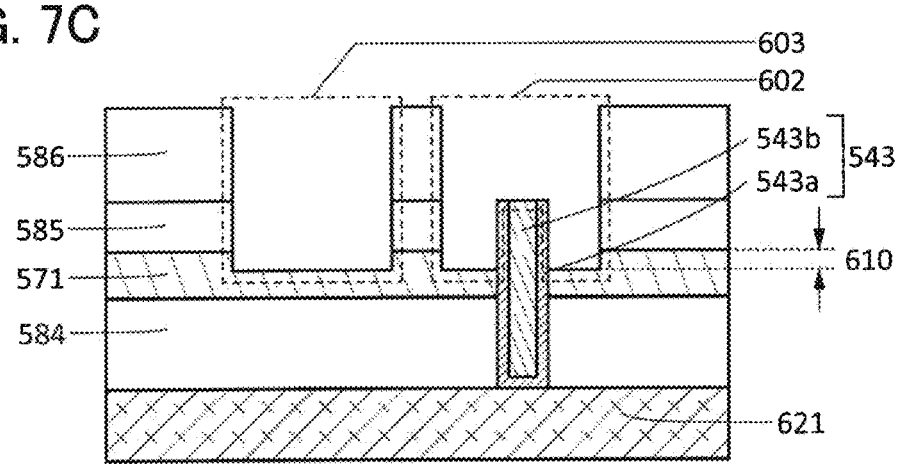

In the case where there is only a small difference between the etching rate of the insulating film 571 and the etching rate of the insulating film 585, as illustrated in FIG. 7C for example, the insulating film 571 is removed by a thickness 610. In some cases, for example, the thickness 610 has variations within the device. As described later, a conductive layer is formed in the opening 602 and the opening 603. The conductive layer is used as a wiring layer that is lead inside the device, for example. The variation in resistance of such a wiring layer is preferably small.

In the case where the thickness 610 has variations within the device, the thickness variation may lead to a variation in resistance of the wiring layer. Thus, the thickness 610 is preferably as small as possible. Furthermore, the variation in the thickness 610 is preferably as small as possible.

When the etching rate of the insulating film 571 is lower than that of the insulating film 585 with a large difference between those etching rates, the thickness 610 can become small or the variation in the thickness 610 can become small.

The variation in the thickness 610 may lead to a variation in the height of the projection portion of the conductive layer 543. Reducing the variation in the thickness 610 may reduce the variation in the height of the projection portion.

Here, it is preferable to use a film including aluminum oxide and a film including oxygen and silicon as the insulating film 571 and the insulating film 585, respectively, for example, in which case the etching rate of the insulating film 571 can sometimes become sufficiently lower than that of the insulating film 585.

Here, the opening 602 is provided over the conductive layer 543. In some cases, the etching rate of the conductive layer 543 is lower than that of the insulating film 585. In that case, the insulating film 585 is etched first, so that a projection portion of the conductive layer 543 is formed in a lower part of the opening 602. The opening 603 is formed over a region not including a conductive layer that is connected to the layer 621, such as the conductive layer 543; accordingly, a projection portion of a conductive layer is not formed in a lower part of the opening 603, that is, the bottom surface of the opening 603 is more flat than that of the opening 602. Because a conductive layer provided in such an opening with high flatness is not influenced by the projection portion in terms of the cross-sectional area, the variation in the resistance of the conductive layer can be reduced in some cases.

Next, a film that is to be a conductive layer such as the conductive layer 513 is formed in the opening 602 and the opening 603. Here, an example in which a stacked-layer film of the conductive layer 513a and the conductive layer 513b is used as the conductive layer 513 is described. First, a conductive film 513c to be the conductive layer 513a is formed. Then, a conductive film 513d to be the conductive layer 513b is formed (see FIG. 8A). Note that the conductive layer 513 may be a single-layer film or a stacked-layer film of three or more layers.

Then, surfaces of the conductive film 513d and the conductive film 513c are planarized (the conductive film 513d and the conductive film 513c are partly removed), so that the insulating film 586 is exposed. Thus, the conductive layer such as the conductive layer 513 is formed (see FIG. 8B). For the removal of the conductive film 513d and the conductive film 513c, a polishing method such as a CMP method is preferably used, for example.

Figure 8A:
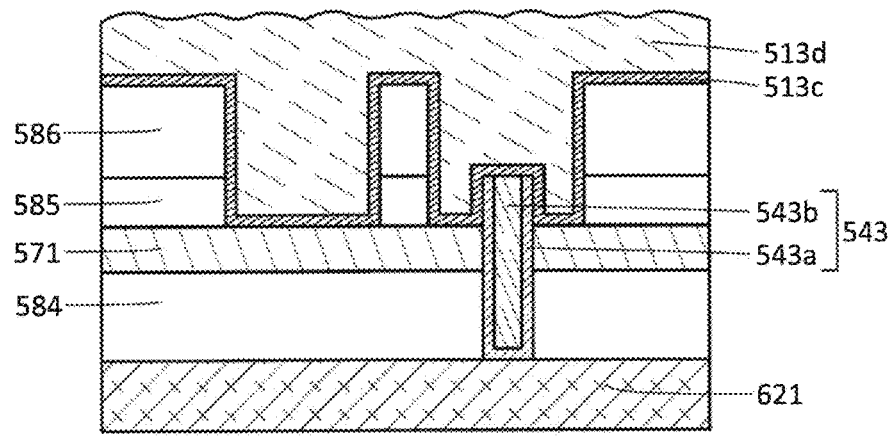
FIGS. 8A to 8C are cross-sectional views illustrating an example of a method for manufacturing a device of one embodiment of the present invention.
Figure 8B:
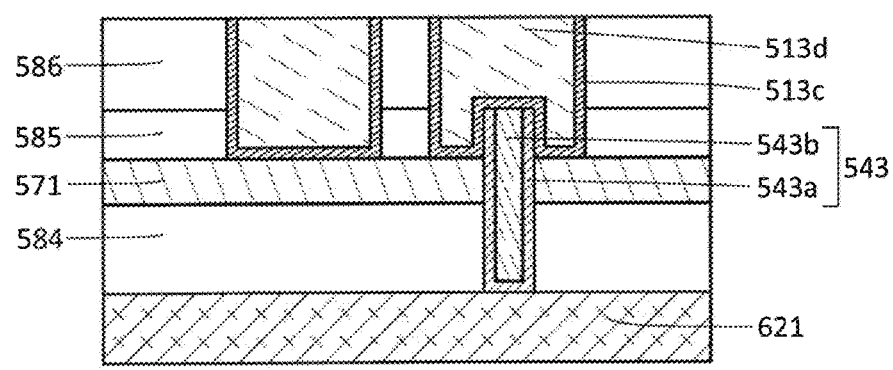
Figure 8C:
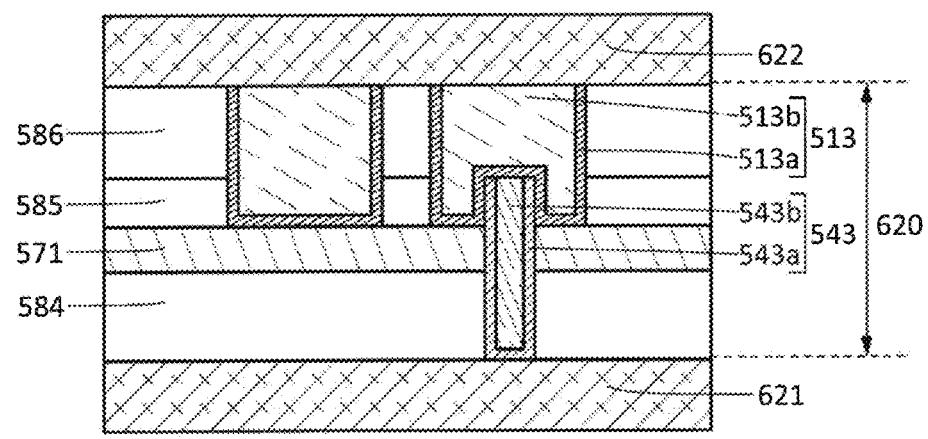

Next, the layer 622 is formed over the insulating film 586 and the conductive layer such as the conductive layer 513 (see FIG. 8C). Through the above-described process, the device 500 illustrated in FIG. 2B can be manufactured.

Here, in the case where the opening 602 is formed by etching the insulating film 586 and the insulating film 585 as illustrated in FIG. 7B, part of the insulating film 585 might remain on the sidewall of the conductive layer 543. This remaining insulating film is referred to as an insulating film 598.

Figure 50A:
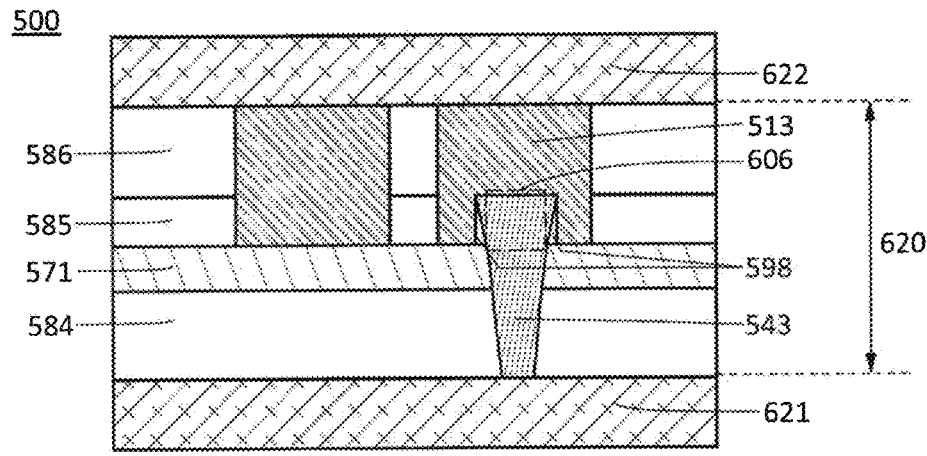
FIGS. 50A to 50C are cross-sectional views illustrating examples of a device of one embodiment of the present invention.
Figure 50B:
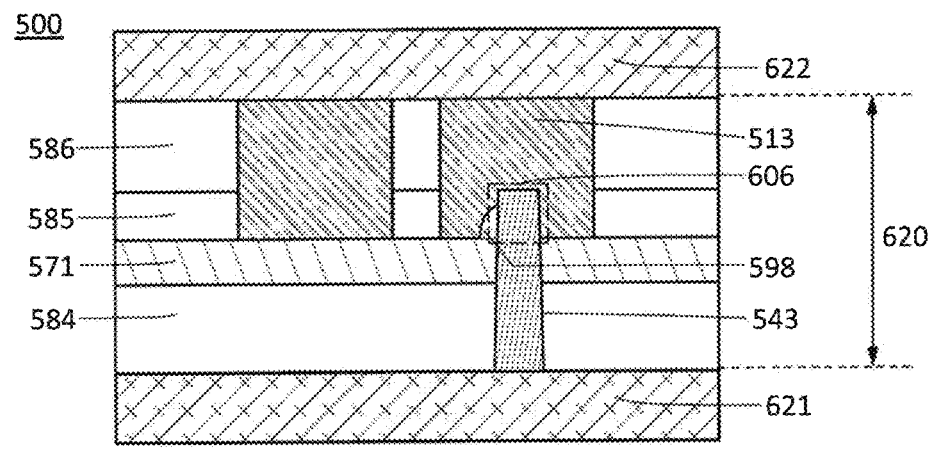
Figure 50C:
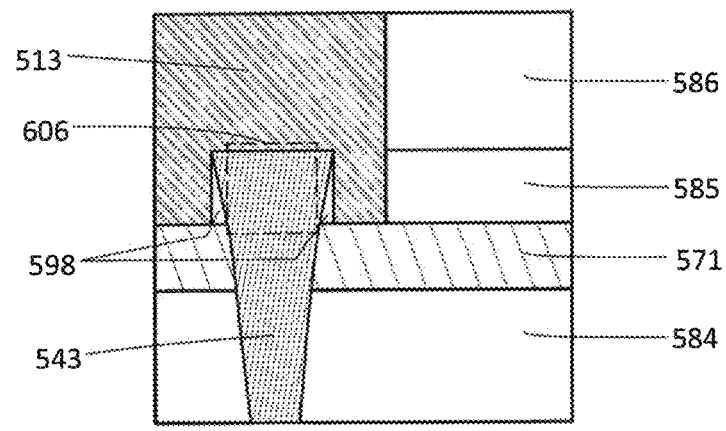

An example of that case is illustrated in FIG. 50A. The device 500 illustrated in FIG. 50A includes the insulating film 598 that is in contact with a sidewall of the projection portion 606 included in the conductive layer 543 and the top surface of the insulating film 571. The insulating film 598 includes a region sandwiched between the conductive layer 513 and the conductive layer 543. FIG. 50C is an enlarged view of a portion illustrated in FIG. 50A. Here, the insulating film 598 may be in contact with only part of the side surface of the conductive layer 543. For example, as illustrated in FIG. 50B, in the device 500, the insulating film 598 may be in contact with part of the sidewall of the projection portion 606 included in the conductive layer 543. In FIG. 50B, part of the side surface of the projection portion 606 is in contact with the insulating film 598. The side surface of the projection portion 606 includes a region not covered with the insulating film 598 in the vicinity of an upper part of the projection portion 606. Here, the insulating film 598 included in the device 500 may improve coverage with the conductive layer 513, in some cases, suppressing the defects in the shape of the conductive layer 513, for example.

<Variation of Device>

Next, an example in which the layer 620 includes a capacitor 150 in the device 500 will be described. The device 500 illustrated in FIG. 20C is different from the device 500 illustrated in FIG. 4 in including a conductive layer 521 formed over the layer 621, a conductive layer 523 formed in the same layer as the conductive layer 513, and a conductive layer 522 that connects a conductive layer included in the layer 621 to the conductive layer 523. Although the conductive layer 413 that is included in the device in FIG. 4 is not illustrated in FIG. 20C, the conductive layer 413 may be included in the device in FIG. 20C.

Here, the capacitor is formed of a pair of electrodes which are the conductive layers 521 and 523 and the insulating film 571 which is a dielectric. Like the conductive layer 543, the conductive layer 522 includes a projection portion above the insulating film 571. Like the conductive layer 513, the conductive layer 523 is formed so as to cover the projection portion of the conductive layer 522.

Although FIG. 20C shows an example in which the conductive layer 522 is formed of two layers of conductive layers 522a and 522b and the conductive layer 523 is formed of two layers of conductive layers 523a and 523b, the conductive layer 522 and the conductive layer 523 may each be a single layer or a stacked-layer film of three or more layers.

A method for manufacturing the device 500 illustrated in FIG. 20C will be described with reference to FIGS. 17A to 17E, FIGS. 18A to 18C, FIGS. 19A to 19C, and FIGS. 20A to 20C.

First, the insulating film 584 is formed over the layer 621. Next, a mask 608 is provided over the insulating film 584 (see FIG. 17A). Then, the insulating film 584 is etched with the use of the mask 608 to form an opening (see FIG. 17B). Then, a conductive film 526 to be the conductive layer 521 is formed in the opening and over the insulating film 584 (see FIG. 17C). Next, a surface of the conductive film 526 is planarized (the conductive film 526 is partly removed), so that the conductive layer 521 is formed (see FIG. 17D). Next, the insulating film 571 and the insulating film 585 are formed (see FIG. 17E).

Figure 18A:
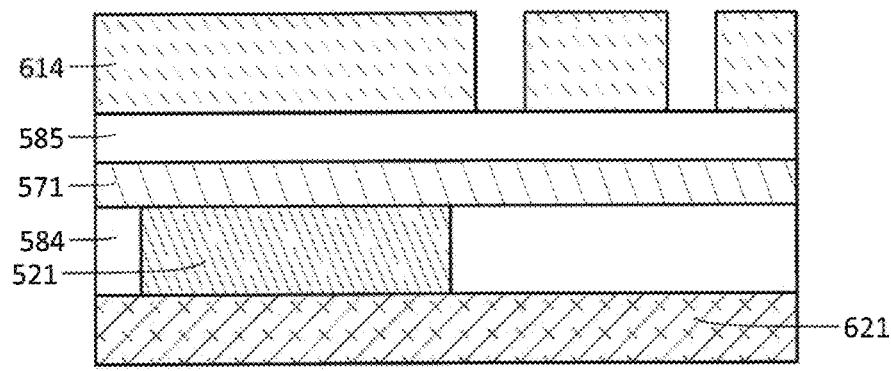
FIGS. 18A to 18C are cross-sectional views illustrating an example of a method for manufacturing a device of one embodiment of the present invention.
Figure 18B:
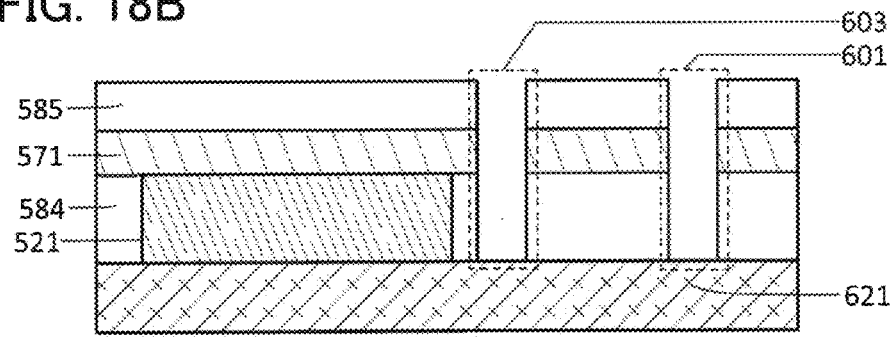
Figure 18C:
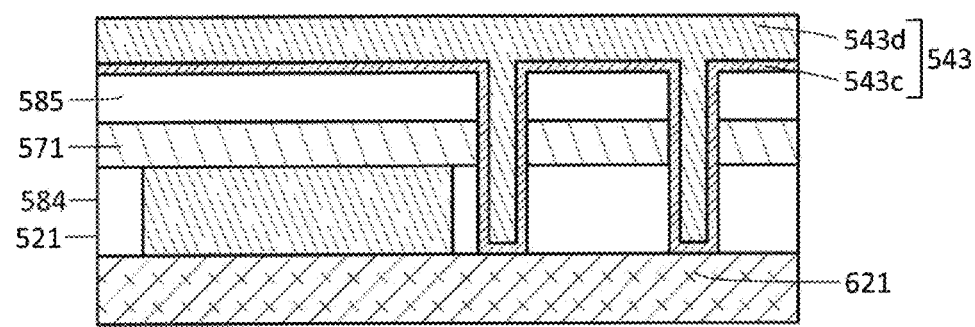

Next, a mask 614 is provided over the insulating film 585 (see FIG. 18A). Then, the insulating film 585, the insulating film 571, and the insulating film 584 are etched with the use of the mask 614, so that the opening 601 and the opening 603 are formed over the layer 621 (see FIG. 18B). Then, the conductive film 543c to be the conductive layer 543a, the conductive layer 522a, and the like is formed in the openings 601 and 603 and over the insulating film 585, and subsequently to the formation of the conductive film 543c, the conductive film 543d to be the conductive layer 543b, the conductive layer 522b, and the like is formed (see FIG. 18C).

Figure 19A:
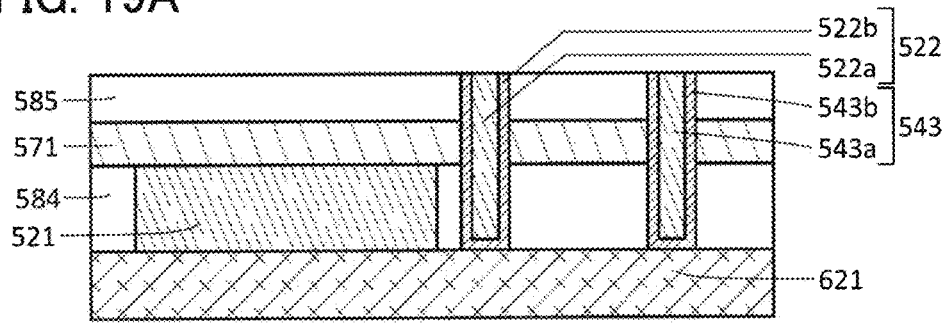
FIGS. 19A to 19C are cross-sectional views illustrating an example of a method for manufacturing a device of one embodiment of the present invention.
Figure 19B:
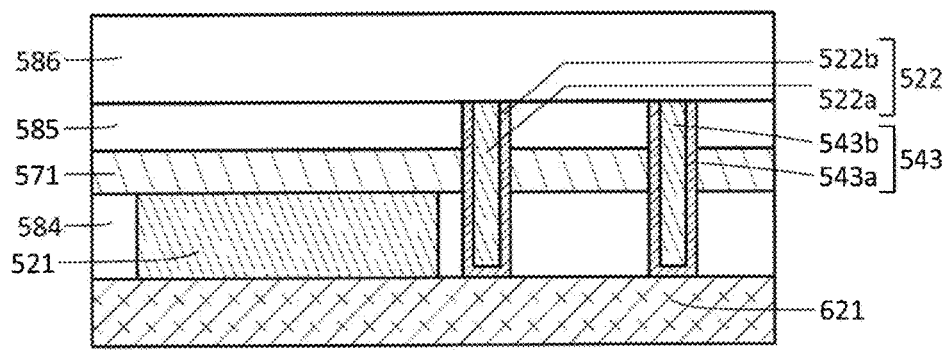
Figure 19C:
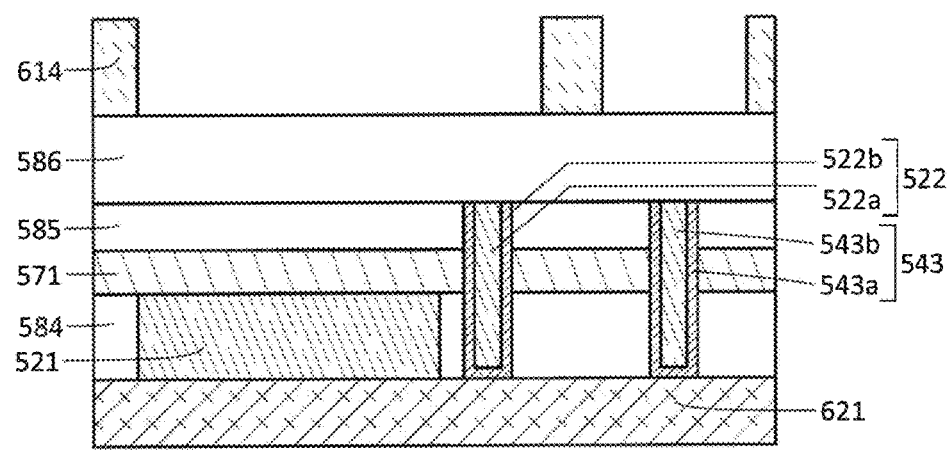

Next, surfaces of the conductive film 543d and the conductive film 543c are planarized (the conductive film 543d and the conductive film 543c are partly removed), so that the conductive layer 543 and the conductive layer 522 are formed (see FIG. 19A). Then, the insulating film 586 is formed (see FIG. 19B). Then, the mask 614 is formed over the insulating film 586 (see FIG. 19C).

Figure 20A:
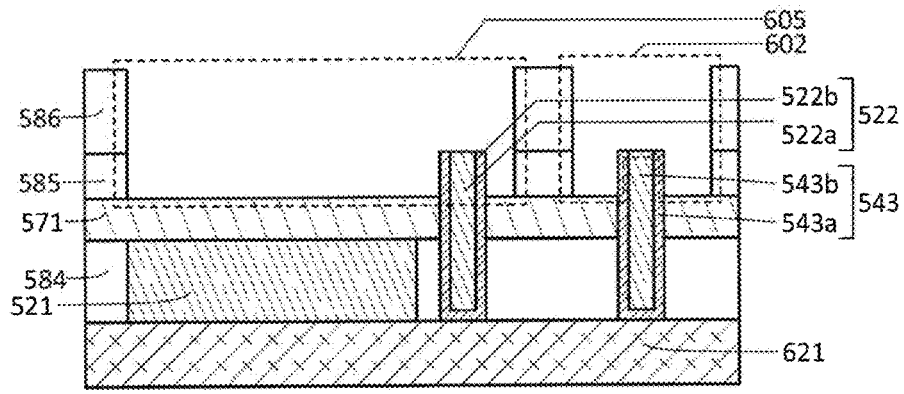
FIGS. 20A to 20C are cross-sectional views illustrating an example of a method for manufacturing a device of one embodiment of the present invention.

Then, the insulating film 586 and the insulating film 585 are etched with the use of the mask 614, so that the opening 602 and an opening 605 are formed (see FIG. 20A). Here, projection portions are included in lower parts of the opening 602 and the opening 605. As for the projection portions, the description for FIG. 7B may be referred to, for example.

Figure 20B:
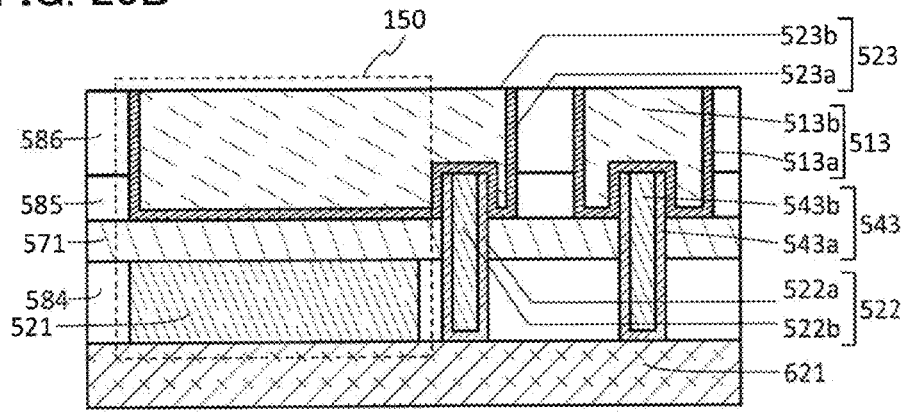
Figure 20C:
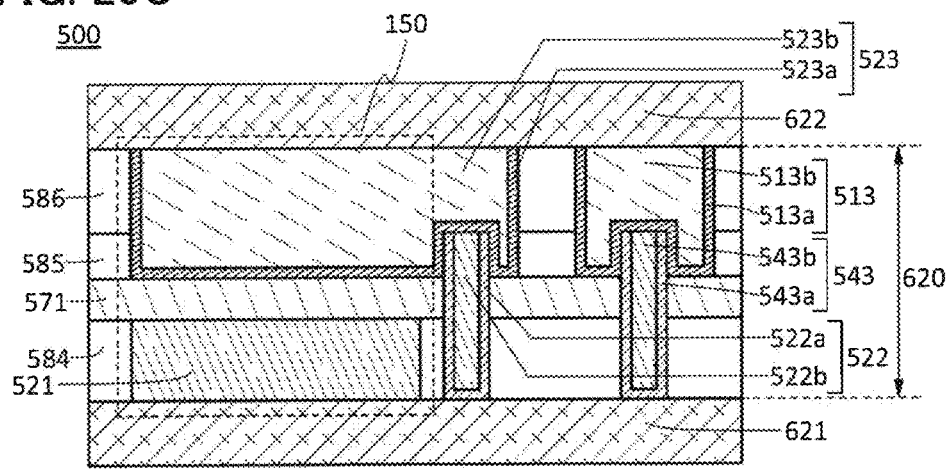

Next, a conductive film is formed in the openings 602 and 605 and over the insulating film 586, and then a surface of the conductive film is planarized (the conductive film is partly removed), so that the conductive layer 523 and the conductive layer 513 are formed (see FIG. 20B). Then, the layer 622 is formed over the conductive layer 523, the conductive layer 513, and the insulating film 586; thus, the device 500 illustrated in FIG. 20C is obtained.

[Example of Transistor]

Figure 9A:
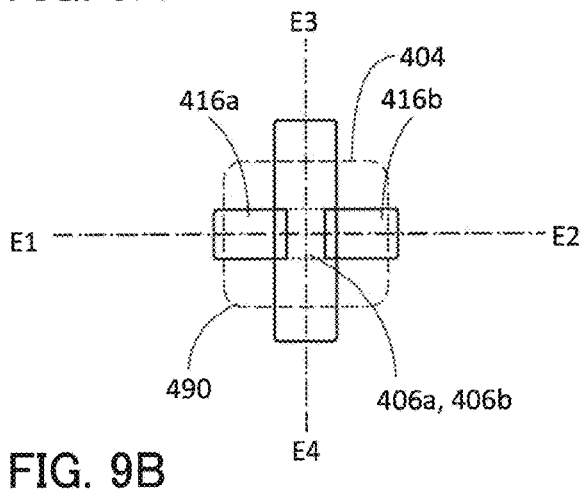
FIGS. 9A and 9B are a top view and a cross-sectional view illustrating an example of a transistor of one embodiment of the present invention.
Figure 9B:
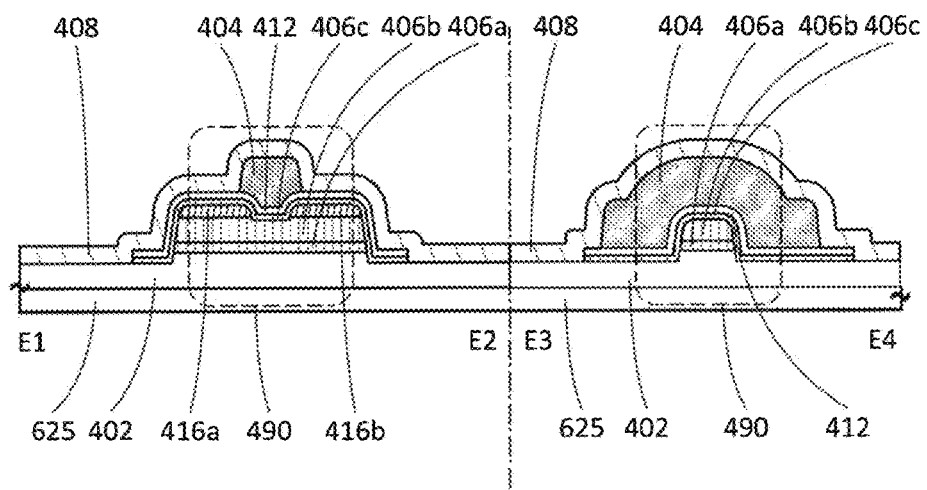

An example in which a transistor is used as an element included in the layer 622 will be described. An example of a transistor 490 included in the layer 622 is illustrated in FIGS. 9A and 9B. FIG. 9A is atop view of the transistor 490. FIG. 9B illustrates cross sections along the dashed-dotted lines E1-E2 and E3-E4 in FIG. 9A.

In the example of the cross sections illustrated in FIG. 9B, the transistor 490 is formed over a layer 625. The layer 625 may be a substrate having an insulating surface or a conductor. The layer 625 preferably includes an insulator and a conductor. The layer 625 may include the layer 621, for example.

The transistor 490 illustrated in FIGS. 9A and 9B includes an insulating film 402 over the layer 625, a semiconductor 406a over the insulating film 402, a semiconductor 406b over the semiconductor 406a, a conductive layer 416a and a conductive layer 416b which are in contact with a top surface of the semiconductor 406b, a semiconductor 406c which is in contact with a side surface of the semiconductor 406a, top and side surfaces of the semiconductor 406b, top and side surfaces of the conductive layer 416a, and top and side surfaces of the conductive layer 416b, an insulating film 412 over the semiconductor 406c, and a conductive layer 404 over the insulating film 412.

Here, the layer 625 may include a conductive layer that faces the semiconductor 406a with the insulating film 402 provided therebetween. The conductive layer may function as an electrode of the transistor 490.

Note that the semiconductor 406b has a function of a channel formation region of the transistor. Furthermore, the conductive layer 404 has a function of a first gate electrode (also referred to as a front gate electrode) of the transistor. The conductive layer 416a and the conductive layer 416b have a function of the source electrode and the drain electrode of the transistor.

Here, it is preferable to use an oxide semiconductor as the semiconductor 406a, the semiconductor 406b, and the semiconductor 406c. The oxide semiconductor will be described later.

As illustrated in FIG. 9B, the semiconductor 406b can be electrically surrounded by an electric field of the conductive layer 404 (a structure in which a semiconductor is electrically surrounded by an electric field of a conductor is referred to as a surrounded channel (s-channel) structure). Therefore, a channel is formed in the entire semiconductor 406b (bulk) in some cases. In the s-channel structure, a large amount of current can flow between a source and a drain of the transistor, so that a high on-state current can be obtained.

The s-channel structure is suitable for a miniaturized transistor because a high on-state current can be obtained. A device including a miniaturized transistor can have a high integration degree and high density. For example, the channel length of the transistor is preferably less than or equal to 40 nm, further preferably less than or equal to 30 nm, and still further preferably less than or equal to 20 nm, and the channel width of the transistor is preferably less than or equal to 40 nm, further preferably less than or equal to 30 nm, and still further preferably less than or equal to 20 nm.

The semiconductor 406a, the semiconductor 406b, and the semiconductor 406c will be described below.

By placing the semiconductor 406a over the semiconductor 406b and placing the semiconductor 406c under the semiconductor 406b, electrical characteristics of the transistor can be increased in some cases.

The semiconductor 406a preferably includes a CAAC-OS. The semiconductor 406b preferably includes a CAAC-OS. The semiconductor 406c preferably includes a CAAC-OS.

The semiconductor 406b is an oxide semiconductor containing indium, for example. The oxide semiconductor 406b can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily crystallized, in some cases.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used, for example. For example, the energy gap of the semiconductor 406b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the semiconductor 406a and the semiconductor 406c are oxide semiconductors including one or more elements, or two or more elements other than oxygen included in the semiconductor 406b. Since the semiconductor 406a and the semiconductor 406c each include one or more elements, or two or more elements other than oxygen included in the semiconductor 406b, a defect state is less likely to be formed at the interface between the semiconductor 406a and the semiconductor 406b and the interface between the semiconductor 406b and the semiconductor 406c.

The semiconductor 406a, the semiconductor 406b, and the semiconductor 406c preferably include at least indium. In the case of using an In-M-Zn oxide as the semiconductor 406a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 406b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the semiconductor 406c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor 406c may be an oxide that is of the same type as the oxide of the semiconductor 406a. Note that the semiconductor 406a and/or the semiconductor 406c do/does not necessarily contain indium in some cases. For example, the semiconductor 406a and/or the semiconductor 406c may be gallium oxide. Note that the atomic ratios of the elements included in the semiconductor 406a, the semiconductor 406b, and the semiconductor 406c are not necessarily simple ratios of integers.

As the semiconductor 406b, an oxide having an electron affinity higher than those of the semiconductor 406a and the semiconductor 406c is used. For example, as the semiconductor 406b, an oxide having an electron affinity higher than those of the semiconductor 406a and the semiconductor 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum.

An indium gallium oxide has small electron affinity and a high oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, further preferably higher than or equal to 90%.

At this time, when a gate voltage is applied, a channel is formed in the semiconductor 406b having the highest electron affinity in the semiconductors 406a, 406b, and 406c.

Figure 25:
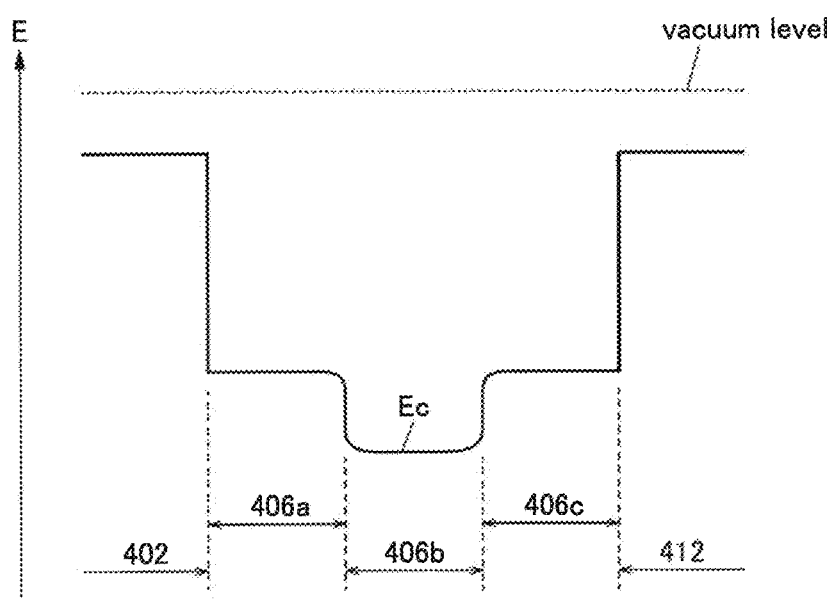
FIG. 25 is a band diagram of a region including an oxide semiconductor according to one embodiment of the present invention.

Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low density of defect states. For that reason, the stack including the semiconductors 406a, 406b, and 406c has a band structure where energy is changed continuously at each interface and in the vicinity of the interface (continuous junction) (see FIG. 25). Note that boundaries of the semiconductor 406a, the semiconductor 406b, and the semiconductor 406c are not clear in some cases.

An oxide which has higher electron affinity than the semiconductors 406a and 406c is used for the semiconductor 406b, whereby when an electric field is applied to the gate electrode, a channel is formed in the semiconductor 406b that has the highest electron affinity among the semiconductors 406a, 406b, and 406c. Here, when the channel is formed in the semiconductor 406b, for example, the channel formation region is apart from the interface with the insulating film 412; as a result, influence of scattering at the interface with the insulating film can be reduced. Thus, the field effect mobility of the transistor can be increased. Here, as described later, the semiconductor 406b and the semiconductor 406c have the common constituent element and thus interface scattering hardly occurs therebetween.

Furthermore, in the case where a silicon oxide film, a silicon oxynitride film, a silicon nitride oxide film, a silicon nitride film, or the like is used as the gate insulating film, silicon contained in the gate insulating film enters the oxide semiconductor film in some cases. When silicon is included in the oxide semiconductor film, a decrease in crystallinity of the oxide semiconductor film, a decrease in carrier mobility, or the like might occur. Therefore, to reduce the impurity concentration, for example, the silicon concentration, of the semiconductor 406b where the channel is formed, it is preferable that the semiconductor 406c be provided between the semiconductor 406b and the gate insulating film. For a similar reason, to reduce influence of an impurity diffused from the insulating film 402, it is preferable that the semiconductor 406a be provided between the semiconductor 406b and the insulating film 402.

Moreover, the thickness of the semiconductor 406c is preferably as small as possible to increase the on-state current of the transistor. For example, the semiconductor 406c is formed to include a region having a thickness of less than 10 nm, preferably less than or equal to 5 nm, further preferably less than or equal to 3 nm. Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. For example, the semiconductor 406c is formed to include a region having a thickness of greater than or equal to 0.3 nm, preferably greater than or equal to 1 nm, further preferably greater than or equal to 2 nm. The semiconductor 406c preferably has an oxygen blocking property to suppress outward diffusion of oxygen released from the insulating film 402 and the like.

To improve reliability, preferably, the thickness of the semiconductor 406a is large and the thickness of the semiconductor 406c is small. For example, the semiconductor 406a includes a region with a thickness of, for example, greater than or equal to 10 nm, preferably greater than or equal to 20 nm, further preferably greater than or equal to 40 nm, still further preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the device including semiconductors might be decreased, the semiconductor 406a has a region with a thickness of, for example, less than or equal to 200 nm, preferably less than or equal to 120 nm, further preferably less than or equal to 80 nm.

The semiconductor 406b includes a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. It is preferable to reduce the hydrogen concentration in the semiconductor 406a and the semiconductor 406c in order to reduce the hydrogen concentration in the semiconductor 406b. The semiconductor 406a and the semiconductor 406c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. Furthermore, the semiconductor 406b includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$. It is preferable to reduce the nitrogen concentration in the semiconductor 406a and the semiconductor 406c in order to reduce the nitrogen concentration in the semiconductor 406b. The semiconductor 406a and the semiconductor 406c include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$.

The above three-layer structure is an example. For example, a two-layer structure without the semiconductor 406a or the semiconductor 406c may be employed. Alternatively, a four-layer structure in which any one of the semiconductors described as examples of the semiconductor 406a, the semiconductor 406b, and the semiconductor 406c is provided under or over the semiconductor 406a or under or over the semiconductor 406c may be employed. An n-layer structure (n is an integer of 5 or more) in which one or more of the semiconductors described as examples of the semiconductor 406a, the semiconductor 406b, and the semiconductor 406c is/are provided at two or more of the following positions: over the semiconductor 406a, under the semiconductor 406a, over the semiconductor 406c, and under the semiconductor 406c may be provided.

An insulating film 408 preferably has a function of blocking oxygen. The insulating film 408 preferably has a function of blocking hydrogen and water. For example, the material described as the material of the insulating film 571 can be used as the insulating film 408.

<Method for Manufacturing Transistor>

Next, an example of a method for manufacturing the transistor 490 will be described. The transistor 490 illustrated in FIG. 9B is provided over the layer 625. First, the insulating film 402, a film to be the semiconductor 406a, and a film to be the semiconductor 406b are sequentially formed over the layer 625. Then, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor 406a and crystallinity of the semiconductor 406b can be increased and impurities such as hydrogen and water can be removed.

Next, a mask is provided over the film to be the semiconductor 406b, and the semiconductor 406b and the semiconductor 406a are formed by dry etching or the like. As an example here, a conductor may be used as the mask. Then, the mask is processed and used as the conductive layer 416a and the conductive layer 416b.

Then, a film to be the semiconductor 406c, a film to be the insulating film 412, and a conductive film to be the conductive layer 404 are sequentially formed over the semiconductor 406a, the semiconductor 406b, the conductive layer 416a, and the conductive layer 416b. Then, the conductive layer 404 is formed by dry etching or the like with the use of a mask. Then, the mask is removed.

Next, the insulating film 402 and the semiconductor 406c are formed by dry etching or the like with the use of a mask. Then, the insulating film 408 is formed.

The insulating film 408 can be formed by, for example, a sputtering method, a CVD method, an MBE method, a PLD method, an ALD method, or the like. Preferably, the insulating film 408 is formed of aluminum oxide with plasma including oxygen, whereby oxygen in the plasma can be added into side surfaces of the insulating film 402 and the insulating film 412 as excess oxygen. At this point, in some cases, a mixed region containing much excess oxygen is formed in the vicinity of the interface between the insulating film 408 and the insulating film 402.

It is preferable to perform second heat treatment at any time after the formation of the insulator to be the insulating film 408. By the second heat treatment, excess oxygen contained in the insulating film 402 and the mixed region is transferred to the semiconductor 406b through the insulating film 402 and the semiconductor 406a. The transfer of excess oxygen to the semiconductor 406b causes a reduction of defects (oxygen vacancies) in the semiconductor 406b. As for the conditions of the second heat treatment, the description of the first heat treatment can be referred to.

Through the above-described process, the transistor 490 illustrated in FIGS. 9A and 9B can be manufactured.

Here, the insulating film 402 and the insulating film 412 are formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. To form the insulating film 402 and the insulating film 412, a sputtering method, a CVD method (including a thermal CVD method, an MOCVD method, a PECVD method, and the like), an MBE method, an ALD method, a PLD method, or the like can be used. In particular, it is preferable that the insulating film be formed by a CVD method, further preferably a plasma CVD method because coverage can be improved. It is preferable to use a thermal CVD method, an MOCVD method, or an ALD method in order to reduce plasma damage.

To form the films to be the semiconductor 406a, the semiconductor 406b, and the semiconductor 406c, a sputtering method, a CVD method, an MBE method, a PLD method, an ALD method, or the like can be used, for example. In the case where In—Ga—Zn oxide layers are formed by an MOCVD method as the films to be the semiconductor 406a, the semiconductor 406b, and the semiconductor 406c, trimethylindium, trimethylgallium, dimethylzinc, and the like may be used as the source gases. The source gases are not limited to the above combination, and triethylindium or the like may be used instead of trimethylindium. Alternatively, triethylgallium or the like may be used instead of trimethylgallium. Still alternatively, diethylzinc or the like may be used instead of dimethylzinc. As a dry etching gas for the semiconductor 406a, the semiconductor 406b, and the semiconductor 406c, a mixed gas of methane ($CH_4$) and argon (Ar), or the like can be used, for example.

As for materials and formation method used for the conductive layer 416a and the conductive layer 416b, the description of the conductive layer 542 or the like can be referred to, for example.

<Variation of Transistor>

Figure 26A:
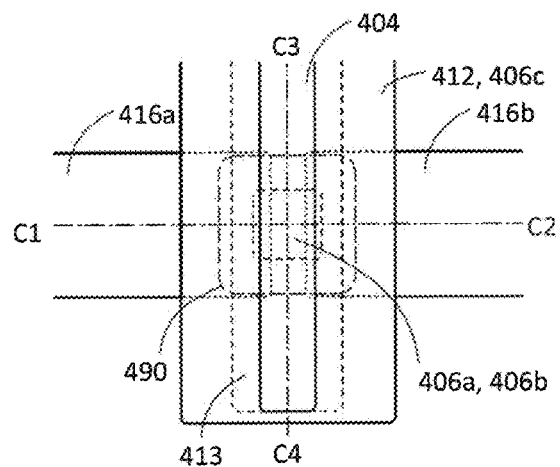
FIGS. 26A and 26B are a top view and a cross-sectional view illustrating an example of a transistor of one embodiment of the present invention.
Figure 26B:
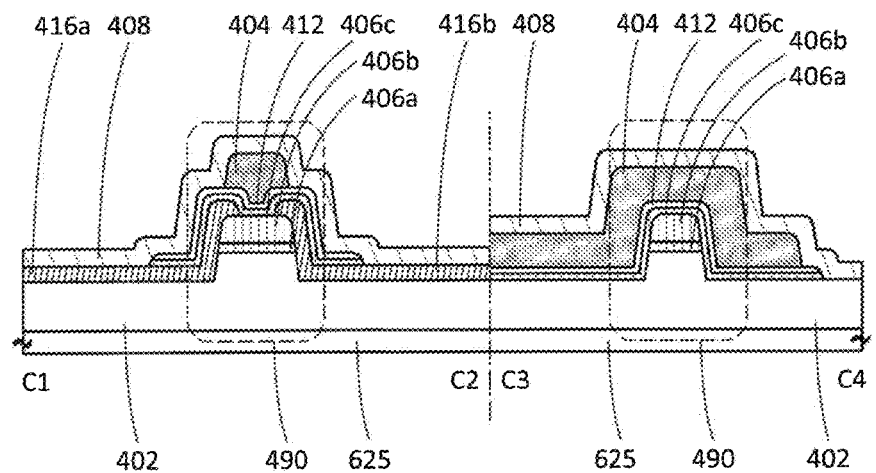

FIG. 26A is a top view of the transistor 490. FIG. 26B illustrates cross sections along the dashed-dotted lines C1-C2 and C3-C4 in FIG. 26A.

The transistor 490 illustrated in FIG. 26B includes the insulating film 402, the semiconductor 406a over the insulating film 402, the semiconductor 406b over the semiconductor 406a, the conductive layer 416a and the conductive layer 416b which are in contact with the side surface of the semiconductor 406a and the top and side surfaces of the semiconductor 406b, the semiconductor 406c which is in contact with the side surface of the semiconductor 406a, the top and side surfaces of the semiconductor 406b, the top and side surfaces of the conductive layer 416a, and the top and side surfaces of the conductive layer 416b, the insulating film 412 over the semiconductor 406c, and the conductive layer 404 over the insulating film 412.

Figure 27A:
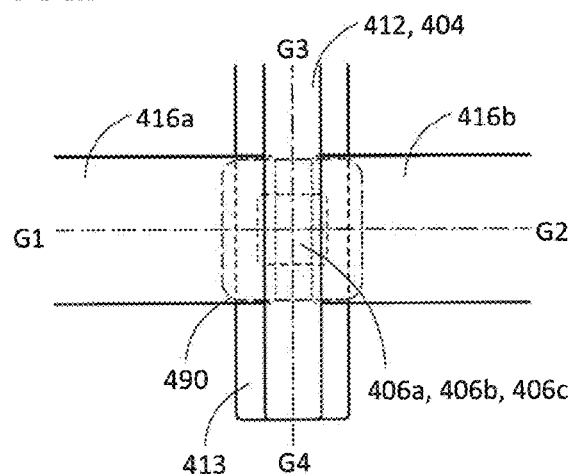
FIGS. 27A and 27B are a top view and a cross-sectional view illustrating an example of a transistor of one embodiment of the present invention.
Figure 27B:
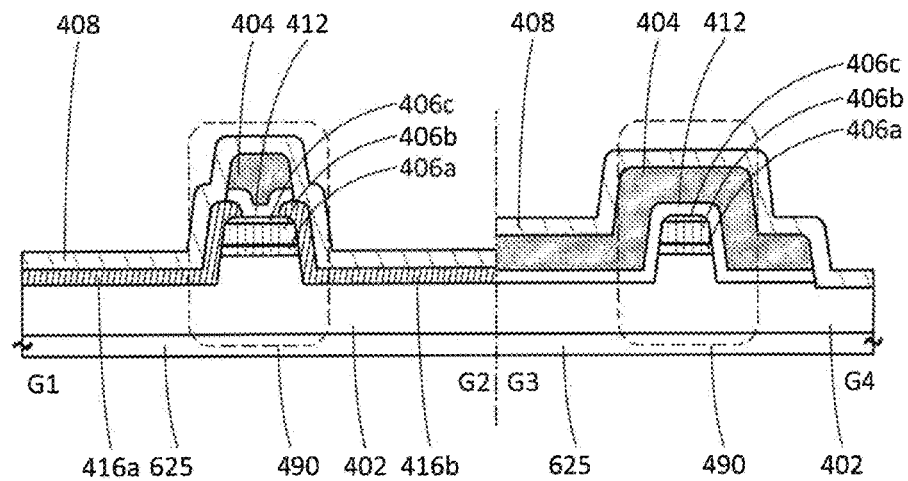

FIG. 27A is a top view of the transistor 490. FIG. 27B are cross-sectional views along the dashed-dotted lines G1-G2 and G3-G4 in FIG. 27A.

The transistor 490 illustrated in FIGS. 27A and 27B includes the insulating film 402, the semiconductor 406a over a projection portion of the insulating film 402, the semiconductor 406b over the semiconductor 406a, the semiconductor 406c over the semiconductor 406b, the conductive layers 416a and 416b which are in contact with the semiconductor 406a, the semiconductor 406b, and the semiconductor 406c and are provided with a distance therebetween, the insulating film 412 over the semiconductor 406c, the conductive layer 416a, and the conductive layer 416b, the conductive layer 404 over the insulating film 412, and the insulating film 408 over the conductive layer 416a, the conductive layer 416b, the insulating film 412, and the conductive layer 404.

The insulating film 412 is in contact with at least the side surface of the semiconductor 406b in the G3-G4 cross section. In the G3-G4 cross section, the conductive layer 404 faces the top and side surfaces of the semiconductor 406b with at least the insulating film 412 positioned therebetween.

Figure 28A:
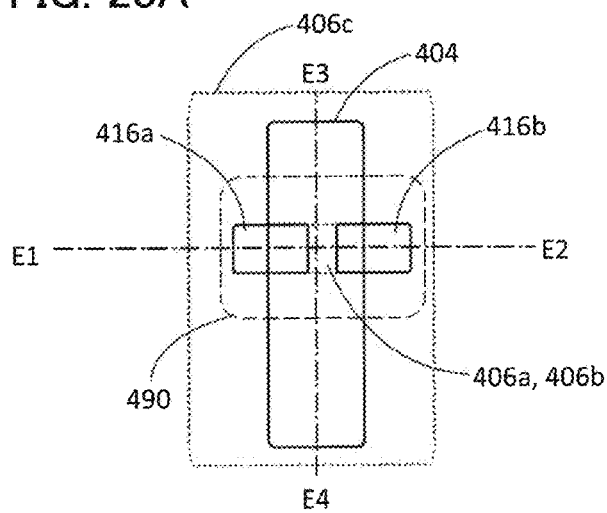
FIGS. 28A and 28B are a top view and a cross-sectional view illustrating an example of a transistor of one embodiment of the present invention.
Figure 28B:
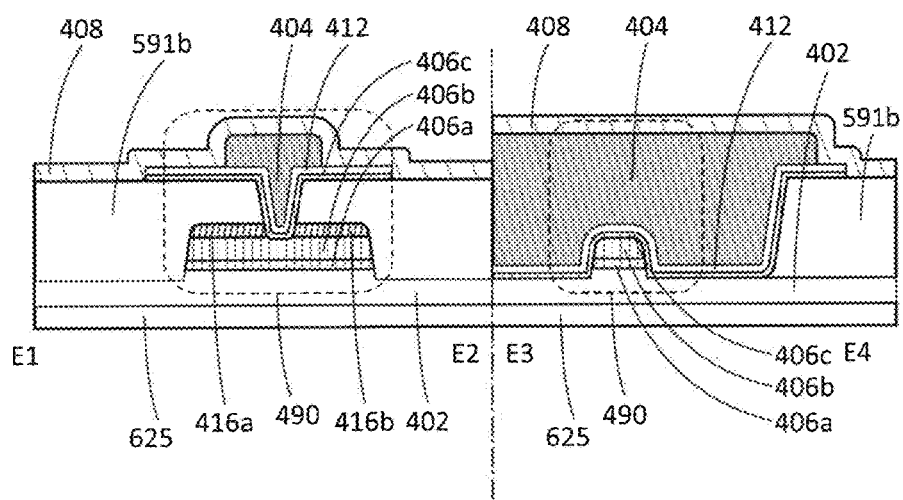

FIG. 28A is an example of a top view of the transistor 490. FIG. 28B illustrates an example of a cross-sectional view along the dashed-dotted lines E1-E2 and E3-E4 in FIG. 28A. Note that some components such as an insulator are omitted in FIG. 28A for easy understanding.

The transistor 490 illustrated in FIGS. 28A and 28B includes the insulating film 402 over the layer 625, the semiconductor 406a over the insulating film 402, the semiconductor 406b over the semiconductor 406a, the conductive layer 416a and the conductive layer 416b which are in contact with the top surface of the semiconductor 406b, an insulating film 591b which is in contact with the side surface of the semiconductor 406a, the side surface of the semiconductor 406b, the top and side surfaces of the conductive layer 416a, and the top and side surfaces of the conductive layer 416b, the semiconductor 406c in contact with the top surface of the semiconductor 406b, the insulating film 412 over the semiconductor 406c, the conductive layer 404 over the insulating film 412, and the insulating film 408 which is in contact with the top and side surfaces of the conductive layer 404 and a top surface of the insulating film 591b. For the material and the like of the insulating film 591b, the description of the insulating film 581 may be referred to, for example.

Figure 29A:
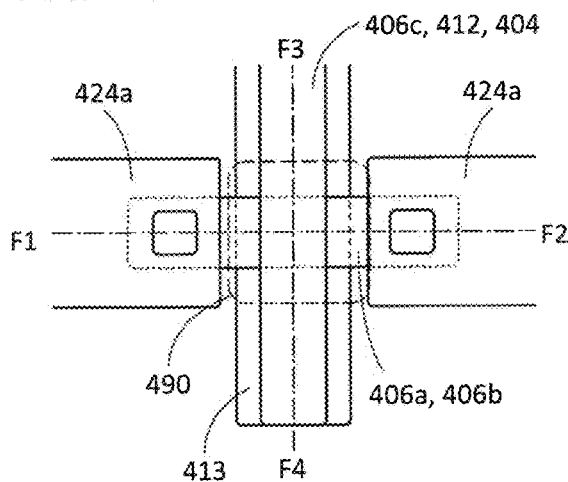
FIGS. 29A and 29B are a top view and a cross-sectional view illustrating an example of a transistor of one embodiment of the present invention.
Figure 29B:
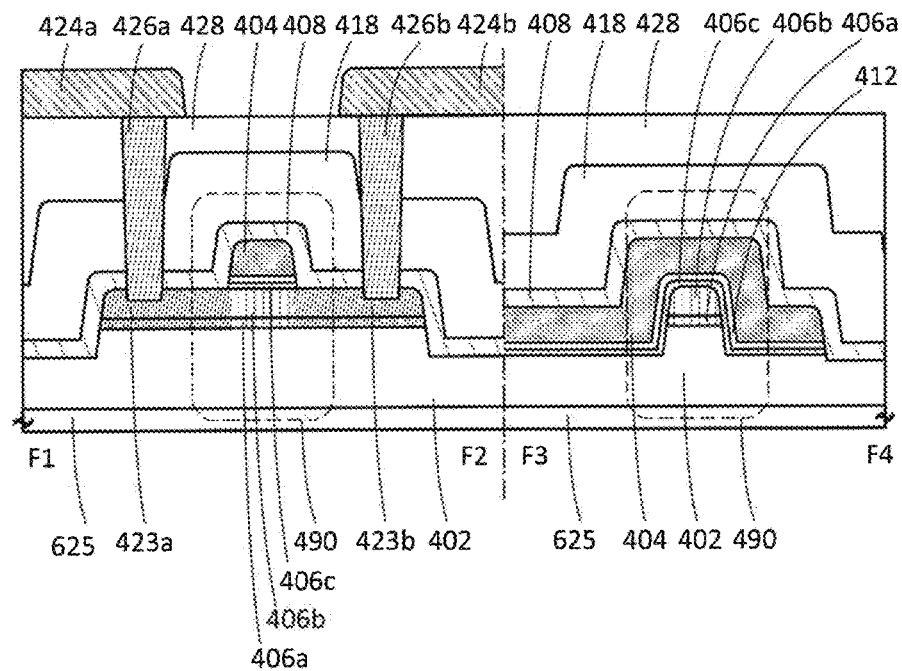

FIG. 29A is an example of a top view of the transistor 490. FIG. 29B illustrates an example of a cross-sectional view along the dashed-dotted lines F1-F2 and F3-F4 in FIG. 29A. Note that some components such as an insulator are omitted in FIG. 29A for easy understanding.

The transistor 490 illustrated in FIGS. 29A and 29B does not include the conductive layer 416a and the conductive layer 416b, where a conductive layer 426a and a conductive layer 426b are in contact with the semiconductor 406b. In this case, a low-resistance region 423a (a low-resistance region 423b) is preferably provided in a region in contact with at least the conductive layer 426a and the conductive layer 426b in the semiconductor 406b and/or the semiconductor 406a. The low-resistance region 423a and the low-resistance region 423b may be formed in such a manner that, for example, the conductive layer 404 or the like is used as a mask and impurities are added to the semiconductor 406b and/or the semiconductor 406a. The conductive layer 426a and the conductive layer 426b may be provided in holes (portions which penetrate) or recessed portions (portions which do not penetrate) of the semiconductor 406b. When the conductive layer 426a and the conductive layer 426b are provided in holes or recessed portions of the semiconductor 406b, contact areas between the conductive layers 426a and 426b and the semiconductor 406b are increased; thus, the adverse effect of the contact resistance can be decreased. In other words, the on-state current of the transistor can be increased.

Figure 30A:
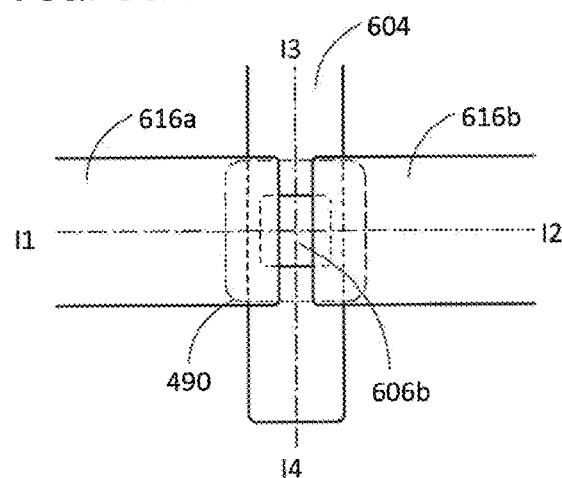
FIGS. 30A and 30B are a top view and a cross-sectional view illustrating an example of a transistor of one embodiment of the present invention.
Figure 30B:
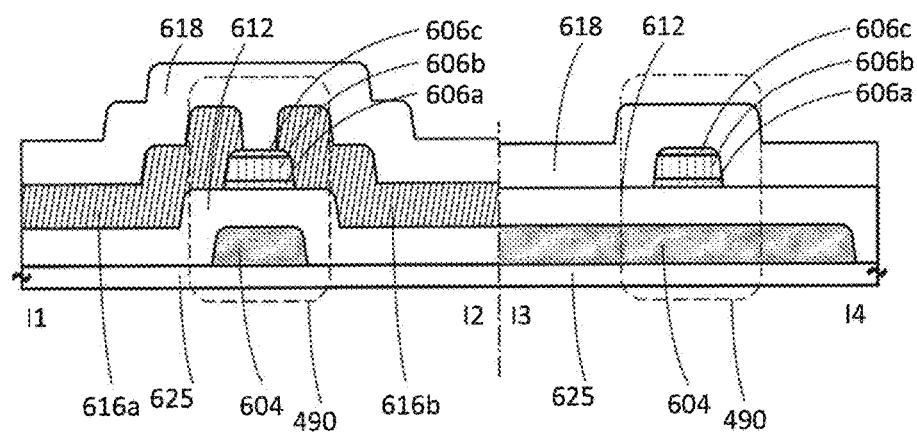

FIGS. 30A and 30B are a top view and a cross-sectional view of the transistor 490 of one embodiment of the present invention. FIG. 30A is the top view, and FIG. 30B is the cross-sectional view along the dashed-dotted lines I1-I2 and I3-I4 in FIG. 30A. Note that some components are omitted in the top view of FIG. 30A for simplification of the drawing.

The transistor 490 illustrated in FIGS. 30A and 30B includes a conductive layer 604 over the layer 625, an insulating film 612 over the conductive layer 604, a semiconductor 606a over the insulating film 612, a semiconductor 606b over the semiconductor 606a, a semiconductor 606c over the semiconductor 606b, a conductive layer 616a and a conductive layer 616b which are in contact with the semiconductor 606a, the semiconductor 606b, and the semiconductor 606c and are provided with a distance therebetween, and an insulating film 618 over the semiconductor 606a, the conductive layer 616b, and the conductive layer 616c. The conductive layer 604 faces a bottom surface of the semiconductor 606b with the insulating film 612 positioned therebetween. The insulating film 612 may have a projection portion. The semiconductor 606a may be omitted. The insulating film 618 may be omitted.

The semiconductor 606b has a function of a channel formation region of the transistor 490. The conductive layer 604 has a function of a first gate electrode (also referred to as a front gate electrode) of the transistor 490. The conductive layer 616a and the conductive layer 616b have a function of a source electrode and a drain electrode of the transistor 490.

The insulating film 618 is preferably an insulator containing excess oxygen.

For the conductive layer 604, the description of the conductive layer 404 is referred to. For the insulating film 612, the description of the insulating film 412 is referred to. For the semiconductor 606a, the description of the semiconductor 406c is referred to. For the semiconductor 606b, the description of the semiconductor 406b is referred to. For the semiconductor 606c, the description of the semiconductor 406a is referred to. For the conductive layer 616a and the conductive layer 616b, the description of the conductive layer 416a and the conductive layer 416b is referred to. For the insulating film 618, the description of the insulating film 402 is referred to.

Thus, the transistor 490 in FIGS. 30A and 30B might be regarded as only different from the transistor 490 in FIGS. 27A and 27B in part of the structure. Specifically, the structure of the transistor 490 in FIGS. 30A and 30B is similar to the structure of the transistor 490 without the conductive layer 404 in FIGS. 27A and 27B. Thus, for the transistor 490 in FIGS. 30A and 30B, the description of the transistor 490 in FIGS. 27A and 27B can be referred to as appropriate.

The transistor 490 may include a conductor which overlaps with the semiconductor 606b with the insulating film 618 provided therebetween. The conductor functions as a second gate electrode of the transistor 490. For the conductor, the description of the conductive layer 413 is referred to. Further, an s-channel structure may be formed using the second gate electrode.

Over the insulating film 618, a display element may be provided. For example, a pixel electrode, a liquid crystal layer, a common electrode, a light-emitting layer, an organic EL layer, an anode, a cathode, or the like may be provided. The display element is connected to the conductive layer 616a or the like, for example.

Figure 31A:
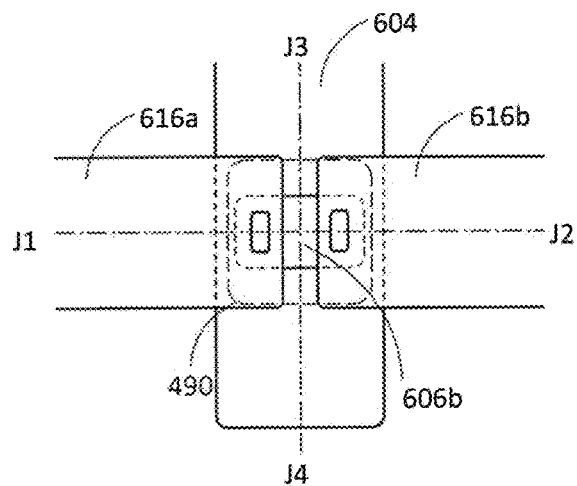
FIGS. 31A and 31B are a top view and a cross-sectional view illustrating an example of a transistor of one embodiment of the present invention.
Figure 31B:
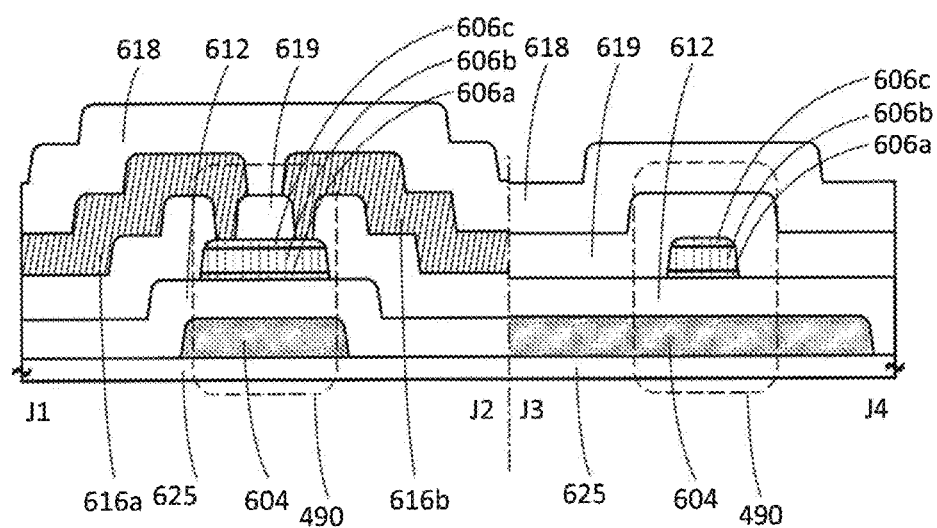

Over the semiconductor, an insulator that can function as a channel protective film may be provided. Alternatively, as illustrated in FIGS. 31A and 31B, an insulating film 619 may be provided between the semiconductor 606c and the conductive layers 616a and 616b. In that case, the conductive layer 616a (the conductive layer 616b) and the semiconductor 606c are connected to each other through an opening in the insulating film 619. For the insulating film 619, the description of the insulating film 618 may be referred to.

Figure 32A:
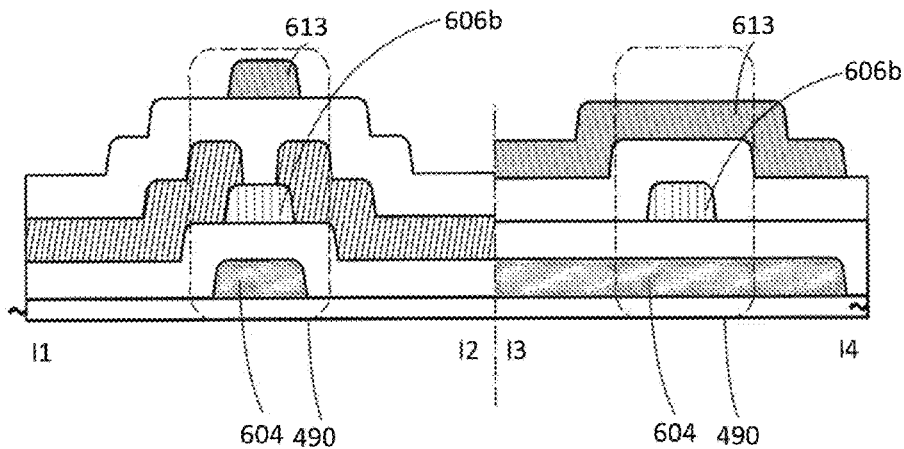
FIGS. 32A and 32B are cross-sectional views illustrating examples of a transistor of one embodiment of the present invention.
Figure 32B:
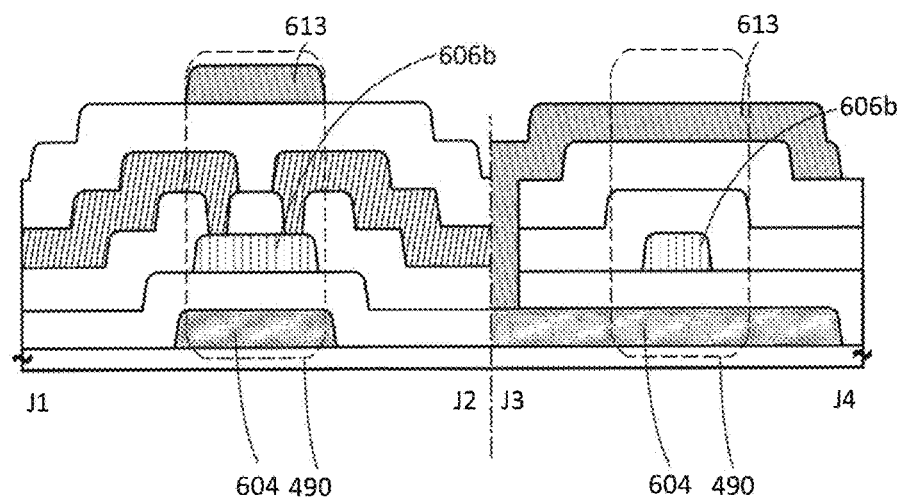

In FIG. 30B and FIG. 31B, a conductive layer 613 may be provided over the insulating film 618. Examples of that case are illustrated in FIGS. 32A and 32B. For the conductive layer 613, the description of the conductive layer 413 is referred to. A potential or signal which is the same as that supplied to the conductive layer 604 or a potential or signal which is different from that supplied to the conductive layer 604 may be supplied to the conductive layer 613. For example, by supplying a constant potential to the conductive layer 613, the threshold voltage of the transistor 490 may be controlled. In other words, the conductive layer 613 can function as a second gate electrode.

[Example of Semiconductor Device]

Figure 13A:
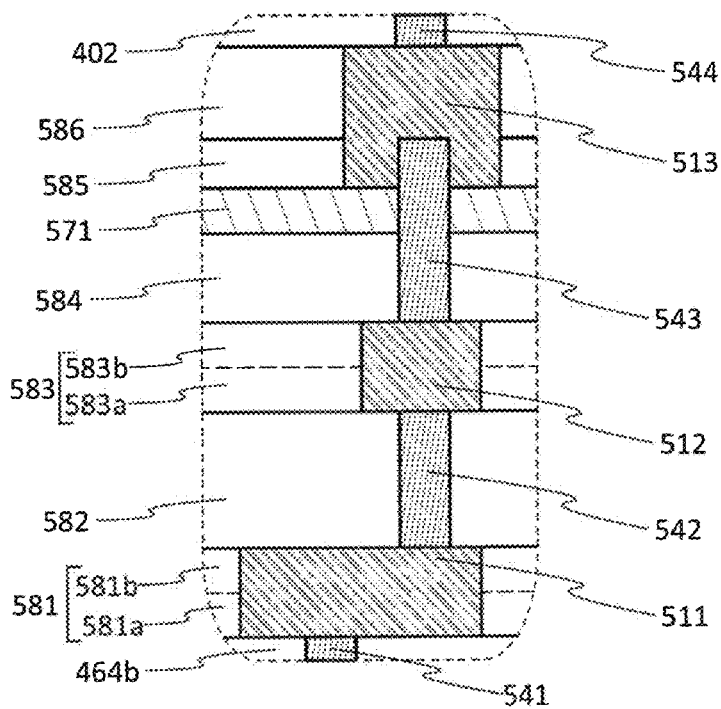
FIGS. 13A and 13B illustrate an example of a device of one embodiment of the present invention.
Figure 13B:
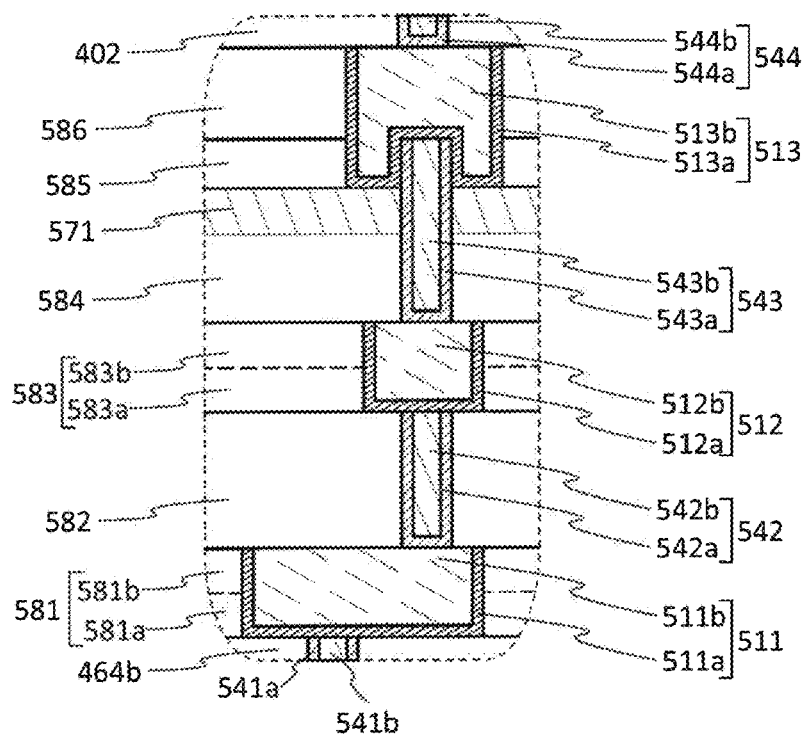

FIG. 10 illustrates an example in which the device 500 of one embodiment of the present invention is a semiconductor device. FIG. 13A is an enlarged view of a region surrounded by the dashed-dotted line in FIG. 10. FIG. 13B illustrates an example in which the conductive layers 511 to 513 and the conductive layers 542 to 544 in FIG. 13A are each formed of stacked two layers.

Figure 11:
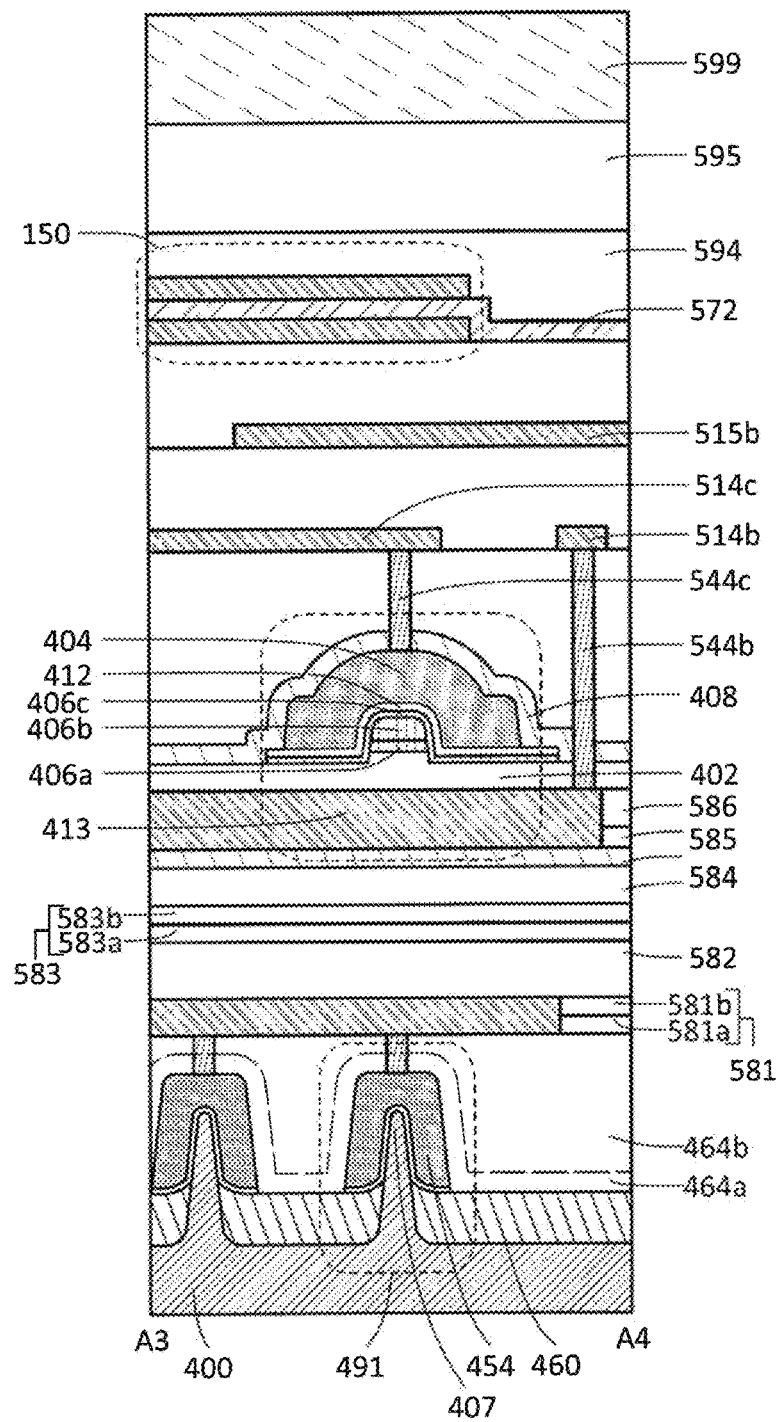
FIG. 11 is a cross-sectional view illustrating an example of a device of one embodiment of the present invention.

FIG. 11 illustrates a cross section of the device 500 on a plane substantially perpendicular to the cross section in FIG. 10. Here, the cross section in FIG. 10 is along the line segment A1-A2, and the cross section in FIG. 11 is along the line segment A3-A4.

Figure 12:
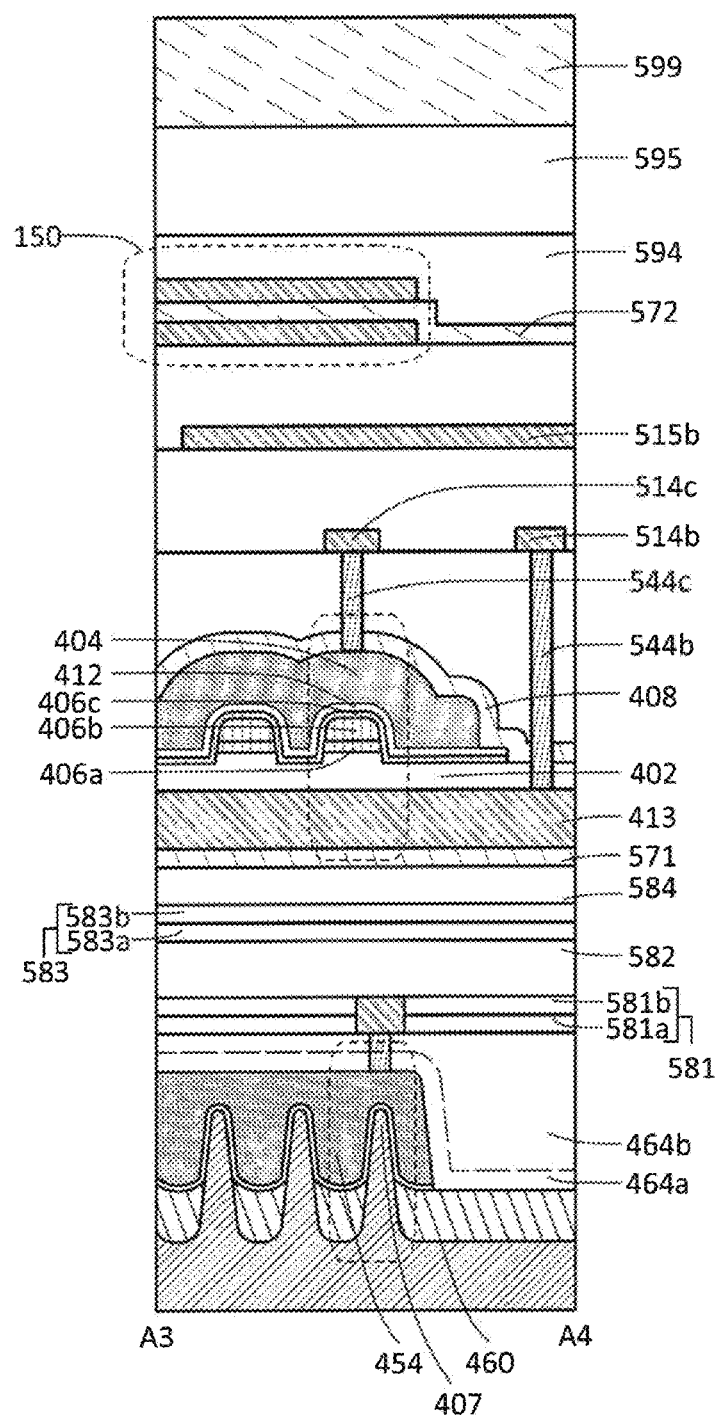
FIG. 12 illustrates an example of a device of one embodiment of the present invention.

FIG. 12 illustrates an example, which is different from that in FIG. 11, of the cross section of the device 500 on a plane substantially perpendicular to the cross section in FIG. 10.

The device 500 illustrated in FIG. 10 includes the layer 621, the layer 622, and the layer 620 that connects the layer 621 to the layer 622. The layer 621 includes a transistor 491, a transistor 492, and a transistor 493 provided over a substrate 400, and the layer 622 includes the transistor 490 and the capacitor 150.

<Layer 621>

The layer 621 will be described. The transistor 491 includes a channel formation region 407, an insulating film 462 over the substrate 400, a conductive layer 454 over the insulating film 462, an insulating film 470 in contact with a side surface of the conductive layer 454, a region 476 positioned in the substrate 400 and overlapping with neither the conductive layer 454 nor the insulating film 470, and a region 474 positioned in the substrate 400 and overlapping with the insulating film 470. The region 476 is a low-resistance layer and preferably functions as a source or drain region of the transistor 491. The region 474 preferably functions as a lightly doped drain (LDD) region.

The transistor 491 may be either a p-channel transistor or an n-channel transistor, and an appropriate transistor is used depending on the circuit configuration or the driving method.

The substrate 400 preferably include, for example, a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Alternatively, silicon having crystal lattice distortion may be contained. Alternatively, the transistor 491 may be a high-electron-mobility transistor (HEMT) with GaAs and AlGaAs or the like.

The region 476 preferably contains an element which imparts n-type conductivity, such as phosphorus, or an element which imparts p-type conductivity, such as boron.

The conductive layer 454 can be formed using a semiconductor material such as silicon containing the element that imparts n-type conductivity, such as phosphorus, or the element that imparts p-type conductivity, such as boron, or a conductive material such as a metal material, an alloy material, or a metal oxide material. It is particularly preferable to use a high-melting-point material that has both heat resistance and conductivity, such as tungsten or molybdenum, and further preferable to use tungsten.

The transistor 491 illustrated in FIG. 10 is an example in which element isolation is performed by a shallow trench isolation (STI) method or the like. Specifically, in FIG. 10, the transistor 491 is electrically isolated by element isolation using an element isolation region 460 that is formed in such a manner that an insulator including silicon oxide or the like is buried in a trench formed in the substrate 400 by etching or the like and then is partly removed by etching or the like.

In a projection portion of the substrate 400 which is positioned in a region other than the trench, the regions 476 and 474 and the channel formation region 407 of the transistor 491 are provided. Furthermore, the transistor 491 includes the insulating film 462 that covers the channel formation region 407 and the conductive layer 454 that overlaps with the channel formation region 407 with the insulating film 462 positioned therebetween.

In the transistor 491, a side portion and an upper portion of the projection portion in the channel formation region 407 overlap with the conductive layer 454 with the insulating film 462 positioned therebetween, so that carriers flow in a wide area including the side portion and the upper portion of the channel formation region 407. Therefore, an area over the substrate occupied by the transistor 491 is reduced, and the number of transferred carriers in the transistor 491 is increased. As a result, the on-state current of the transistor 491 is increased and the field-effect mobility of the transistor 491 is increased. Suppose the length in the channel width direction (channel width) of the projection portion in the channel formation region 407 is W, and the thickness of the projection portion in the channel formation region 407 is T. When the aspect ratio (T/W) of the thickness T to the channel width W is high, a region where carriers flow becomes larger. Thus, the on-state current of the transistor 491 can be further increased and the field-effect mobility of the transistor 491 can be further increased.

Note that when the transistor 491 is formed using a bulk semiconductor substrate, the aspect ratio is desirably 0.5 or more, further desirably 1 or more.

Figure 23A:
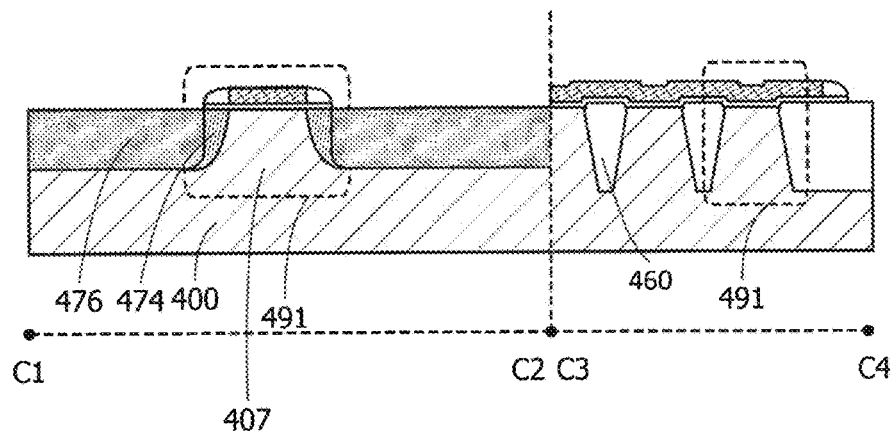
FIGS. 23A and 23B are cross-sectional views illustrating examples of a transistor of one embodiment of the present invention.
Figure 23B:
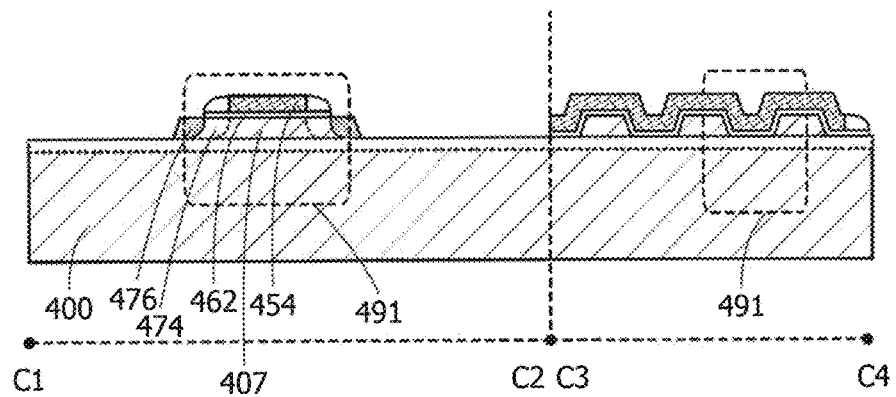

The transistor 491 does not necessarily include the projection portion in the substrate 400 that is illustrated in FIG. 23A. As illustrated in FIG. 23B, the transistor 491 may be formed using a silicon on insulator (SOI) substrate.

For the transistor 492 and the transistor 493, the description of the transistor 491 may be referred to.

An insulating film 464a and an insulating film 464b are provided so as to cover the transistor 491, the transistor 492, and the transistor 493.

A conductive layer 541 and the like are provided so as to embed an opening in the insulating film 464a and the insulating film 464b. The conductive layer 541 and the like are preferably provided over and in contact with the conductive layer 454, the region 476, or the like of the transistor 491 or the transistor 492.

The insulating film 581, the conductive layer 511, and the like are provided over the conductive layer 541 and the like. The conductive layer 511 and the like are preferably connected to a conductive layer such as the conductive layer 541.

The insulating film 582, the conductive layer 542, and the like are provided over the conductive layer 511 and the like.

The conductive layer 542 and the like are preferably provided over and in contact with the conductive layer 511 and the like.

The insulating film 583, the conductive layer 512, and the like are provided over the conductive layer 542 and the like. The conductive layer 512 and the like are preferably connected to a conductive layer such as the conductive layer 542.

Note that in the layer 621, the insulating film 582, the insulating film 583, the conductive layer 542, and the conductive layer 512 may be omitted, for example. In that case, the conductive layer 511 and the like may be in contact with the layer 620, for example. Alternatively, an insulating film or a conductive film may be further stacked between the insulating film 581 and the insulating film 582.

For the insulating film 464a and the insulating film 464b, the description of the insulating film 581 can be referred to, for example. For the conductive layer 541, the description of the conductive layer 542 can be referred to, for example.

<Layer 622>

The layer 622 will be described. As for the transistor 490 included in the layer 622, FIGS. 9A and 9B and FIG. 26A to FIG. 32B may be referred to.

The layer 622 includes an insulating film 591 over the transistor 490. The conductive layer 544 and the like are provided so as to embed an opening in the insulating film 591. The conductive layer 544 and the like are preferably connected to a conductive layer included in the layer 620 and the conductive layers 404, 416a, and 416b and the like included in the transistor 490.

An insulating film 592, the conductive layer 514, and the like are provided over the insulating film 591, the conductive layer 544, and the like. The conductive layer 514 and the like are preferably connected to the conductive layer 544 and the like. A conductive layer 545 is provided in contact with a top surface of the conductive layer 514 and the like so as to embed an opening in the insulating film 592.

An insulating film 593, a conductive layer 515, and the like are provided over the insulating film 592, the conductive layer 545, and the like. The conductive layer 515 and the like are preferably connected to the conductive layer 545 and the like. A conductive layer 546 is provided in contact with a top surface of the conductive layer 515 or the like so as to embed an opening in the insulating film 593.

The capacitor 150 is provided over the conductive layer 546 and the insulating film 593. The capacitor includes a pair of electrodes which are a conductive layer 516 and a conductive layer 517 and an insulating film 572 which is a dielectric. A conductive layer 516b and the like may be included over the conductive layer 546, the insulating film 593, and the like.

The conductive layer 516 is in contact with the conductive layer 546. The conductive layer 517 is electrically connected to a conductive layer provided over an insulating film 594 through a conductive layer 547 provided over the conductive layer 517. The conductive layer 516 and the like are in contact with a conductive layer 547 and the like.

The insulating film 572 can be formed to have a single-layer structure or a stacked-layer structure using, for example, one or more of an insulating film containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST). Alternatively, aluminum oxide, bismuth oxide, germanium oxide, niobium oxide, silicon oxide, titanium oxide, tungsten oxide, yttrium oxide, zirconium oxide, or gallium oxide may be added to the insulating film, for example.

Alternatively, the insulating film may be subjected to nitriding treatment to be an oxynitride film. A layer of silicon oxide, silicon oxynitride, or silicon nitride may be stacked over the insulating film.

For the formation conditions of the insulating film 572, the description of the insulating film 571 may be referred to, for example.

An insulating film 595, a conductive layer 518, and the like are provided over the insulating film 594. The conductive layer 518 and the like are preferably connected to the conductive layer 547b and the like. A conductive layer 548 is provided in contact with a top surface of the conductive layer 518 or the like so as to embed an opening in the insulating film 595.

An insulating film 599, a conductive layer 519, and the like are provided over the insulating film 595. In the insulating film 599, an opening reaching the conductive layer 519 or the like may be provided.

Figure 14:
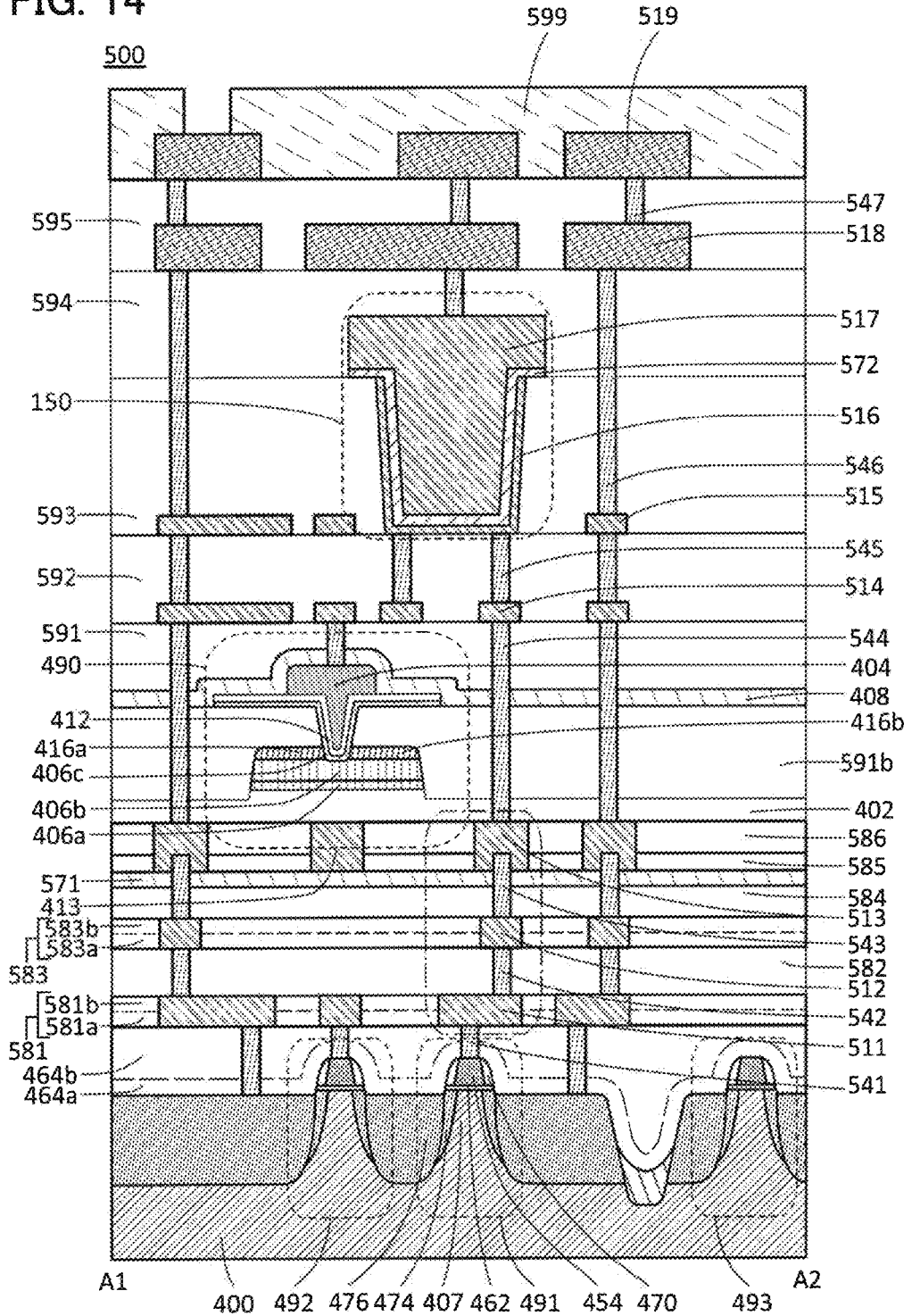
FIG. 14 illustrates an example of a device of one embodiment of the present invention.

The device 500 illustrated in FIG. 14 is different from that illustrated in FIG. 10 in the shapes of the transistor 490 and the capacitor 150. Here, an example of the capacitor 150 different from that in FIG. 10 is illustrated in FIG. 14. The capacitor 150 illustrated in FIG. 14 is, for example, formed in such a manner that a columnar opening is provided in the insulating film 593, the conductive layer 516 is provided on an inner wall of the opening, the insulating film 572 is provided over the conductive layer 516, and the conductive layer 517 is provided over the insulating film 572 so as to be embedded. By using the conductive layer provided on the inner wall of the columnar opening as one electrode of the capacitor, the electrode area can be increased, leading to a higher capacitance.

For the transistor 490 illustrated in FIG. 14, FIGS. 28A and 28B are referred to.

<Layer 620>

The layer 620 includes a wiring layer that connects the layer 621 to the layer 622. For the conductive layer 543, the conductive layer 513, the conductive layer 413, the insulating films 584 to 586, and the like in the layer 620 illustrated in FIG. 10, the description of the layer 620 illustrated in FIGS. 1A to 4 can be referred to.

The insulating film 584, the conductive layer 543, and the like are provided over the insulating film 583. The conductive layer 512 or the like included in the layer 621 is connected to the conductive layer 543 and the like included in the layer 620. The conductive layer 513 and the like are provided over the insulating film 571, the projection portion of the conductive layer 543, and the like. The conductive layer 413 is provided over the insulating film 571. The conductive layer 513 and the like are connected to the conductive layer 544 and the like included in the layer 622. As illustrated in FIG. 10, the conductive layer 413 included in the layer 620 may be positioned under the transistor 490 with the insulating film 402 positioned therebetween. In this case, the conductive layer 413 preferably functions as an electrode of the transistor 490, for example.

The insulating film 402 is positioned between the conductive layer 413 and the semiconductor 406a.

The insulating film 402 may be formed to have, for example, a single-layer structure or a stacked-layer structure including, for example, an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulating film 402 preferably includes silicon oxide or silicon oxynitride.

For example, the insulating film 402 may be formed with a stacked-layer structure in which a film including hafnium oxide is sandwiched between films including silicon oxide.

Here, the conductive layer 513 and the conductive layer 413 preferably include a first region that is provided over a region where the conductive layer 543 includes the projection portion and a second region that is provided over a region where it does not include the projection portion. A bottom surface of the second region is more flat than that of the first region. FIG. 10, FIG. 11, and the like illustrate an example in which the channel region of the transistor 490 is provided over the second region of the conductive layer 413. Here, for example, there is a case in which charge is captured at a surface of a conductive layer or an interface between a conductive layer and an insulating film. In such a case, it is sometimes preferable to make a bottom surface of the conductive layer flat because the influence on the channel region can be evened out.

For the insulating film 571, a material that does not easily transmit oxygen is preferably used. The materials given above have excellent barrier properties against oxygen as well as hydrogen and water. The use of any of the materials can inhibit diffusion of oxygen released when the insulating film 402 is heated to the layers under the insulating film 571. Consequently, the amount of oxygen that is released from the insulating film 402 and is likely to be supplied to the semiconductor layer of the transistor 490 can be increased.

In this manner, with the insulating film 571, the concentration of hydrogen or water contained in each layer provided under the insulating film 571 is reduced, the hydrogen or water is removed, or degasification is prevented, and diffusion of hydrogen or water into the transistor 490 is prevented. Thus, the amount of hydrogen or water contained in the insulating film 402 or the each layer in the transistor 490 can be extremely low. The concentration of hydrogen contained in the insulating film 402, a semiconductor 406 of the transistor 490, or the insulating film 412 can be reduced to, for example, lower than $5\times10^{18}$ cm$^{-3}$, preferably lower than $1\times10^{18}$ cm$^{-3}$, further preferably lower than $3\times10^{17}$ cm$^{-3}$.

[Example of Circuit]

Next, an example of a circuit that can be used in the device of one embodiment of the present invention will be described.

Figure 15A:
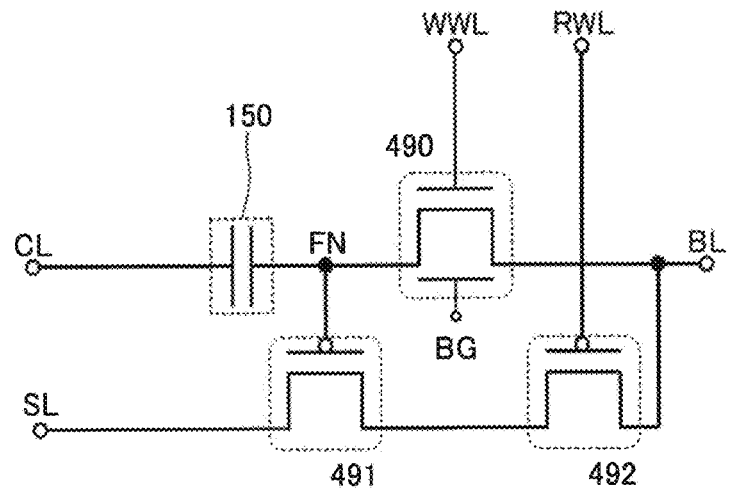
FIGS. 15A to 15C are circuit diagrams according to one embodiment of the present invention.

FIG. 15A shows an example of a circuit including three transistors and one capacitor. Here, a case in which the transistor 490, the transistor 491, and the transistor 492 described with reference to FIG. 10 and the like are used as three transistors and the capacitor 150 is used as a capacitor is considered.

Here, the transistors used in the circuit of FIG. 15A are preferably provided in the layer 621 or 622 in the cross section of the device illustrated in FIG. 10, for example. In particular, when the transistors 491 and 492 are provided in the layer 621 and the transistor 490 is provided in the layer 622 with the layer 620 sandwiched between the layers 621 and 622, the transistors 490 to 492 can show excellent characteristics. The capacitor 150 may be provided in any of the layers 620 to 622.

An example of a device including the circuit illustrated in FIG. 15A can have the structure illustrated in FIG. 10. In FIG. 10, the transistor 491 is formed in the layer 621, and the transistor 490 and the capacitor are formed in the layer 622.

In FIG. 15A, one of a source and a drain of the transistor 490 is connected to a gate electrode of the transistor 491 and one electrode of the capacitor 150 through a floating node (FN). The other of the source and the drain of the transistor 490 is connected to one of a source and a drain of the transistor 492. These connections are preferably made via a conductive layer provided in the layer 620. One of the source electrode and the drain electrode of the transistor 491 is connected to, for example, a terminal SL connected to the layer 622 through a conductive layer or the like provided in the layer 620. The other of the source and the drain of the transistor 491 is connected to the other of the source and the drain of the transistor 492.

In FIG. 10, the conductive layer 454 that is the gate electrode of the transistor 491 included in the layer 621 is connected to the conductive layer 516 that is the electrode of the capacitor 150 included in the layer 622 through conductive layers such as the conductive layers 543 and 513 provided in the layer 620. In the layer 622, the conductive layer 516 is connected to the conductive layer 416b that is one of a source electrode and a drain electrode of the transistor 490. One of the source and the drain of the transistor 492 is connected to the conductive layer 416a that is one of the source electrode and the drain electrode of the transistor 490 through the conductive layers provided in the layer 620 and the like.

For example, one of the source electrode and the drain electrode of the transistor 491 is connected to the terminal SL connected to the layer 622 through a conductive layer or the like provided in the layer 620.

Figure 15B:
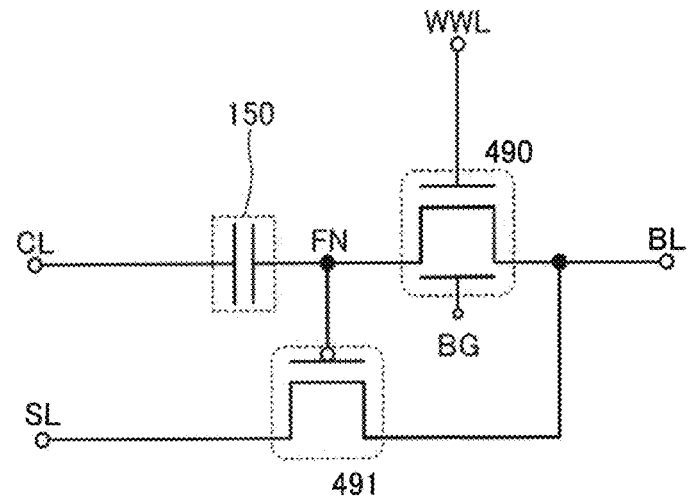
Figure 15C:
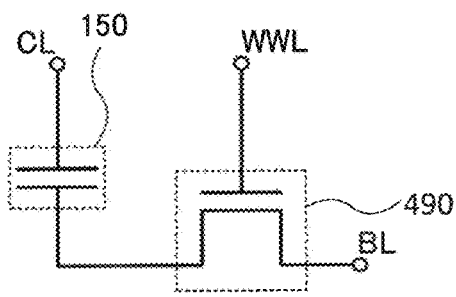

Here, a transistor provided in the layer 621 in FIG. 10, such as the transistor 493, may be used in a peripheral circuit, such as a driver circuit or a converter, connected to the circuit illustrated in FIGS. 15A to 15C or the like.

Figure 22:
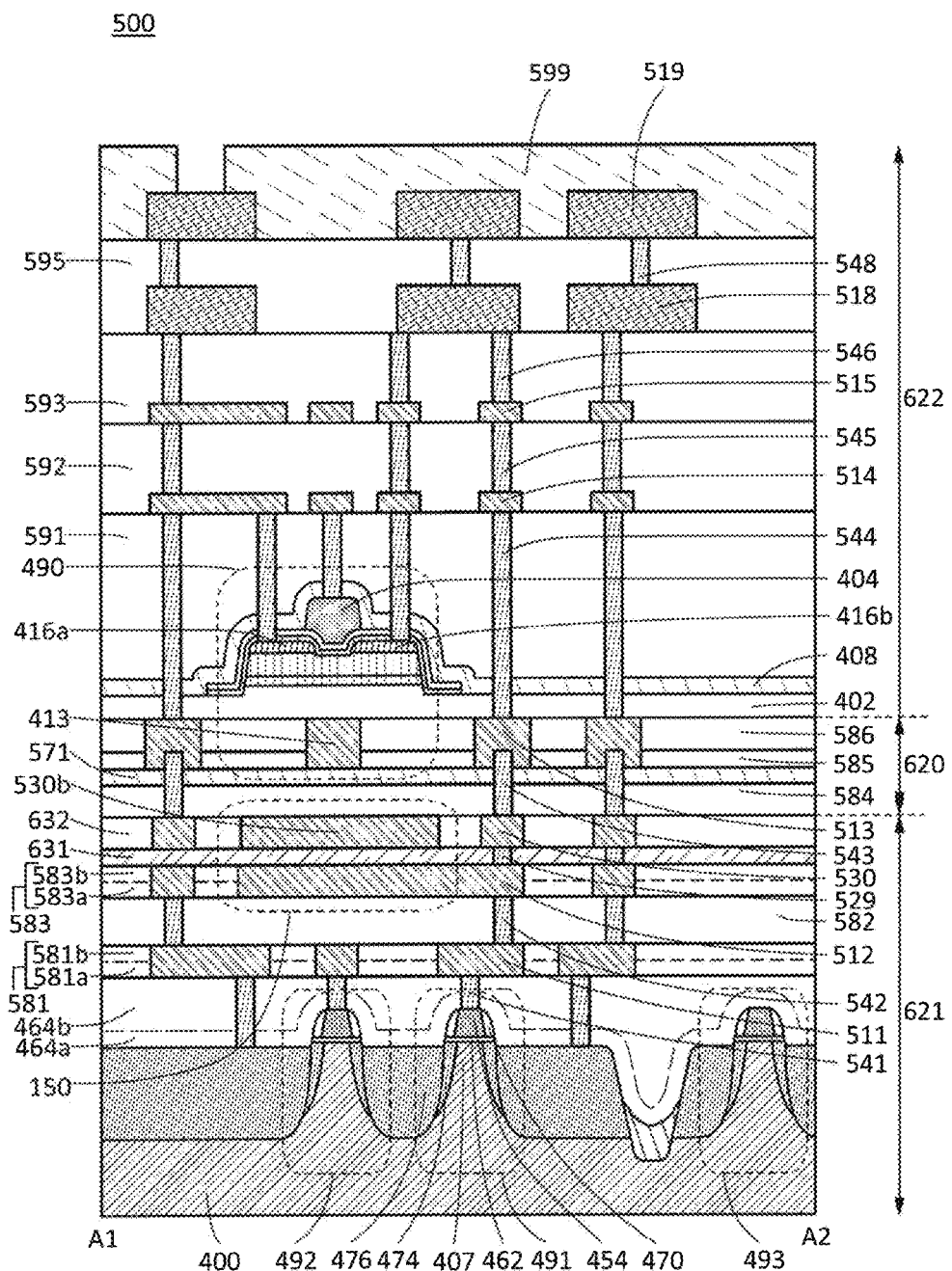
FIG. 22 is a cross-sectional view illustrating an example of a device of one embodiment of the present invention.

The device 500 illustrated in FIG. 22 is different from that in FIG. 10 in that the capacitor 150 is positioned in the layer 621, under the transistor 490 and over the transistor 491, and in that an insulating film 631, an insulating film 632, a conductive layer 529, and a conductive layer 530 are provided between the insulating films 583 and 584.

In the device 500 illustrated in FIG. 22, the conductive layer 512 functions as one electrode of the capacitor 150. The device 500 includes the conductive layer 529 or the like that is embedded in the insulating film 631 and functions as a plug. Furthermore, the device 500 includes the insulating film 632 provided over the insulating film 631 and the conductive layer 530, a conductive layer 530b, and the like which are provided over the conductive layer 529 and the like and the insulating film 631 and connected to the conductive layer 529 and the like. Here, the insulating film 631 functions as a dielectric of the capacitor 150. The conductive layer 530b functions as the other electrode of the capacitor 150. The conductive layer 512 is connected to the conductive layer 543 included in the layer 620 through the conductive layer 529 and the conductive layer 530. The conductive layer 543 is connected to a conductive layer included in the layer 622 through the conductive layer 513.

Figure 21:
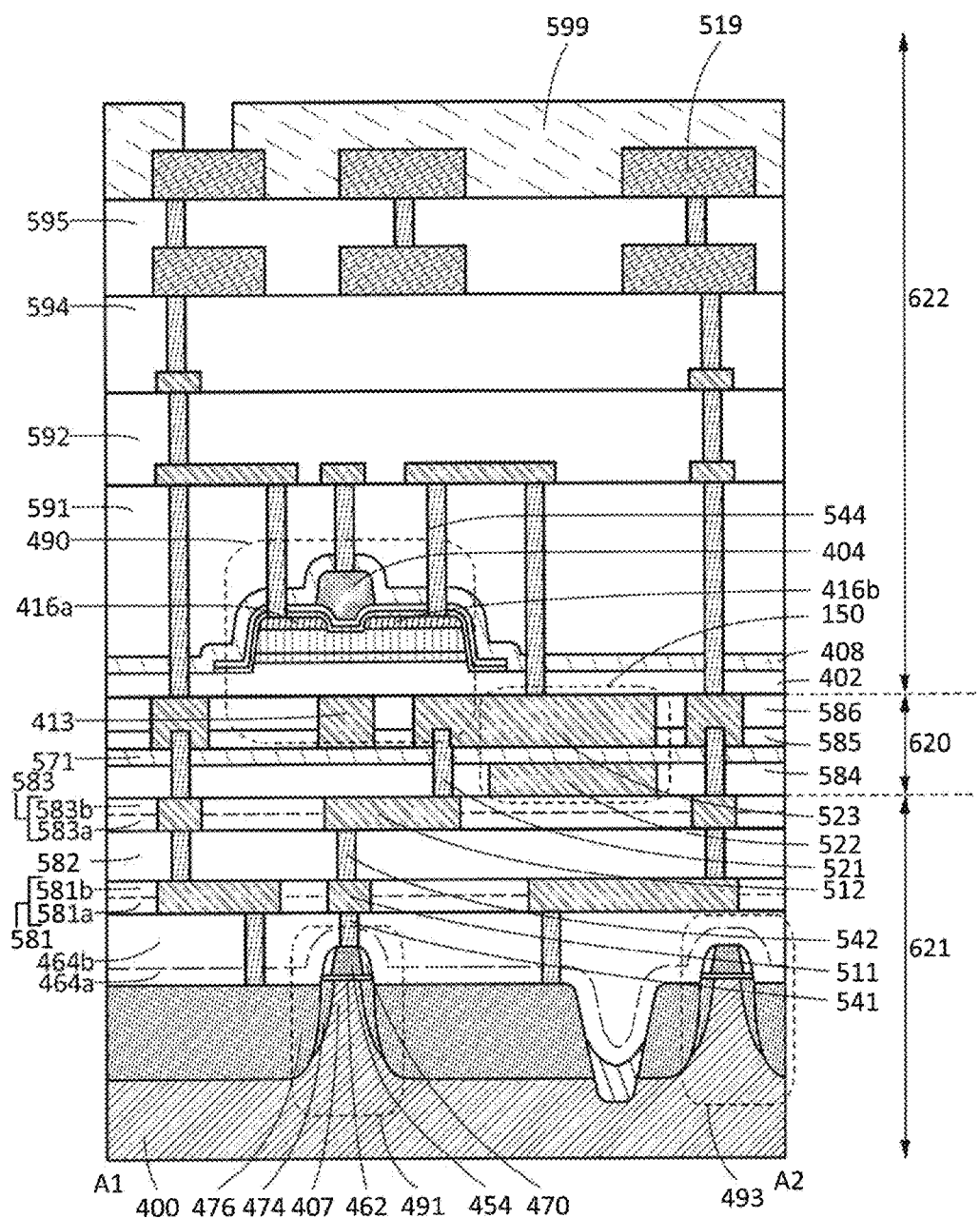
FIG. 21 is a cross-sectional view illustrating an example of a device of one embodiment of the present invention.

Although FIG. 10 illustrates an example in which the capacitor is provided in the layer 622, the capacitor 150 may be provided in the layer 620 as illustrated in FIG. 21. The device 500 illustrated in FIG. 21 is an example in which the capacitor 150 illustrated in FIG. 20C is used.

FIG. 21 illustrates an example of the device 500 including the circuit illustrated in FIG. 15B. Since the transistor 492 is not included in the circuit in FIG. 15B, the circuit area can be reduced compared with the case of employing the circuit in FIG. 15A.

Figure 49:
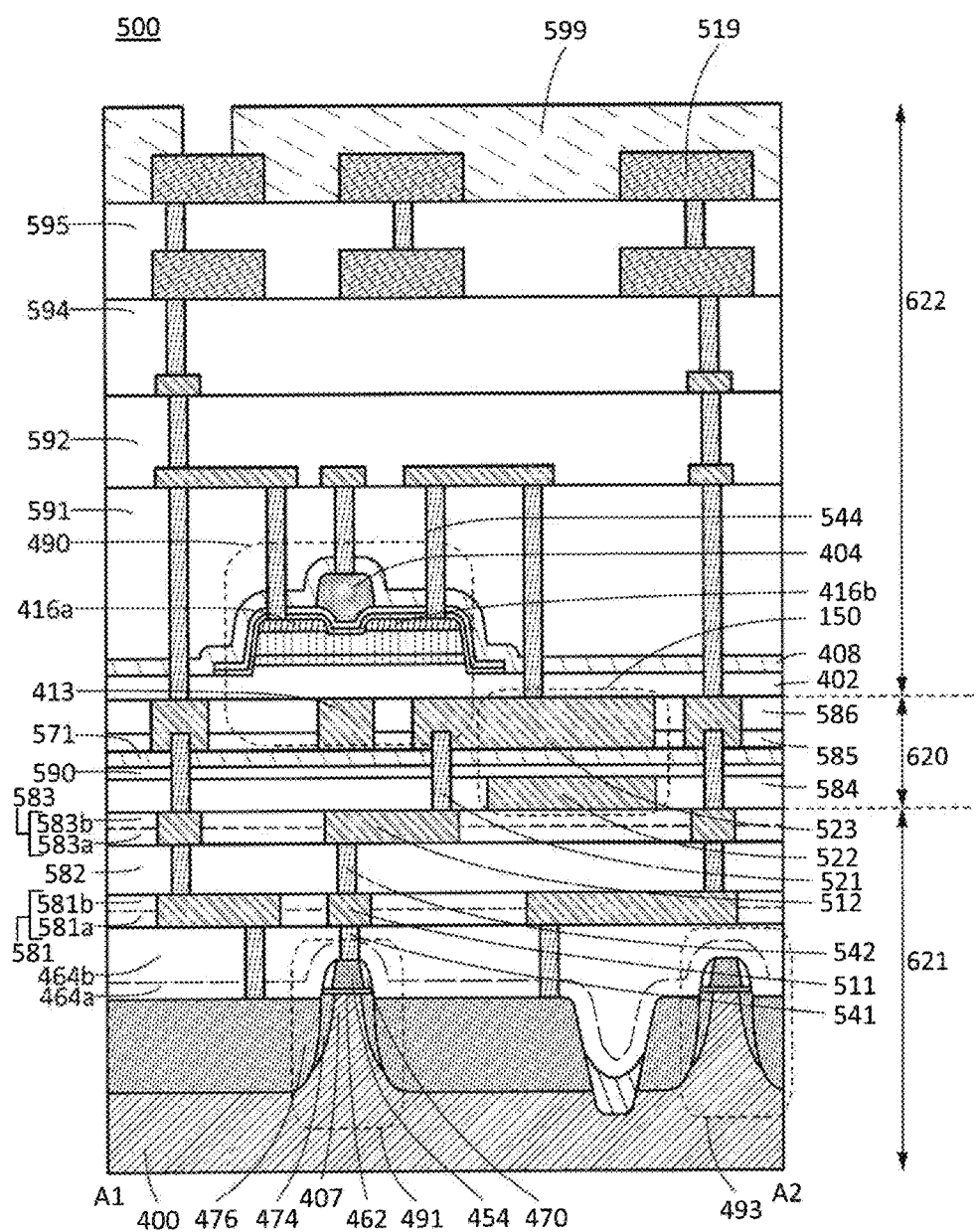
FIG. 49 is a cross-sectional view illustrating an example of a device of one embodiment of the present invention.

Here, in FIG. 21, an insulating film 590 may be included between the insulating film 571 and the insulating film 584 as illustrated in FIG. 49. The capacitor 150 includes the conductive layer 522, the conductive layer 523, and the insulating film 590 and the insulating film 571 which are sandwiched between the two conductive layers. As the insulating film 590, an insulating film containing silicon oxide is preferably used, for example.

Figure 48:
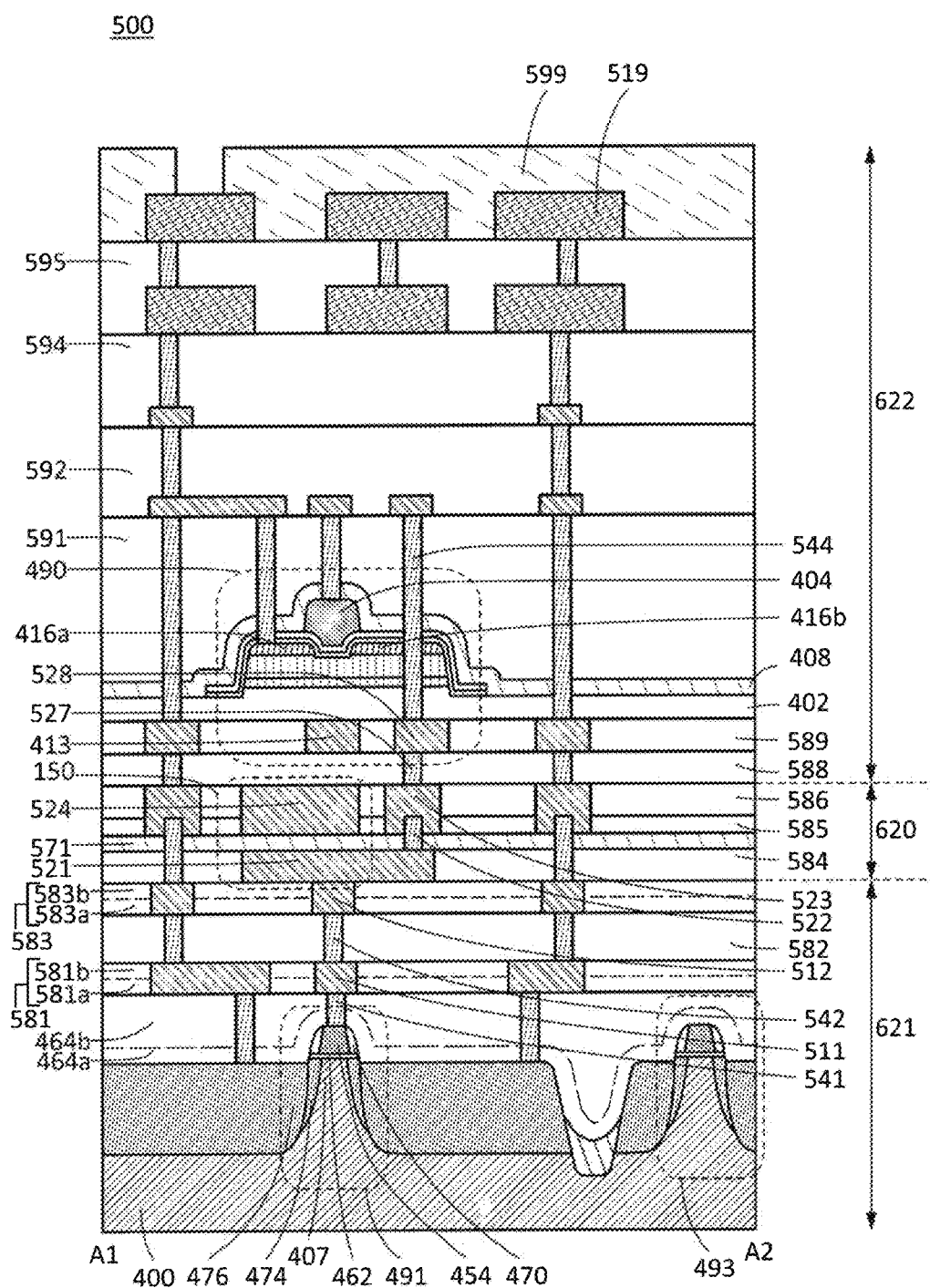
FIG. 48 is a cross-sectional view illustrating an example of a device of one embodiment of the present invention.

FIG. 48 illustrates another example of the device 500 including the circuit illustrated in FIG. 15B.

The device 500 illustrated in FIG. 48 is different from that illustrated in FIG. 10 in including the insulating film 588, an insulating film 589, a conductive layer 527 and the like, and a conductive layer 528 and the like between the insulating film 586 and the insulating film 402. In addition, the device 500 illustrated in FIG. 48 is different from that illustrated in FIG. 10 in that the capacitor 150 is positioned in the layer 620 under the transistor 490.

The device 500 illustrated in FIG. 48 includes the conductive layer 527 and the like that are embedded in the insulating film 588 and function as plugs. Furthermore, the device 500 includes the insulating film 589 provided over the insulating film 588 and the conductive layer 528 and the like which are provided over the conductive layer 527 and the like and the insulating film 588 and connected to the conductive layer 527 and the like.

In FIG. 48, the conductive layer 454 included in the transistor 491 provided in the layer 621 is connected to the conductive layer 521 provided in the layer 620. The conductive layer 521 functions as one electrode of the capacitor 150. A conductive layer 524 provided in the layer 620 functions as the other electrode of the capacitor. The conductive layer 416b included in the transistor 490 provided in the layer 622 is connected to the conductive layer 521 through the conductive layer 523 and the conductive layer 522 provided in the layer 620. One of a source and a drain of the transistor 491 is connected to the conductive layer 416a that is one of the source electrode and the drain electrode of the transistor 490 through a conductive layer or the like provided in the layer 620.

The other of the source electrode and the drain electrode of the transistor 491 is connected to, for example, the terminal SL connected to the layer 622 through a conductive layer or the like provided in the layer 620.

FIG. 48 illustrates an example in which the conductive layer 416b and the conductive layer 523 included in the layer 620 are connected to each other through the conductive layer 527, the conductive layer 528, and the conductive layer 544. Here, the conductive layer 544 is provided so as to penetrate the insulating film 591, the conductive layer 416b, the insulating film 402, and the like.

Figure 24:
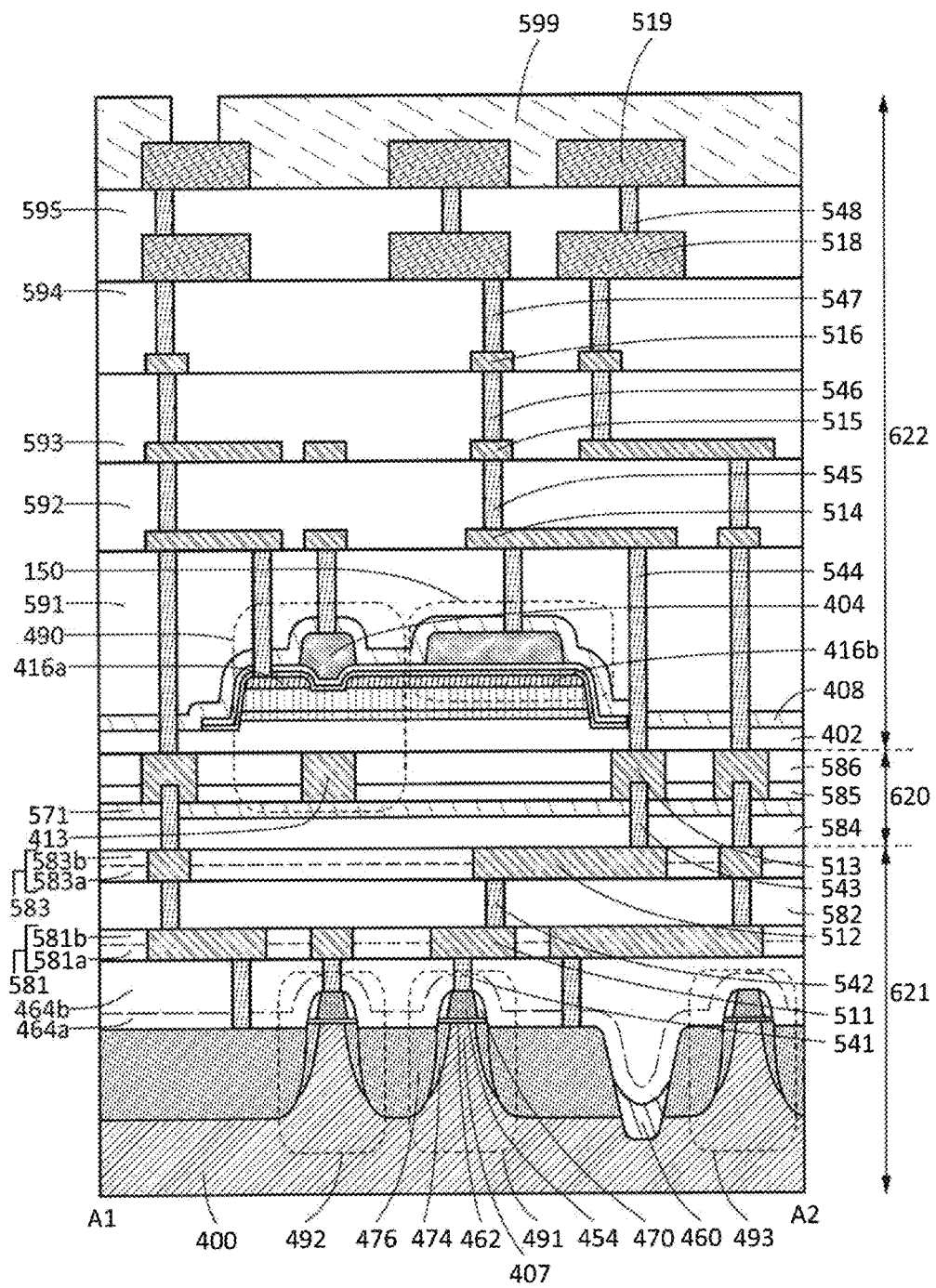
FIG. 24 is a cross-sectional view illustrating an example of a device of one embodiment of the present invention.

As illustrated in FIG. 24, the conductive layer 416b included in the transistor 490 may be used as one electrode of the capacitor 150, and a stacked-layer film of the semiconductor 406c and the insulating film 412 may be used as a dielectric. In that case, the other electrode of the capacitor 150 is preferably formed using the same material or the like and at the same time as the conductive layer 404 included in the transistor 490.

<Circuit Operation>

The circuits illustrated in FIGS. 15A to 15C and FIG. 16A can function as memory devices.

The operation of the circuit in FIG. 15B will be described.

The circuit in FIG. 15B has a feature that the potential of the gate of the transistor 491 can be retained, and thus enables writing, retaining, and reading of data as follows.

Writing and retaining of data are described. First, the potential of a terminal WWL is set to a potential at which the transistor 490 is on, so that the transistor 490 is turned on. Accordingly, the potential of a terminal BL is supplied to the node FN where the gate of the transistor 491 and the one electrode of the capacitor 150 are electrically connected to each other. That is, a predetermined charge is supplied to the gate of the transistor 491 (writing). Here, one of two kinds of charges providing different potential levels (hereinafter referred to as a low-level charge and a high-level charge) is supplied. After that, the potential of the terminal WWL is set to a potential at which the transistor 490 is off. Thus, the charge is held at the node FN (retaining).

By using an oxide semiconductor as a semiconductor layer, the transistor 490 can have a low off-state current, whereby the charge of the node FN is retained for a long time.

Next, reading of data is described. An appropriate potential (a reading potential) is supplied to the terminal CL while a predetermined potential (a constant potential) is supplied to the terminal BL, whereby the potential of the terminal SL changes in accordance with the amount of charge retained in the node FN. This is because in the case of using an n-channel transistor as the transistor 491, an apparent threshold voltage $V_{th\_H}$ at the time when the high-level charge is given to the gate of the transistor 491 is lower than an apparent threshold voltage $V_{th\_L}$ at the time when the low-level charge is given to the gate of the transistor 491. Here, an apparent threshold voltage refers to the potential of the terminal CL which is needed to make the transistor 491 be in "on state." Thus, the potential of the terminal CL is set to a potential $V_0$ which is between $V_{th\_H}$ and $V_{th\_L}$, whereby charge supplied to the node FN can be determined. For example, in the case where the high-level charge is supplied to the node FN in writing and the potential of the terminal CL is $V_0$ ($>V_{th\_H}$), the transistor 491 is brought into "on state." In the case where the low-level charge is supplied to the node FN in writing, even when the potential of the terminal CL is $V_0$ ($<V_{th\_L}$), the transistor 491 still remains in "off state." Thus, the data retained in the node FN can be read by determining the potential of the terminal SL.

Note that in the case where memory cells are arrayed, it is necessary that data of a desired memory cell be read in read operation. In a memory cell from which data is not read, the terminal CL is supplied with a potential at which the transistor 491 is in an "off state" regardless of the charge supplied to the node FN, that is, a potential lower than $V_{th\_H}$ so that data can be read from a desired memory cell. Alternatively, in a memory cell from which data is not read, the terminal CL is supplied with a potential at which the transistor 491 is brought into an "on state" regardless of the charge supplied to the node FN, that is, a potential higher than $V_{th\_L}$ so that data can be read from a desired memory cell.

In the circuit illustrated in FIG. 15A, writing and retaining of data can be carried out in a manner similar to that in FIG. 15B. In FIG. 15A, the transistor 492 is included. To prevent reading of data from the other memory cells, the transistor 492 may be brought into an "off state". Thus, leakage current from the terminal BL to the terminal SL can be suppressed in some cases. To prevent reading of data from the other memory cells in reading, a potential at which the transistor 492 is in an "off state" may be input to a terminal RWL; it is not necessary in some cases to supply a high potential to the terminal CL.

When including a transistor using an oxide semiconductor and having an extremely low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

The semiconductor device in FIG. 15C is different from the semiconductor device in FIG. 15B in not including the transistor 491. Also in this case, data can be written and retained in a manner similar to that of the semiconductor device in FIG. 15B.

Reading of data in the semiconductor device in FIG. 15C is described. When the transistor 490 is brought into on state, the terminal BL which is in a floating state and the capacitor 150 are brought into conduction, and the charge is redistributed between the terminal BL and the capacitor 150. As a result, the potential of the terminal BL is changed. The amount of change in the potential of the terminal BL varies depending on the potential of the one electrode of the capacitor 150 (or the charge accumulated in the capacitor 150).

For example, the potential of the terminal BL after the charge redistribution is $(C_B \times V_{B0} + C \times V)/(C_B + C)$, where V is the potential of the one electrode of the capacitor 150, C is the capacitance of the capacitor 150, $C_B$ is the capacitance component of the terminal BL, and $V_{B0}$ is the potential of the terminal BL before the charge redistribution. Thus, it can be found that, assuming that the memory cell is in either of two states in which the potential V of the one electrode of the capacitor 150 is $V_1$ and $V_0$ ($V_1 > V_0$), the potential of the terminal BL in the case of retaining the potential $V_1$ ($= (C_B \times V_{B0} + C \times V_1)/(C_B + C)$) is higher than the potential of the terminal BL in the case of retaining the potential $V_0$ ($= (C_B \times V_{B0} + C \times V_0)/(C_B + C)$).

Then, by comparing the potential of the terminal BL with a predetermined potential, data can be read.

In this case, a transistor provided in the layer 621, such as the transistor 493 illustrated as an example in FIG. 10 or the like, may be used in a peripheral circuit for driving the memory cell.

Figure 16A:
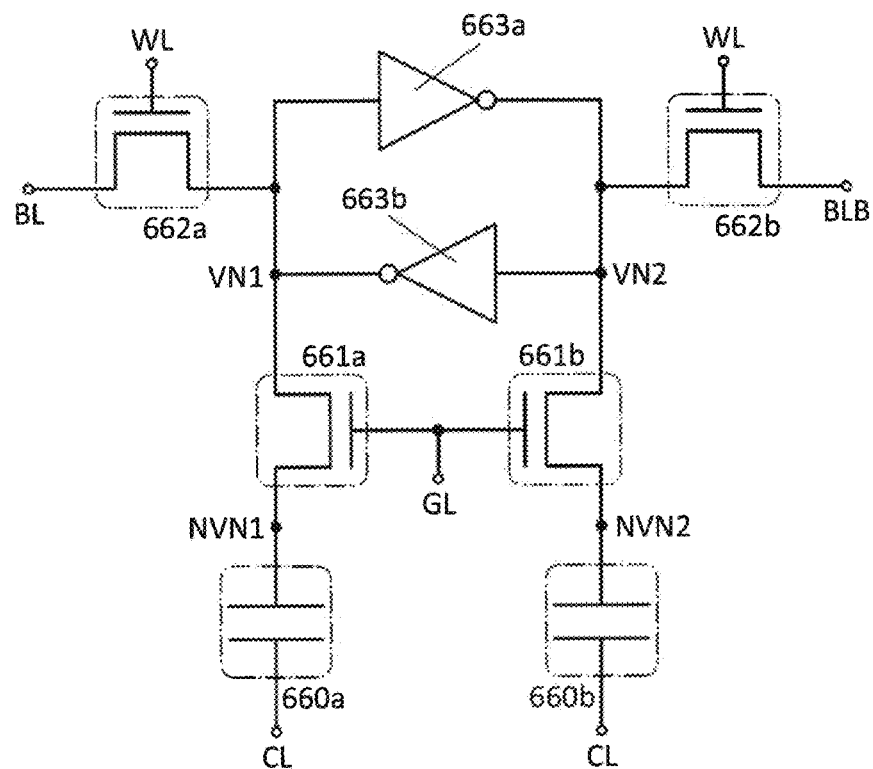
FIGS. 16A to 16C are circuit diagrams according to one embodiment of the present invention.
Figure 16B:
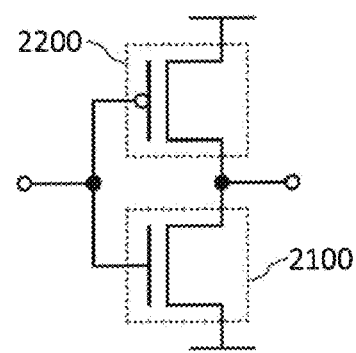

A circuit diagram in FIG. 16B shows a configuration of a CMOS circuit in which a p-channel transistor 2200 and an n-channel transistor 2100 are connected to each other in series and in which gates of them are connected to each other. The device 500 illustrated in FIG. 1A to FIG. 4 may include the circuit illustrated in FIG. 16B. In such a case, for example, it is preferable to provide the transistor 2200 in the layer 621, provide the transistor 2100 in the layer 622, and use a conductive layer provided in the layer 620 for the connection of source, drain, and gate electrodes of the transistors.

Figure 16C:
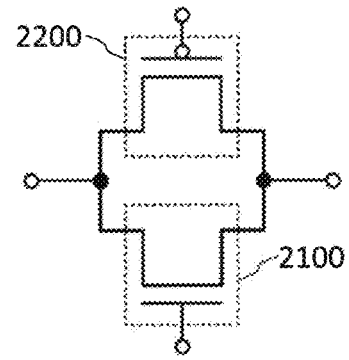
Figure 17A:
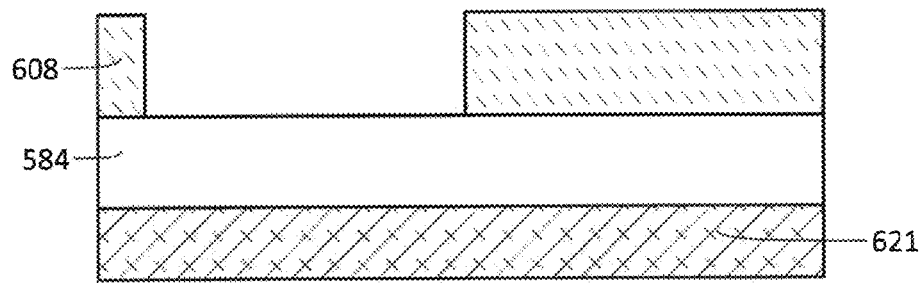
FIGS. 17A to 17E are cross-sectional views illustrating an example of a method for manufacturing a device of one embodiment of the present invention.
Figure 17B:
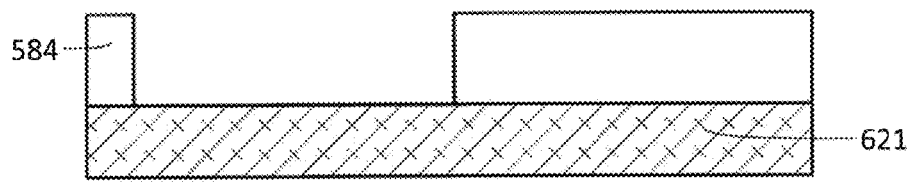
Figure 17C:
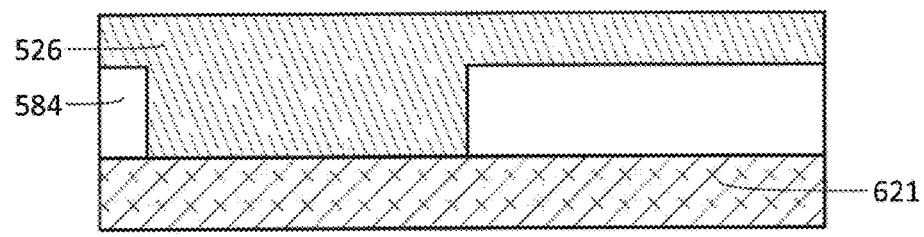
Figure 17D:
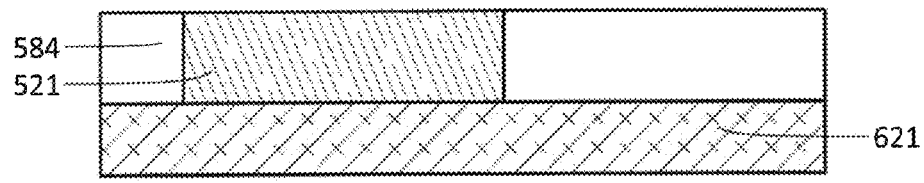
Figure 17E:
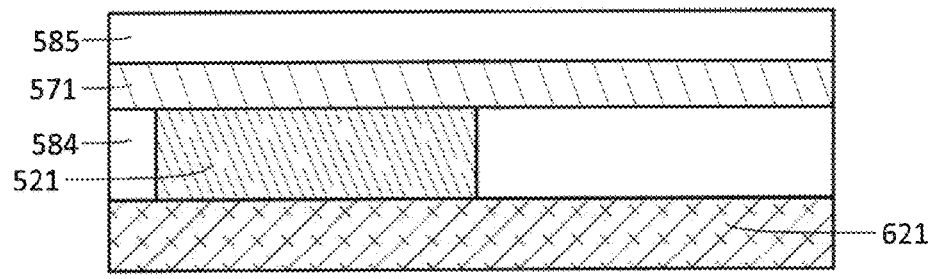

A circuit diagram in FIG. 16C shows a configuration in which sources of the transistors 2100 and 2200 are connected to each other and drains of the transistors 2100 and 2200 are connected to each other. With such a configuration, the transistors can function as an analog switch. The device 500 illustrated in FIG. 1A to FIG. 4 may include the circuit illustrated in FIG. 16C. In such a case, for example, it is preferable to provide the transistor 2200 in the layer 621, provide the transistor 2100 in the layer 622, and use a conductive layer provided in the layer 620 for the connection of source, drain, and gate electrodes of the transistors.

FIG. 16A illustrates an example of a circuit that can be used in the device of one embodiment of the present invention.

The circuit in FIG. 16A includes a capacitor 660a, a capacitor 660b, a transistor 661a, a transistor 661b, a transistor 662a, a transistor 662b, an inverter 663a, an inverter 663b, a wiring BL, a wiring BLB, a wiring WL, a wiring CL, and a wiring GL.

The circuit in FIG. 16A is a memory cell in which the inverter 663a and the inverter 663b are connected in a ring to form a flip-flop. A node to which an output signal of the inverter 663b is output is a node VN1, and a node to which an output signal of the inverter 663a is output is a node VN2. The memory cells are provided in a matrix, whereby a memory device (memory cell array) can be formed.

One of a source and a drain of the transistor 662a is electrically connected to the wiring BL, the other of the source and the drain thereof is electrically connected to the node VN1, and a gate thereof is electrically connected to the wiring WL. One of a source and a drain of the transistor 662b is electrically connected to the node VN2, the other of the source and the drain thereof is electrically connected to the wiring BLB, and a gate thereof is electrically connected to the wiring WL.

One of a source and a drain of the transistor 661a is electrically connected to the node VN1, the other of the source and the drain thereof is electrically connected to one of electrodes of the capacitor 660a, and a gate thereof is electrically connected to the wiring GL. A node between the other of the source and the drain of the transistor 661a and the one of electrodes of the capacitor 660a is a node NVN1. One of a source and a drain of the transistor 661b is electrically connected to the node VN2, the other of the source and the drain thereof is electrically connected to one of electrodes of the capacitor 660b, and a gate thereof is electrically connected to the wiring GL. A node between the other of the source and the drain of the transistor 661b and the one of electrodes of the capacitor 660b is a node NVN2.

The other of electrodes of the capacitor 660a is electrically connected to the wiring CL. The other of electrodes of the capacitor 660b is electrically connected to the wiring CL.

Conduction and non-conduction states of the transistor 662a and the transistor 662b can be controlled by a potential supplied to the wiring WL. Conduction and non-conduction states of the transistor 661a and the transistor 661b can be controlled by a potential supplied to the wiring GL.

Writing, retaining, and reading operation of the memory cell illustrated in FIG. 16A will be described below.

In the case where data is written, first, potentials corresponding to data 0 or data 1 are applied to the wiring BL and the wiring BLB.

For example, in the case where data 1 is to be written, a high-level power supply potential (VDD) is applied to the wiring BL and a ground potential is applied to the wiring BLB. Then, a potential (VH) higher than or equal to the sum of VDD and the threshold voltage of the transistors 662a and 662b is applied to the wiring WL.

Next, the potential of the wiring WL is set to be lower than the threshold voltage of the transistors 662a and 662b, whereby the data 1 written to the flip-flop is retained.

In the case where the data is read, first, the wiring BL and the wiring BLB are set to VDD in advance. Then, VH is applied to the wiring WL. Accordingly, the potential of the wiring BL remains VDD, but the potential of the wiring BLB is discharged through the transistor 662a and the inverter 663a to be a ground potential. The potential difference between the wiring BL and the wiring BLB is amplified by a sense amplifier (not illustrated), so that the retained data 1 can be read.

In the case where data 0 is to be written, the wiring BL is set to a ground potential and the wiring BLB is set to VDD; then, VH is applied to the wiring WL. Next, the potential of the wiring WL is set to be lower than the threshold voltage of the transistors 662a and 662b, whereby the data 0 written to the flip-flop is retained. In the case of data reading, the wiring BL and the wiring BLB are set to VDD in advance and VH is applied to the wiring WL, whereby the potential of the wiring BLB remains VDD but the potential of the wiring BL is discharged through the transistor 662b and the inverter 663b to be a ground potential. The potential difference between the wiring BL and the wiring BLB is amplified by the sense amplifier, so that the retained data 0 can be read.

Accordingly, the semiconductor device in FIG. 16A serves as a so-called static random access memory (SRAM). An SRAM does not require refresh operation because the SRAM retains data using a flip-flop. Therefore, power consumption in retaining data can be reduced. In addition, an SRAM does not require a capacitor in a flip-flop and is therefore suitable for applications where high speed operation is required.

In the semiconductor device in FIG. 16A, data of the node VN1 can be written to the node NVN1 through the transistor 661a. Similarly, data of the node VN2 can be written to the node NVN2 through the transistor 661b. The written data is retained by turning off the transistor 661a or the transistor 661b. For example, even in the case where supply of a power supply potential is stopped, data of the node VN1 and the node VN2 can be retained in some cases.

Unlike a conventional SRAM in which data is lost immediately after supply of a power supply potential is stopped, the semiconductor device in FIG. 16A can retain data even after supply of a power supply potential is stopped. Therefore, power consumption of the semiconductor device can be reduced by appropriately supplying or stopping a power supply potential. For example, the semiconductor device in FIG. 16A is used in a memory region of a CPU, whereby power consumption of the CPU can be reduced.

Note that the length of a period during which data is retained in the node NVN1 and the node NVN2 depends on the off-state current of the transistor 661a and the transistor 661b. Therefore, a transistor with small off-state current is preferably used as each of the transistor 661a and the transistor 661b in order to retain data for a long time. Alternatively, the capacitance of the capacitor 660a and the capacitor 660b is preferably increased.

For example, when the transistor 490 and the capacitor 150 are used as the transistor 661a and the capacitor 660a, data can be retained in the node NVN1 for a long time. Similarly, when the transistor 490 and the capacitor 150 are used as the transistor 661b and the capacitor 660b, data can be retained in the node NVN2 for a long time. Accordingly, the description of the transistor 490 is referred to for the transistor 661a and the transistor 661b. Furthermore, the description of the capacitor 150 is referred to for the capacitor 660a and the capacitor 660b.

The transistor 490 and the capacitor 150 can be formed to at least partly overlap with the transistor 491. The transistor 662a, the transistor 662b, a transistor included in the inverter 663a, and a transistor included in the inverter 663b in FIG. 16A can be formed to overlap with at least part of any of the transistor 661*a*, the transistor 661*b*, the capacitor 660*a*, and the capacitor 660*b*. Accordingly, the semiconductor device in FIG. 16A can be formed without a significant increase in an occupation area in some cases as compared to a conventional SRAM. The description of the transistor 491 is referred to for the transistor 662*a*, the transistor 662*b*, the transistor included in the inverter 663*a*, and the transistor included in the inverter 663*b*.

Here, for example, it is preferable in the device 500 to provide the transistor 491 in the layer 621, the transistor 490 in the layer 622, and a conductive layer that connects the transistor 491 to the transistor 490 in the layer 620.

Note that the connection between one of the source electrode and the drain electrode of the transistor 490 in the structures illustrated in FIG. 10 to FIG. 14, FIG. 21, FIG. 22, and FIG. 24 may be applied to the connection between the one of the source electrode and the drain electrode of the transistor 661*a* and the capacitor 660*a* in the circuit illustrated in FIG. 16A. Furthermore, the connection between the other of the source electrode and the drain electrode of the transistor 490 and the one of the source electrode and the drain electrode of the transistor 491 may be applied to the connection between the other of the source electrode and the drain electrode of the transistor 661*a* and the one of the source electrode and the drain electrode of the transistor 662*a* in the circuit illustrated in FIG. 16A.

Embodiment 2

In this embodiment, the structure of an oxide semiconductor will be described.

<Structure of Oxide Semiconductor>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS will be described.

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 33A:
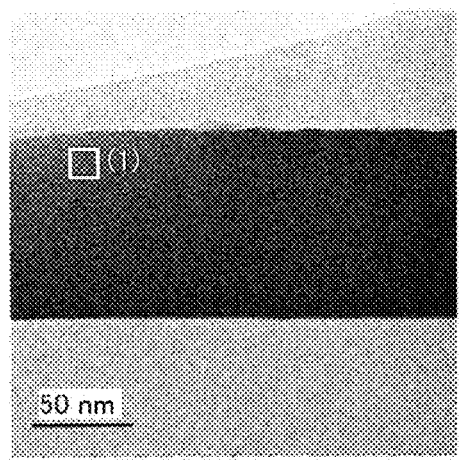
FIGS. 33A to 33D are Cs-corrected high-resolution TEM images of a cross section of a CAAC-OS and a schematic cross-sectional view of a CAAC-OS.

A CAAC-OS observed with TEM will be described below. FIG. 33A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 33B:
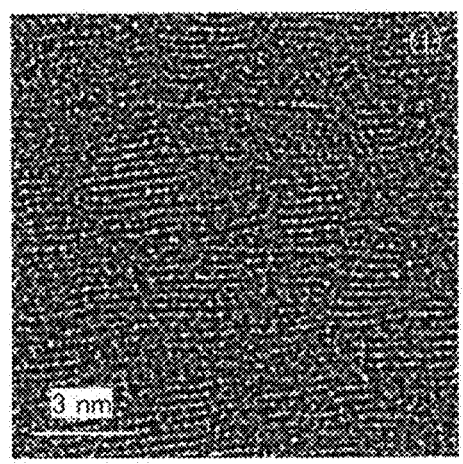

FIG. 33B is an enlarged Cs-corrected high-resolution TEM image of a region (1) in FIG. 33A. FIG. 33B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 33C:
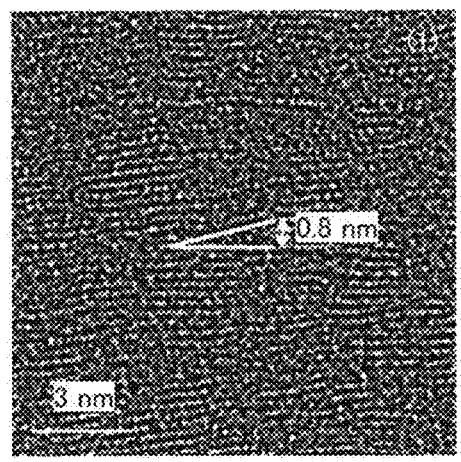

As shown in FIG. 33B, the CAAC-OS has a characteristic atomic arrangement. The characteristic atomic arrangement is denoted by an auxiliary line in FIG. 33C. FIGS. 33B and 33C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 33D:
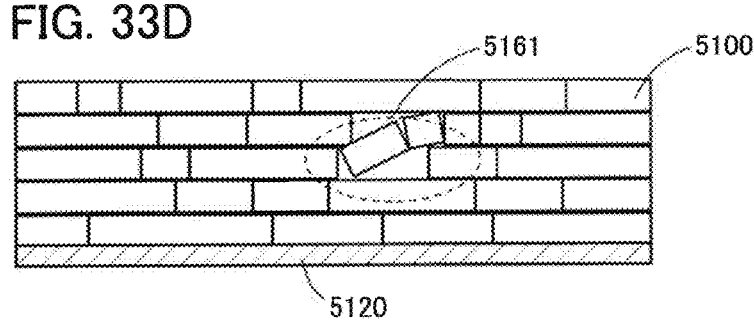

Here, according to the Cs-corrected high-resolution TEM images, the schematic arrangement of pellets 5100 of a CAAC-OS over a substrate 5120 is illustrated by such a structure in which bricks or blocks are stacked (see FIG. 33D). The part in which the pellets are tilted as observed in FIG. 33C corresponds to a region 5161 shown in FIG. 33D.

FIG. 34A shows a Cs-corrected high-resolution TEM image of a plane of the CAAC-OS observed from a direction substantially perpendicular to the sample surface. FIGS. 34B, 34C, and 34D are enlarged Cs-corrected high-resolution TEM images of regions (1), (2), and (3) in FIG. 34A, respectively. FIGS. 34B, 34C, and 34D indicate that metal atoms are arranged in a triangular, quadrangular, or hexagonal configuration in a pellet. However, there is no regularity of arrangement of metal atoms between different pellets.

Figure 35A:
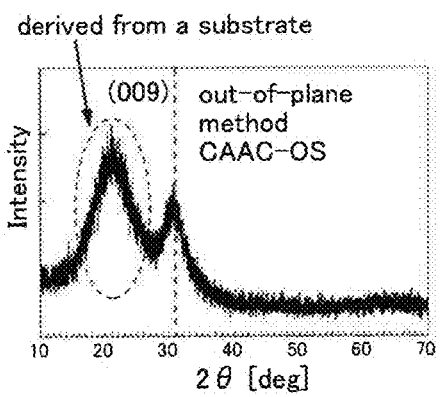
FIGS. 35A to 35C show structural analysis of a CAAC-OS and a single crystal oxide semiconductor by XRD.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle (2θ) of around 31° as shown in FIG. 35A. This peak is attributed to the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 35B:
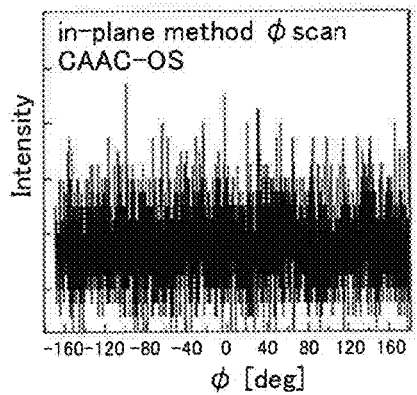
Figure 35C:
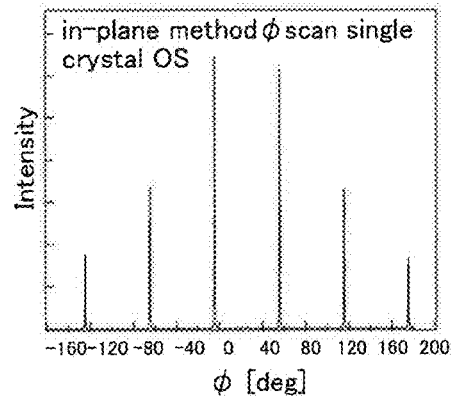

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 35B, a peak is not clearly observed. In contrast, in the case of a single crystal oxide semiconductor of InGaZnO$_4$, when φ scan is performed with 2θ fixed at around 56°, as shown in FIG. 35C, six peaks which are attributed to crystal planes equivalent to the (110) plane are observed. Accordingly, the structural analysis using XRD shows that the directions of a-axes and b-axes are irregularly oriented in the CAAC-OS.

Figure 36A:
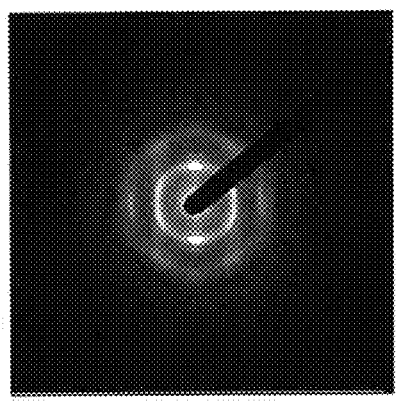
FIGS. 36A and 36B show electron diffraction patterns of a CAAC-OS.
Figure 36B:
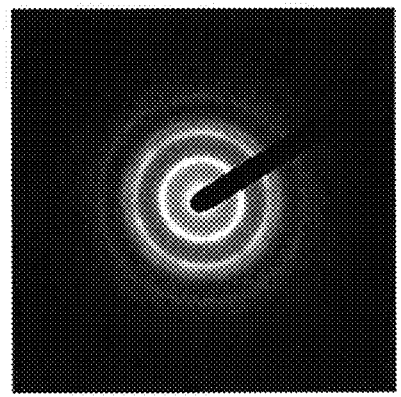

Next, a CAAC-OS analyzed by electron diffraction will be described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 36A can be obtained. In this diffraction pattern, spots attributed to the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 36B shows a diffraction pattern obtained in such a manner that an electron beam with a probe diameter of 300 nm is incident on the same sample in a direction perpendicular to the sample surface. As shown in FIG. 36B, a ring-like diffraction pattern is observed. Thus, the electron diffraction also indicates that the a-axes and b-axes of the pellets included in the CAAC-OS do not have regular alignment. The first ring in FIG. 36B is considered to be attributed to the (010) plane, the (100) plane, and the like of the InGaZnO$_4$ crystal. The second ring in FIG. 36B is considered to be attributed to the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density. Specifically, an oxide semiconductor with a carrier density of lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, bright regions in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 37:
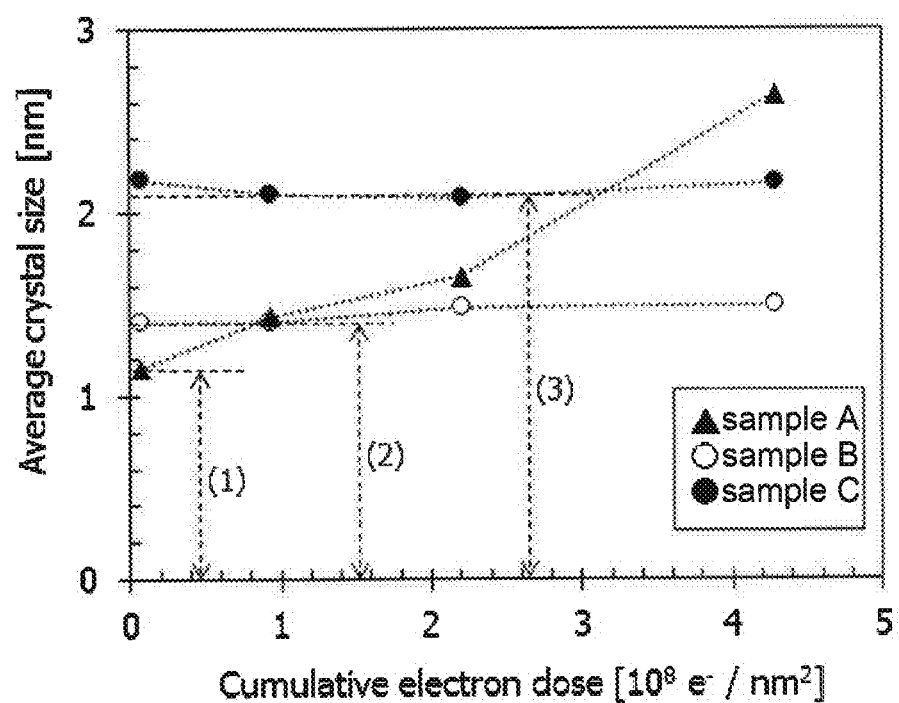
FIG. 37 shows a change in crystal part of an In—Ga—Zn oxide induced by electron irradiation.

FIG. 37 shows change in the average size of crystal parts (at 22 points to 45 points) in each sample. Note that the crystal part size corresponds to the length of a lattice fringe. FIG. 37 indicates that the crystal part size in the a-like OS increases with an increase in the cumulative electron dose. Specifically, as shown by (1) in FIG. 37, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 37, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

Embodiment 3

In this embodiment, a CPU in which at least the transistor described in the above embodiment can be used and the memory device described in the above embodiment is included is described.

Figure 38:
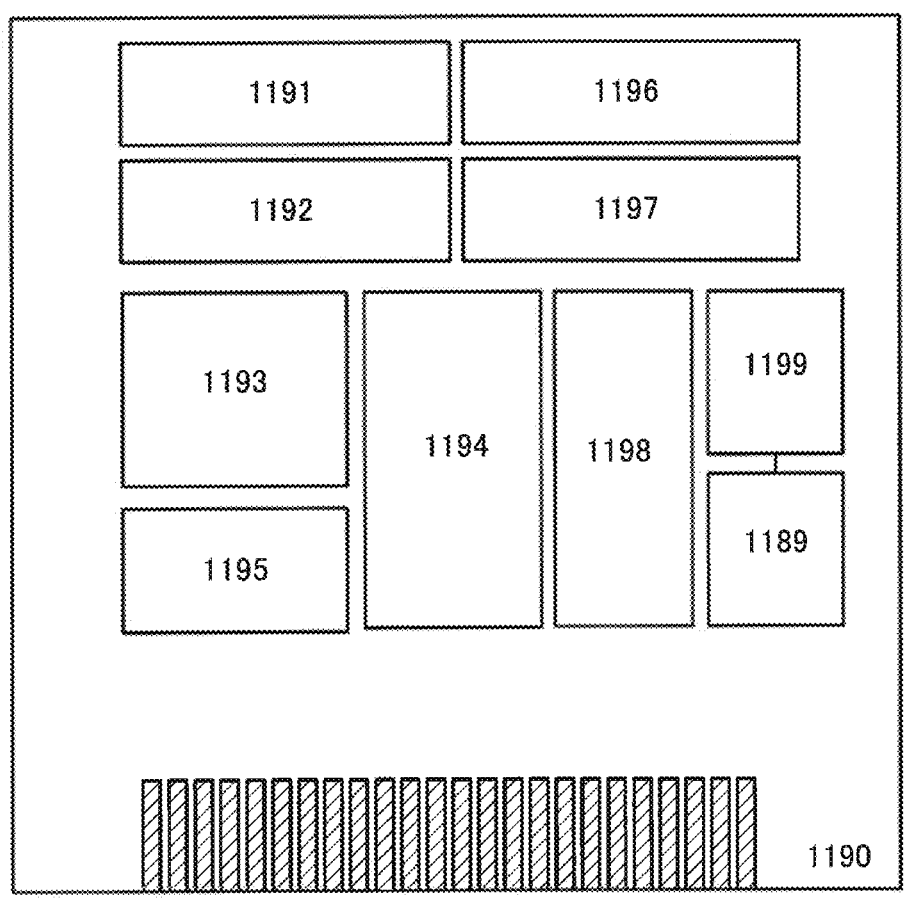
FIG. 38 illustrates a configuration example of a CPU of one embodiment.

FIG. 38 is a block diagram illustrating a configuration example of a CPU at least partly including the memory device described in the above embodiment as a component.

The CPU illustrated in FIG. 38 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 38 is just an example in which the configuration is simplified, and an actual CPU may have a variety of configurations depending on the application. For example, the CPU may have the following configuration: a structure including the CPU illustrated in FIG. 38 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 38, a memory cell is provided in the register 1196.

In the CPU illustrated in FIG. 38, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 39:
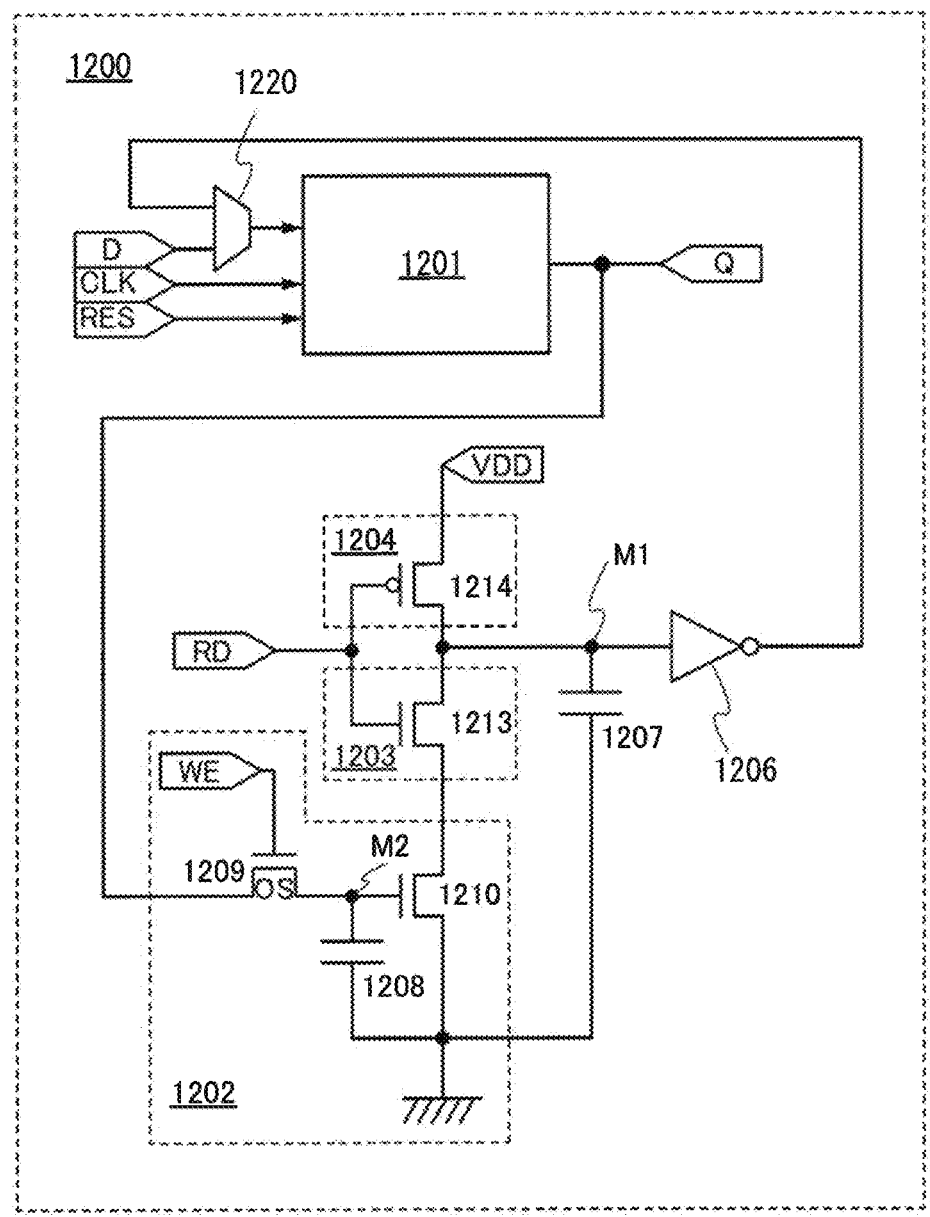
FIG. 39 is a circuit diagram of a memory element of one embodiment.

FIG. 39 is an example of a circuit diagram of a memory device that can be used for the register 1196. A memory device 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory device 1200 may further include another element such as a diode, a resistor, or an inductor, as needed. The transistor 1209 is preferably a transistor in which a channel is formed in an oxide semiconductor layer. For the transistor 1209, the transistor 490 described in the above embodiment can be referred to.

Here, the memory device described in the above embodiment can be used as the circuit 1202. When supply of a power supply voltage to the memory device 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Here, for example, the connection between the one of the source electrode and the drain electrode of the transistor 490 and the capacitor 150 in the structures illustrated in FIGS. 10 to 14, FIG. 21, FIG. 22, and FIG. 24 may be applied to the connection between one of a source electrode and a drain electrode of the transistor 1209 and the capacitor 1208 in the circuit in FIG. 39. Furthermore, the connection between the other of the source electrode and the drain electrode of the transistor 490 and the gate electrode of the transistor 491 may be applied to the connection between the one of the source electrode and the drain electrode of the transistor 1209 and the gate of the transistor 1210 in the circuit in FIG. 39.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 39 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 39, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 39, the transistors included in the memory device 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor layer can be used for all the transistors in the memory device 1200. Further alternatively, in the memory device 1200, a transistor in which a channel is formed in an oxide semiconductor layer can be included besides the transistor 1209, and a transistor in which a channel is formed in a layer formed using a semiconductor other than an oxide semiconductor or the substrate 1190 can be used for the rest of the transistors.

As the circuit 1201 in FIG. 39, for example, a flip-flop circuit can be used. As the logic element 1206, for example, an inverter or a clocked inverter can be used.

In a period during which the memory device 1200 is not supplied with the power supply voltage, the semiconductor device of one embodiment of the present invention can retain data stored in the circuit 1201 by the capacitor 1208 that is provided in the circuit 1202.

The off-state current of a transistor in which a channel is formed in an oxide semiconductor layer is extremely small. For example, the off-state current of a transistor in which a channel is formed in an oxide semiconductor layer is significantly smaller than that of a transistor in which a channel is formed in silicon having crystallinity. Thus, when the transistor is used as the transistor 1209, a signal is retained in the capacitor 1208 for a long time also in a period during which the power supply voltage is not supplied to the memory device 1200. The memory device 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory device 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 changes to some degree.

By using the above-described memory device 1200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory device 1200 is used in a CPU in this embodiment, the memory device 1200 can also be used in an LSI such as a digital signal processor (DSP), a custom LSI, or a programmable logic device (PLD), and a radio frequency identification (RF-ID).

At least part of this embodiment can be implemented in combination with any of the other embodiments described in this specification as appropriate.

Embodiment 4

In this embodiment, an RF tag that includes the memory device described in the above embodiment is described with reference to FIG. 40.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 40. FIG. 40 is a block diagram illustrating a configuration example of an RF tag.

Figure 40:
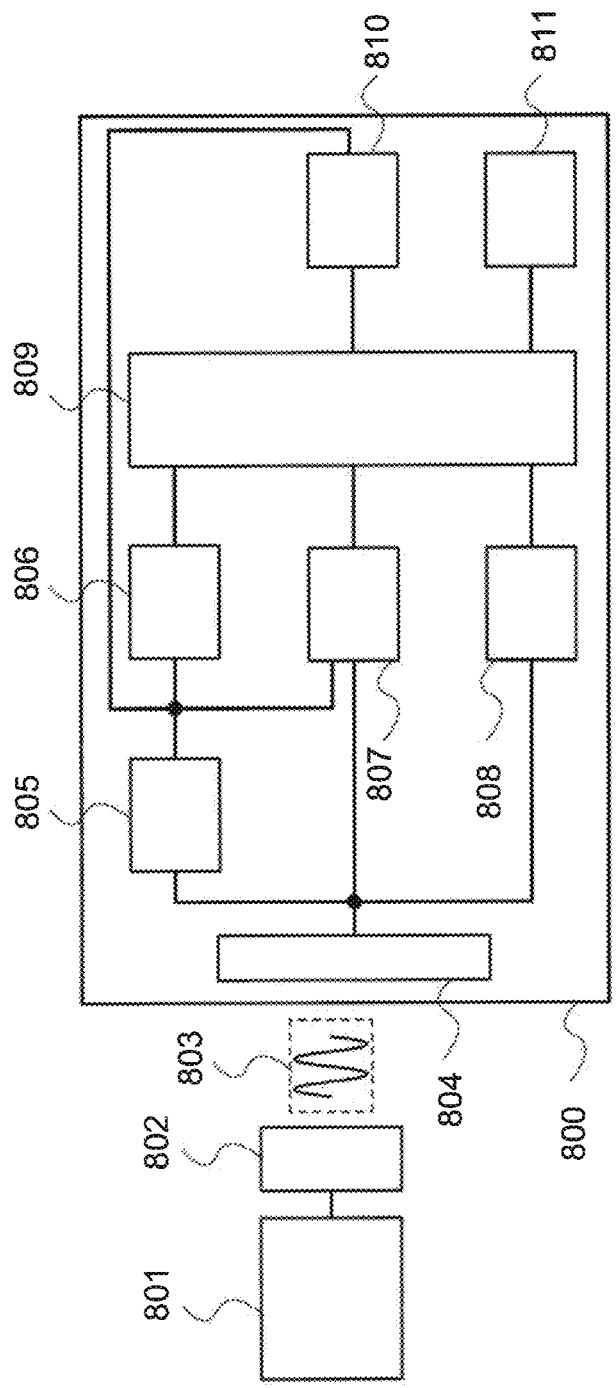
FIG. 40 illustrates a configuration example of an RF tag of one embodiment.

As shown in FIG. 40, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory device described in the above embodiment can be used as the memory circuit 810. When the memory device described in the above embodiment is used as the memory circuit 810, data retention is possible even when power is not supplied; accordingly, the memory circuit can be favorably used for an RF tag. Furthermore, the memory device of one embodiment of the present invention needs power (voltage) for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management for the shipped products is easily performed.

At least part of this embodiment can be implemented in combination with any of the other embodiments described in this specification as appropriate.

Embodiment 5

In this embodiment, application examples of an RF tag of one embodiment of the present invention are described with reference to FIGS. 41A to 41F. The RF tag is widely used and can be provided for, for example, products such as bills, coins, securities, bearer bonds, documents (e.g., driver's licenses or residence cards, see FIG. 41A), recording media (e.g., DVDs or video tapes, see FIG. 41B), packaging containers (e.g., wrapping paper or bottles, see FIG. 41C), vehicles (e.g., bicycles, see FIG. 41D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 41E and 41F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting.

Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RF tag can be preferably used for application in which data is not frequently written or read.

At least part of this embodiment can be implemented in combination with any of the other embodiments described in this specification as appropriate.

Embodiment 6

In this embodiment, a structure example of a display panel of one embodiment of the present invention is described.

[Structure Example]

Figure 42A:
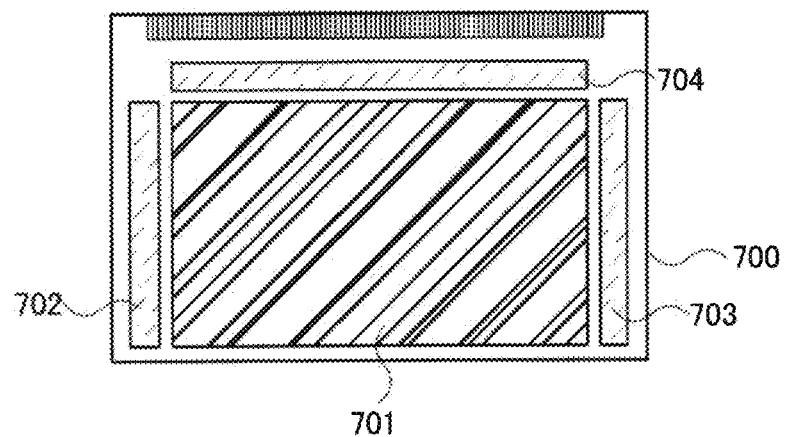
FIGS. 42A to 42C are a top view and circuit diagrams of a display device of one embodiment.
Figure 42B:
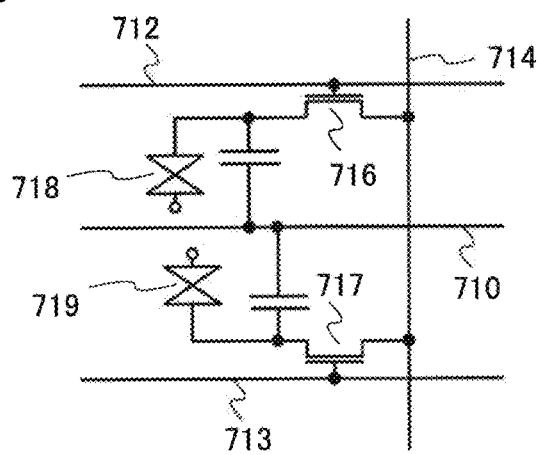
Figure 42C:
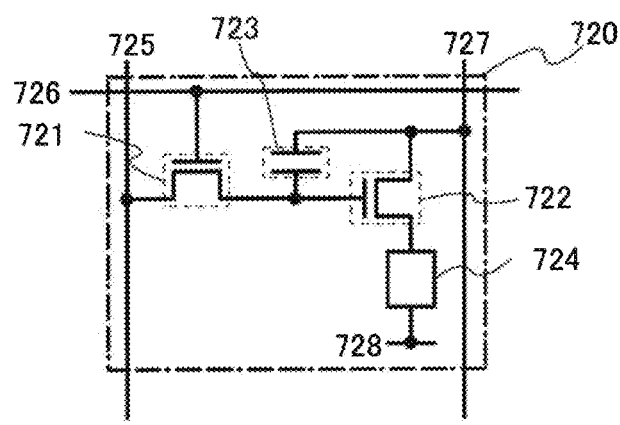

FIG. 42A is a top view of the display panel of one embodiment of the present invention. FIG. 42B is a circuit diagram illustrating a pixel circuit that can be used in the case where a liquid crystal element is used in a pixel in the display panel of one embodiment of the present invention. FIG. 42C is a circuit diagram illustrating a pixel circuit that can be used in the case where an organic EL element is used in a pixel in the display panel of one embodiment of the present invention.

The transistor in the pixel portion can be formed in accordance with the above embodiment. For example, the transistor 490 described in the above embodiment can be referred to. The transistor can be easily formed as an n-channel transistor, and thus part of a driver circuit that can be formed using an n-channel transistor can be formed over the same substrate as the transistor of the pixel portion. With the use of any of the transistors described in the above embodiment for the pixel portion or the driver circuit in this manner, a highly reliable display device can be provided.

The transistor in the pixel portion of the display panel and part of a driver circuit that can be formed using an n-channel transistor are preferably provided in the layer 622 described in the above embodiment. In that case, for example, some transistors in the driver circuit may be provided in the layer 621 described in the above embodiment. Furthermore, for example, the driver circuit portion and the pixel portion may be electrically connected to each other through a wiring provided in the layer 620 described in the above embodiment.

FIG. 42A illustrates an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels that include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 42A, the first scan line driver circuit 702, the second scan line driver circuit 703, and the signal line driver circuit 704 are formed over the substrate 700 where the pixel portion 701 is formed. Consequently, the number of components provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.
[Liquid Crystal Panel]

FIG. 42B illustrates an example of a circuit configuration of the pixel. Here, a pixel circuit that can be used in a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that functions as a data line is shared by the transistors 716 and 717. The transistor 490 described the above embodiment can be used as appropriate as each of the transistors 716 and 717. Thus, a highly reliable liquid crystal display panel can be provided.

A first pixel electrode layer is electrically connected to the transistor 716 and a second pixel electrode layer is electrically connected to the transistor 717. The first pixel electrode layer and the second pixel electrode layer are separated. Shapes of the first pixel electrode layer and the second pixel electrode layer are not particularly limited. For example, the first pixel electrode layer may have a V-like shape.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

In addition, a storage capacitor may be formed using a capacitor wiring 710, a gate insulating film functioning as a dielectric, and a capacitor electrode electrically connected to the first pixel electrode layer or the second pixel electrode layer.

The multi-domain structure includes a first liquid crystal element 718 and a second liquid crystal element 719 in one pixel. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit is not limited to that shown in FIG. 42B. For example, a switch, a resistor, a capacitor, a transistor, a sensor, a logic circuit, or the like may be added to the pixel shown in FIG. 42B.
[Organic EL Panel]

FIG. 42C shows another example of a circuit configuration of the pixel. Here, a pixel structure of a display panel using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. On the basis of such a mechanism, this light-emitting element is referred to as a current-excitation light-emitting element.

FIG. 42C shows an example of a pixel circuit that can be used. In this example, one pixel includes two n-channel transistors. Note that a metal oxide film of one embodiment of the present invention can be used for channel formation regions of the n-channel transistors. Digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistor 490 described in the above embodiment can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage that is the sum of power supply line voltage and the threshold voltage $V_{th}$ of the driver transistor 722 is applied to the signal line 725.

In the case of performing analog grayscale driving, voltage greater than or equal to voltage that is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit is not limited to that shown in FIG. 42C. For example, a switch, a resistor, a capacitor, a sensor, a transistor, a logic circuit, or the like may be added to the pixel circuit shown in FIG. 42C.

In the case where any of the transistors described in the above embodiment is used for the circuit shown in FIGS. 42A to 42C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electronluminescence (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on current), an electron emitter, a liquid crystal element, electronic ink, an electrophoretic element, a plasma display panel (PDP), a display element using micro electro mechanical system (MEMS) (e.g., a grating light valve (GLV), a digital micromirror device (DMD), a digital micro shutter (DMS), an interferometric modulator display (IMOD) element, a MEMS shutter display element, an optical-interference-type MEMS display element, and a piezoelectric ceramic display), an electrowetting element, a quantum dot, and a display element including a carbon nanotube. Other than the above, a display medium whose contrast, luminance, reflectance, transmittance, or the like is changed by electrical or magnetic action may be included. Examples of a display device having an EL element include an EL display. Examples of a display device having an electron emitter include a field emission display (FED) and a surface-conduction electron-emitter display (SED)-type flat panel display. Examples of a display device using a quantum dot in each pixel include a quantum dot display. Note that a quantum dot may be provided not as a display element but in part of a backlight. The usage of the quantum dot leads to display with high color purity. Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED chip, graphene or graphite may be provided under an electrode or a nitride semiconductor of the LED chip. Graphene or graphite may be a multilayer film in which a plurality of layers are stacked. The provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when graphene is provided, the GaN semiconductor layers included in the LED chip can also be formed by a sputtering method. In a display element using MEMS, a drying agent may be provided in a space where the display element is provided (e.g., a space between an element substrate where the display element is provided and a counter substrate positioned on the side opposite to the element substrate). The drying agent can prevent moisture from making operation of the MEMS or the like difficult and from promoting deterioration.

Note that in this specification and the like, a transistor can be formed using any of a variety of substrates, for example. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. Examples of a glass substrate include a barium borosilicate glass substrate, an alumino-borosilicate glass substrate, and soda lime glass substrate. Examples of the flexible substrate, the attachment film, the base material film, and the like are substrates of plastics typified by polyethylene terephthalate (PET), polyethylene naphthalate (PEN), and polyether sulfone (PES). Another example is a synthetic resin such as acrylic. Furthermore, polypropylene, polyester, polyvinyl fluoride, and polyvinyl chloride can be given as examples. Furthermore, polyamide, polyimide, aramid, epoxy, an inorganic vapor deposition film, and paper can be given as examples. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and the transistor may be provided directly on the flexible substrate. Alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above substrate over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

At least part of this embodiment can be implemented in combination with any of the other embodiments described in this specification as appropriate.

Embodiment 7

The device of one embodiment of the present invention can be used for display devices, personal computers, or image reproducing devices provided with recording media (typically, devices that reproduce the content of recording media such as digital versatile discs (DVDs) and have displays for displaying the reproduced images. Other examples of electronic devices that can be equipped with the device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 43A to 43F illustrate specific examples of these electronic devices.

Figure 43A:
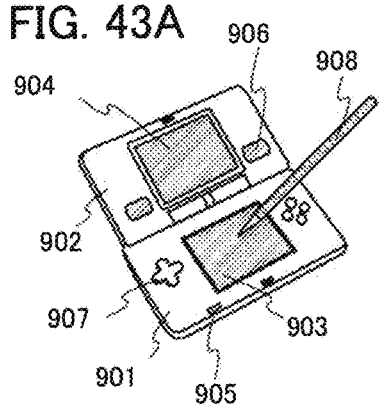
FIGS. 43A to 43F each illustrate an electronic device of an embodiment.

FIG. 43A illustrates a portable game machine, which includes a housing 901, a housing 902, a display portion 903, a display portion 904, a microphone 905, a speaker 906, an operation key 907, a stylus 908, and the like. Although the portable game machine in FIG. 43A has the two display portions 903 and 904, the number of display portions included in a portable game machine is not limited to this.

Figure 43B:
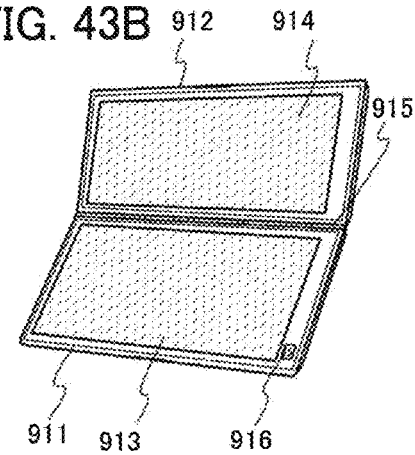

FIG. 43B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. Images displayed on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 43C:
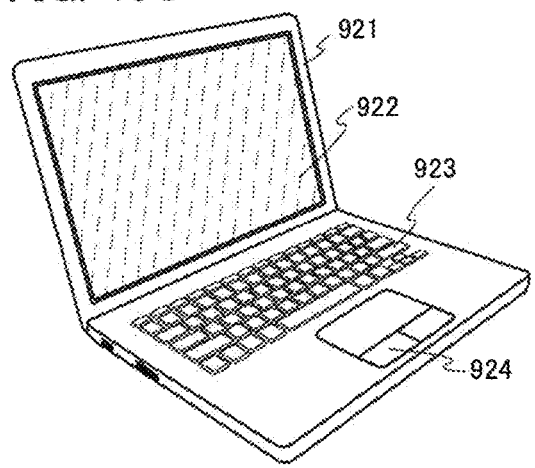

FIG. 43C illustrates a laptop personal computer, which includes a housing 921, a display portion 922, a keyboard 923, a pointing device 924, and the like.

Figure 43D:
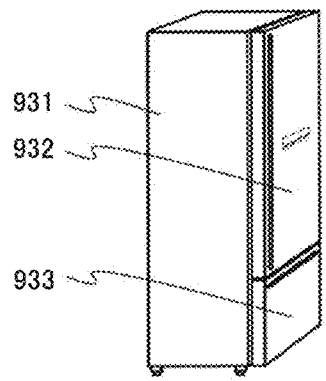

FIG. 43D illustrates an electric refrigerator-freezer, which includes a housing 931, a refrigerator door 932, a freezer door 933, and the like.

Figure 43E:
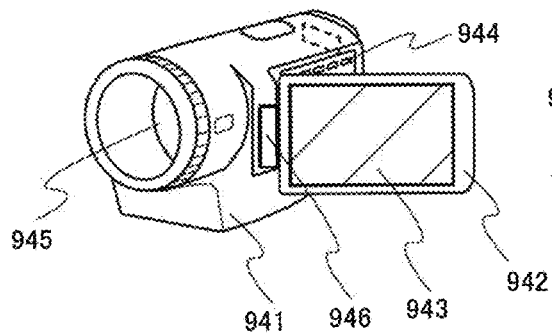

FIG. 43E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 43F:
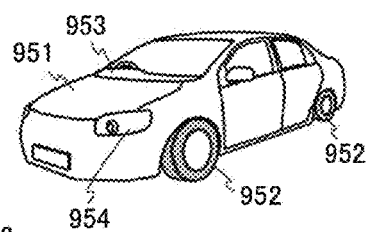

FIG. 43F illustrates a car, which includes a car body 951, wheels 952, a dashboard 953, lights 954, and the like.

At least part of this embodiment can be implemented in combination with any of the other embodiments described in this specification as appropriate.

Embodiment 8

<Imaging Device>

An imaging device of one embodiment of the present invention is described below.

Figure 44A:
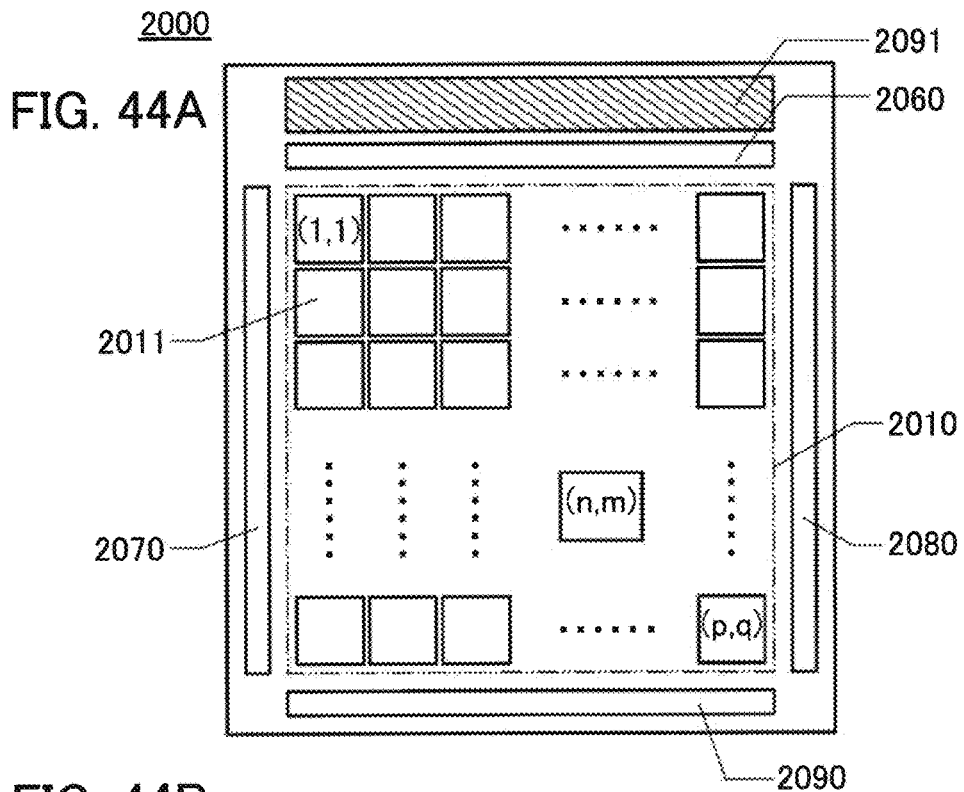
FIGS. 44A and 44B are top views each illustrating a device of one embodiment of the present invention.

FIG. 44A is a plan view illustrating an example of an imaging device 2000 of one embodiment of the present invention. The imaging device 2000 includes a pixel portion 2010 and peripheral circuits for driving the pixel portion 2010 (a peripheral circuit 2060, a peripheral circuit 2070, a peripheral circuit 2080, and a peripheral circuit 2090). The pixel portion 2010 includes a plurality of pixels 2011 arranged in a matrix with p rows and q columns (p and q are each a natural number greater than or equal to 2). The peripheral circuit 2060, the peripheral circuit 2070, the peripheral circuit 2080, and the peripheral circuit 2090 are each connected to a plurality of pixels 2011, and a signal for driving the plurality of pixels 2011 is supplied. In this specification and the like, in some cases, "a peripheral circuit" or "a driver circuit" indicates all of the peripheral circuits 2060, 2070, 2080, and 2090. For example, the peripheral circuit 2060 can be regarded as part of the peripheral circuit.

The imaging device 2000 preferably includes a light source 2091. The light source 2091 can emit detection light P1.

The peripheral circuit includes at least one of a logic circuit, a switch, a buffer, an amplifier circuit, and a converter circuit. The peripheral circuit may be provided over a substrate where the pixel portion 2010 is formed. Part or the whole of the peripheral circuit may be mounted using a semiconductor device such as an IC. Note that as the peripheral circuit, one or more of the peripheral circuits 2060, 2070, 2080, and 2090 may be omitted.

Figure 44B:
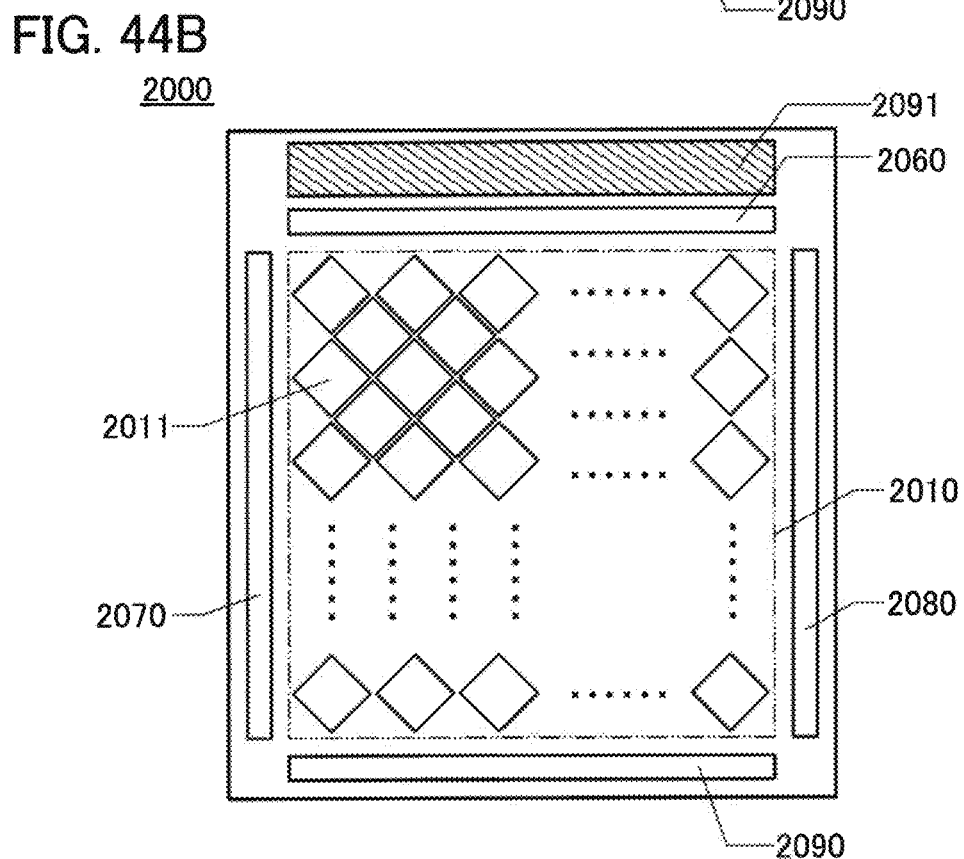

As illustrated in FIG. 44B, the pixels 2011 may be provided to be inclined in the pixel portion 2010 included in the imaging device 2000. When the pixels 2011 are obliquely arranged, the distance between pixels (pitch) can be shortened in the row direction and the column direction. Accordingly, the quality of an image taken with the imaging device 2000 can be improved.

<Configuration Example of Pixel>

The pixel 2011 included in the imaging device 2000 is formed with a plurality of subpixels 2012, and each subpixel 2012 is combined with a filter which transmits light with a specific wavelength band (color filter), whereby data for achieving color image display can be obtained.

Figure 45A:
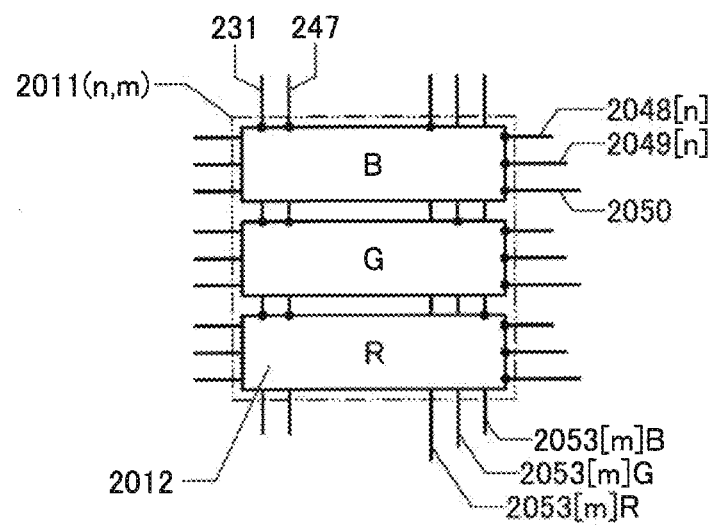
FIGS. 45A and 45B are block diagrams each illustrating a device of one embodiment of the present invention.

FIG. 45A is a plan view showing an example of the pixel 2011 with which a color image is obtained. The pixel 2011 illustrated in FIG. 45A includes a subpixel 2012 provided with a color filter transmitting light with a red (R) wavelength band (also referred to as a subpixel 2012R), a subpixel 2012 provided with a color filter transmitting light with a green (G) wavelength band (also referred to as a subpixel 2012G), and a subpixel 2012 provided with a color filter transmitting light with a blue (B) wavelength band (also referred to as a subpixel 2012B). The subpixel 2012 can function as a photosensor.

The subpixel 2012 (the subpixel 2012R, the subpixel 2012G, and the subpixel 2012B) is electrically connected to a wiring 2031, a wiring 2047, a wiring 2048, a wiring 2049, and a wiring 2050. In addition, the subpixel 2012R, the subpixel 2012G, and the subpixel 2012B are connected to respective wirings 2053 which are independent from one another. In this specification and the like, for example, the wiring 2048 and the wiring 2049 that are connected to the pixel 2011 in the n-th row (n is an integer greater than or equal to 1 and less than or equal top) are referred to as a wiring 2048[n] and a wiring 2049[n]. For example, the wiring 2053 connected to the pixel 2011 in the m-th column (m is an integer greater than or equal to 1 and less than or equal to q) is referred to as a wiring 2053[m]. Note that in FIG. 45A, the wirings 2053 connected to the subpixel 2012R, the subpixel 2012G, and the subpixel 2012B in the pixel 2011 in the m-th column are referred to as a wiring 2053[m]R, a wiring 2053[m]G, and a wiring 2053[m]B. The subpixels 2012 are electrically connected to the peripheral circuit through the above wirings.

Figure 45B:
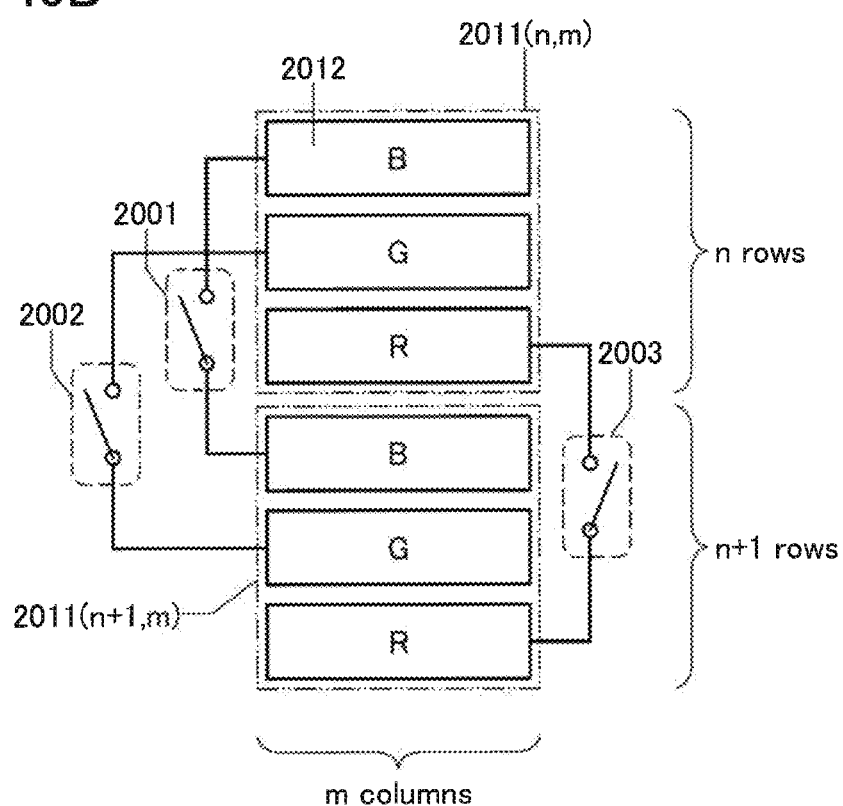

The imaging device 2000 has a structure in which the subpixel 2012 is electrically connected to the subpixel 2012 in an adjacent pixel 2011 which is provided with a color filter transmitting light with the same wavelength band as the subpixel 2012, via a switch. FIG. 45B shows a connection example of the subpixels 2012: the subpixel 2012 in the pixel 2011 arranged in an n-th row and an m-th column and the subpixel 2012 in the adjacent pixel 2011 arranged in an (n+1)-th row and the m-th column. In FIG. 45B, the subpixel 2012R arranged in the n-th row and the m-th column and the subpixel 2012R arranged in the (n+1)-th row and the m-th column are connected to each other via a switch 2001. The subpixel 2012G arranged in the n-th row and the m-th column and the subpixel 2012G arranged in the (n+1)-th row and the m-th column are connected to each other via a switch 2002. The subpixel 2012B arranged in the n-th row and the m-th column and the subpixel 2012B arranged in the (n+1)-th row and the m-th column are connected to each other via a switch 2003.

The color filter used in the subpixel 2012 is not limited to red (R), green (G), and blue (B) color filters, and color filters that transmit light of cyan (C), yellow (Y), and magenta (M) may be used. By provision of the subpixels 2012 that sense light with three different wavelength bands in one pixel 2011, a full-color image can be obtained.

The pixel 2011 including the subpixel 2012 provided with a color filter transmitting yellow (Y) light may be provided, in addition to the subpixels 2012 provided with the color filters transmitting red (R), green (G), and blue (B) light. The pixel 2011 including the subpixel 2012 provided with a color filter transmitting blue (B) light may be provided, in addition to the subpixels 2012 provided with the color filters transmitting cyan (C), yellow (Y), and magenta (M) light. When the subpixels 2012 sensing light with four different wavelength bands are provided in one pixel 2011, the reproducibility of colors of an obtained image can be increased.

For example, in FIG. 45A, in regard to the subpixel 2012 sensing a red wavelength band, the subpixel 2012 sensing a green wavelength band, and the subpixel 2012 sensing a blue wavelength band, the pixel number ratio (or the light receiving area ratio) thereof is not necessarily 1:1:1. For example, the Bayer arrangement in which the pixel number ratio (the light receiving area ratio) is set at red:green:

blue=1:2:1 may be employed. Alternatively, the pixel number ratio (the light receiving area ratio) of red and green to blue may be 1:6:1.

Although the number of subpixels 2012 provided in the pixel 2011 may be one, two or more subpixels are preferably provided. For example, when two or more subpixels 2012 sensing the same wavelength band are provided, the redundancy is increased, and the reliability of the imaging device 2000 can be increased.

When an infrared (IR) filter that transmits infrared light and absorbs or reflects visible light is used, the imaging device 2000 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 2011 may be provided with a lens. An arrangement example of the pixel 2011, a filter 2054, and a lens 2055 is described with cross-sectional views in FIGS. 46A and 46B. With the lens 2055, the photoelectric conversion element can receive incident light efficiently. Specifically, as illustrated in FIG. 46A, light 2056 enters a photoelectric conversion element 2020 through the lens 2055, the filter 2054 (a filter 2054R, a filter 2054G, and a filter 2054B), a pixel circuit 2030, and the like which are provided in the pixel 2011.

However, as indicated by a region surrounded with dashed-dotted lines, part of the light 2056 indicated by arrows might be blocked by some wirings 2057. Thus, a preferable structure is that the lens 2055 and the filter 2054 are provided on the photoelectric conversion element 2020 side, so that the photoelectric conversion element 2020 can efficiently receive the light 2056 as illustrated in FIG. 46B. When the light 2056 enters the photoelectric conversion element 2020 from the photoelectric conversion element 2020 side, the imaging device 2000 with high sensitivity can be provided.

Figure 46A:
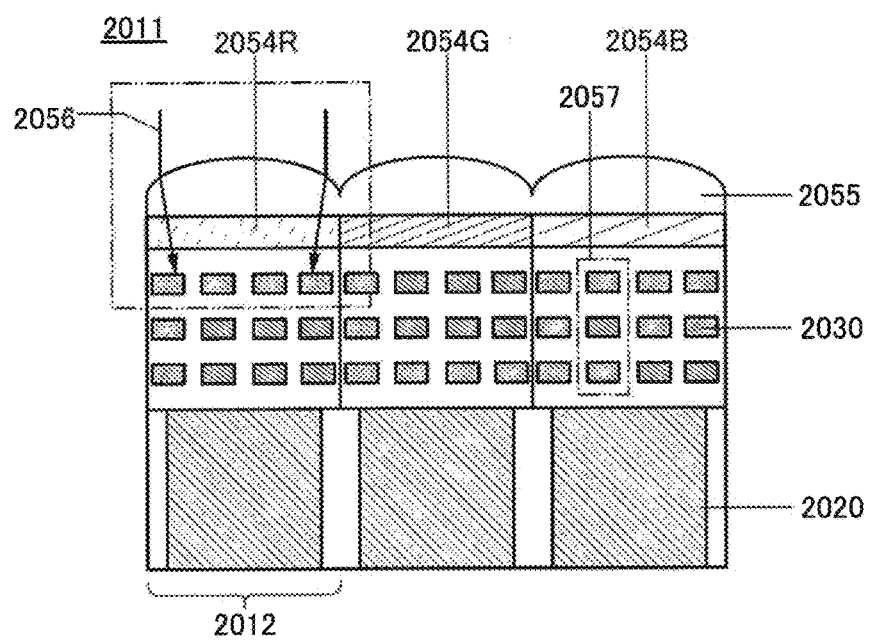
FIGS. 46A and 46B are cross-sectional views each illustrating a device of one embodiment of the present invention.
Figure 46B:
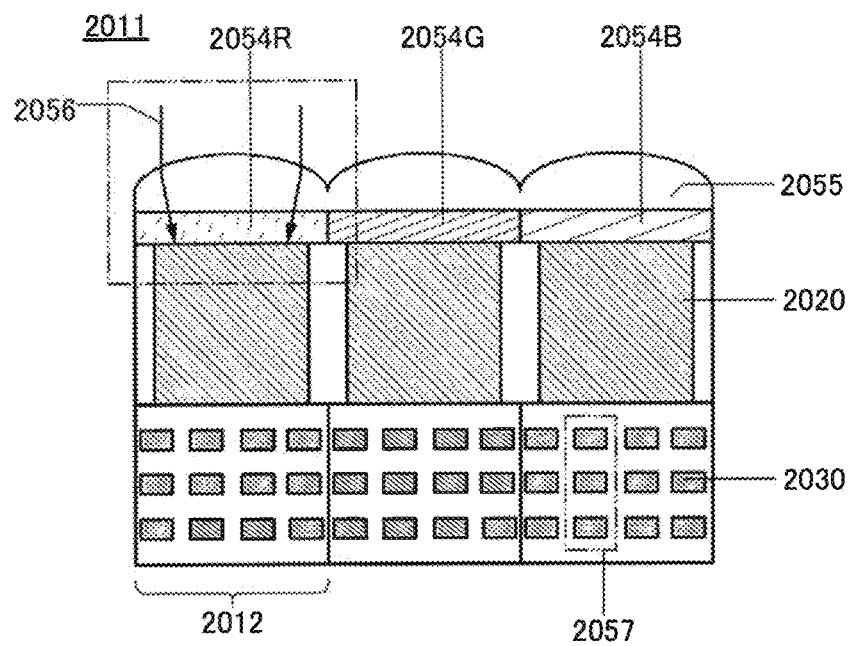

As the photoelectric conversion element 2020 illustrated in FIGS. 46A and 46B, a photoelectric conversion element in which a p-n junction or a p-i-n junction is formed may be used.

The photoelectric conversion element 2020 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 2020, the photoelectric conversion element 2020 can have a light absorption coefficient in a wide wavelength range, such as visible light, ultraviolet light, infrared light, X-rays, and gamma rays.

One pixel 2011 included in the imaging device 2000 may include the subpixel 2012 with a first filter in addition to the subpixel 2012 illustrated in FIGS. 45A and 45B.

<Structure Example of Imaging Device>

Figure 47:
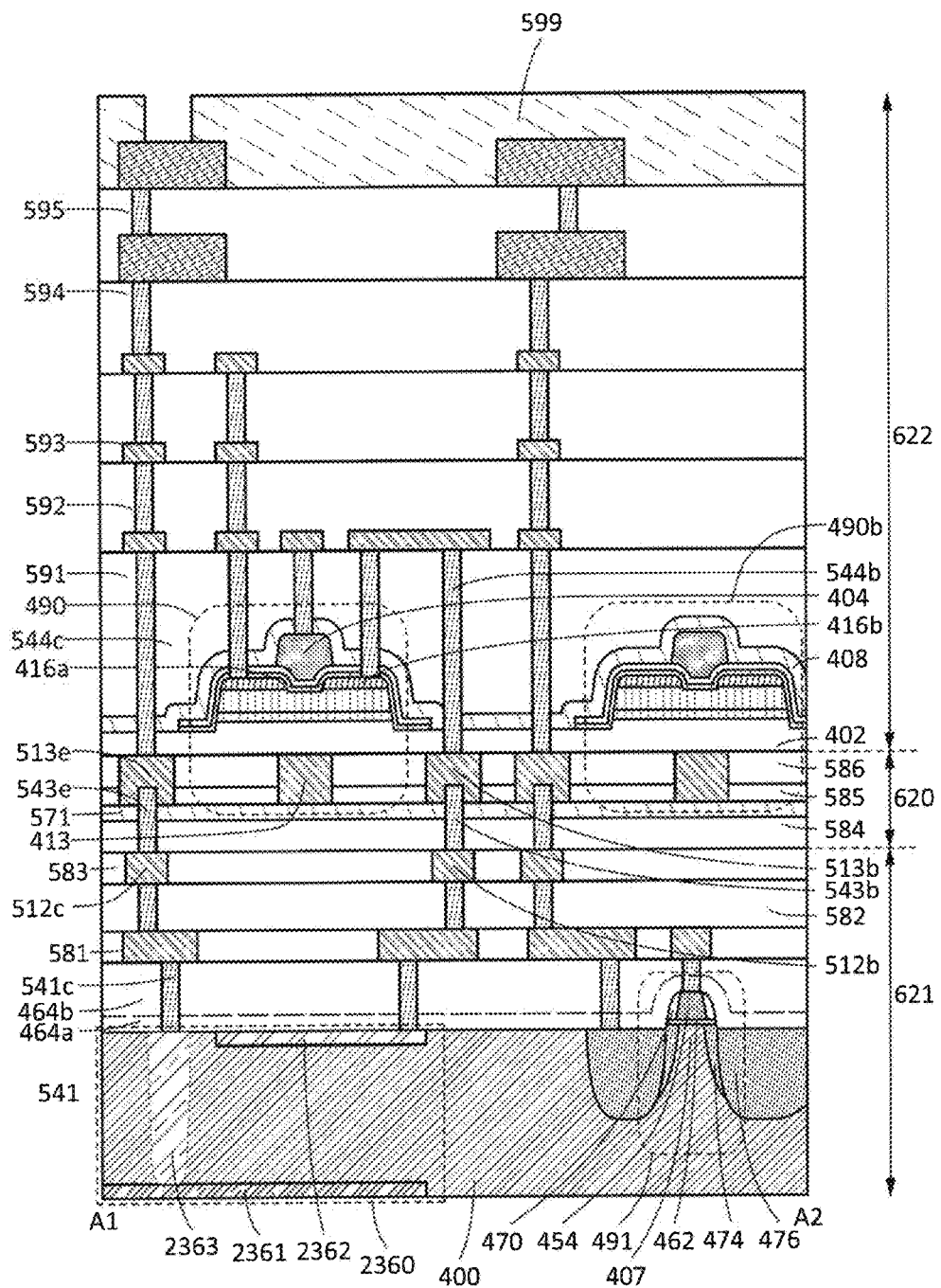
FIG. 47 is a cross-sectional view illustrating a device of one embodiment of the present invention.

FIG. 47 is a cross-sectional view of an element included in an imaging device. The imaging device illustrated in FIG. 47 includes the layer 621, the layer 620 over the layer 621, and the layer 622 over the layer 620. The layer 621 includes the transistor 491 provided over the substrate 400 and a photodiode 2360 formed with the substrate 400. The layer 622 includes the transistor 490 and a transistor 490b. For the transistor 490b, the description of the transistor 490 can be referred to.

The photodiode 2360 included in the imaging device includes an electrode 2361, an electrode 2362, and a semiconductor layer sandwiched between the two electrodes. The electrode 2362 is connected to the conductive layer 543b included in the layer 620 through a conductive layer 512b or the like included in the layer 621. The conductive layer 513b is in contact with at least part of top and side surfaces of the projection portion of the conductive layer 543b. The conductive layer 513b is connected to the conductive layer 416b included in the transistor 490 through a conductive layer 544b or the like included in the layer 622. Part of the conductive layer 513b is preferably in contact with the top surface of the insulating film 571.

The electrode 2361 is connected to a conductive layer 541c provided over a low-resistance layer 2363 through the low-resistance layer 2363 and also connected to a conductive layer 543e included in the layer 620 through other wiring layers such as a conductive layer 512c included in the layer 621. The conductive layer 513e is in contact with at least part of top and side surfaces of a projection portion of the conductive layer 543e. The conductive layer 513e is connected to, for example, other wiring layers included in the layer 622 through a conductive layer 544c or the like included in the layer 622. Part of the conductive layer 513e is preferably in contact with the top surface of the insulating film 571.

For the conductive layer 513b and 513e, the description of the conductive layer 513 can be referred to. For the conductive layers 543b and 543e, the description of the conductive layer 543 can be referred to.

In the example of cross-sectional view in FIG. 47, a light-receiving surface of the photodiode 2360 is positioned on the side opposite to a surface of the substrate 400 where the transistor 491 is provided. This structure can ensure the light path without the influences of various transistors, wirings, and the like. Thus, a pixel with a high aperture ratio can be formed. Note that the light-receiving surface of the photodiode 2360 can be positioned on the same side as the surface where the transistor 491 is formed.

At least part of this embodiment can be implemented in combination with any of the embodiments described in this specification as appropriate.

(Supplementary Notes on the Description in this Specification and the Like)

The following are notes on the description of the above embodiments and structures in the embodiments.

One embodiment of the present invention can be constituted by appropriately combining the structure described in an embodiment with any of the structures described the other embodiments. In addition, in the case where a plurality of structure examples are described in one embodiment, some of the structure examples can be combined as appropriate.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

In each Embodiment, one embodiment of the present invention has been described; however, one embodiment of the present invention is not limited to the described embodiments. The example where OS transistors are used as transistors having low off-state current is described in Embodiment 1 as one embodiment of the present invention; however, one embodiment of the present invention is not limited to using OS transistors as long as transistors having low off-state current are used. Therefore, depending on conditions, a structure without OS transistors may be one embodiment of the present invention.

Notes on the Description for Drawings

In this specification and the like, terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, the segmentation of blocks in the block diagram is not limited by the components described in the specification, and can be differently determined as appropriate depending on situations.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as plan views (also referred to as layout views) and perspective views, some of components might not be illustrated for clarity of the drawings.
<Notes on Expressions that can be Rephrased>

In this specification or the like, in description of connections of a transistor, description of "one of a source and a drain" (or a first electrode or a first terminal), and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground voltage, for example, "voltage" can be replaced with "potential." The ground voltage does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive film" can be changed into the term "conductive layer" in some cases. Also, the term "insulating film" can be changed into the term "insulating layer" in some cases.

Notes on Definitions of Terms

The following are definitions of the terms that are not mentioned in the above embodiments.
<<Switch>>

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of a mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.
<<Channel Length>>

In this specification and the like, the channel length refers to, for example, a distance between a source and a drain in a region where a semiconductor (or a portion where a current flows in a semiconductor when a transistor is on) and a gate overlap with each other or a region where a channel is formed in a plan view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a plan view of the transistor.

In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

<<Connection>>

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive layer, and a layer).

Example 1

In this example, as the device including a conductive layer of one embodiment of the present invention, a device was fabricated referring to the device 500 illustrated in FIG. 2B, and a cross section was observed.
[Sample Fabrication]

First, a 126.6 mm silicon wafer square was prepared as the substrate 400. Then, as an insulating film 464h, a 100-nm-thick film of silicon oxynitride was deposited over the silicon wafer. Then, a 150-nm-thick film of tungsten was deposited over the silicon oxynitride film.

The deposition of the silicon oxynitride film was conducted by a PECVD method under the conditions where the substrate temperature was 325° C., an 13.56 MHz RF power source was used, the electric power was 35 W, the pressure was 133.3 Pa, and the gas was 5 sccm monosilane and 1000 sccm dinitrogen monoxide. The deposition of the tungsten film was conducted by a sputtering method under the conditions where the substrate temperature was 130° C., a 1 kW DC power source was used, the pressure was 0.8 Pa, and the gas was approximately 80 sccm argon. The distance between the target and the substrate was 60 mm.

Figure 51A:
FIGS. 51A to 51D are cross-sectional views illustrating an example of a method for manufacturing a device of one embodiment of the present invention.

Next, a resist mask was formed over the tungsten film, and part of the tungsten film was removed by dry etching to form the conductive layer 512. Then, the resist mask was removed (the step is schematically illustrated in FIG. 51A). The dry etching conditions of the tungsten film were as follows: the distance between an upper electrode and the substrate was 115 mm, the pressure was 2.0 Pa, the electric power of an RF power source was 1250 W on the upper side and 50 W on the lower side, and the etching gas was 28 sccm tetrafluoromethane, 24 sccm oxygen, and 14 sccm chlorine.

Figure 51B:
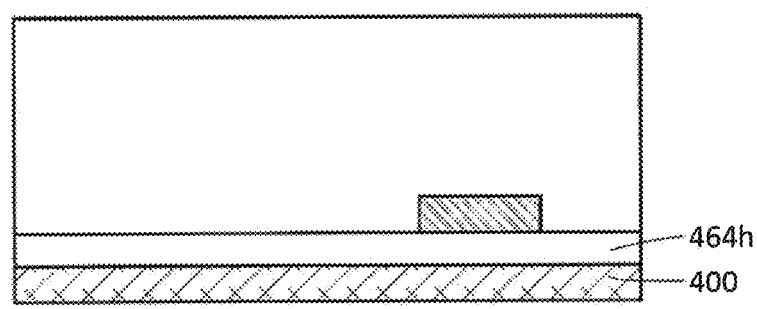
Figure 51C:
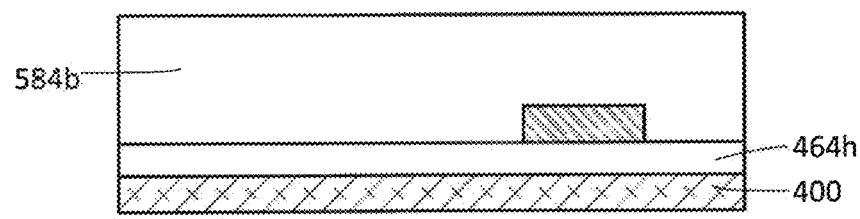

Next, as an insulating film 584b, a 800-nm-thick film of silicon oxide was deposited over the silicon wafer and the conductive layer 512 (the step is schematically illustrated in FIG. 51B). Then, the silicon oxide film was polished by a CMP method so that an approximately 300 nm thick film of silicon oxide remains over the conductive layer 512 (the step is schematically illustrated in FIG. 51C).

The silicon oxide film was deposited by PECVD method under the conditions where the substrate temperature was 300° C., a 27 MHz RF power source was used, the electric power was 300 W, the pressure was 100 Pa, and the gas was 15 sccm tetraethyl orthosilicate (TEOS) and 750 sccm oxygen.

The polishing conditions in the CMP method were as follows. As a polishing cloth, IC1000/SUBA (registered trademark) using polyurethane foam, which was produced by Nitta Haas Incorporated, was used. As slurry, Semi-Sperse (registered trademark) 25 using fumed silica, which was produced by Cabot Microelectronics, was used. The flow rate of the slurry was 150 mL/min and the polishing pressure was 3.6 psi. The numbers of rotations of a polishing head and a table were 93 rpm and 90 rpm, respectively. The polishing treatment was performed while the processed object was attached to the polishing head and the polishing cloth was attached to the table. After the polishing, megasonic cleaning was performed.

Figure 51D:
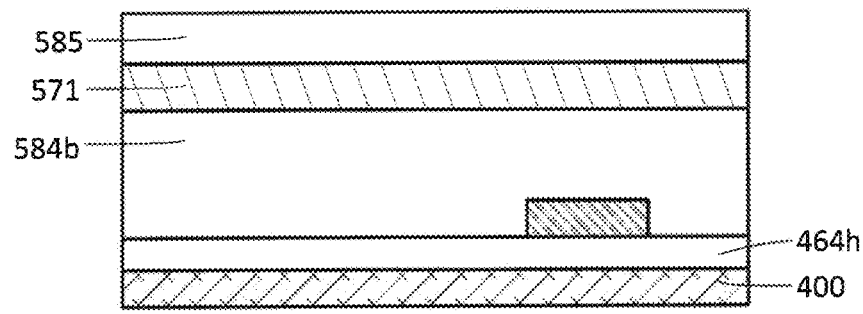

Then, as the insulating film 571, a 50-nm-thick aluminum oxide film was deposited over the silicon oxide film. Then, as the insulating film 585, a 50-nm-thick silicon oxynitride film was deposited over the insulating film 571 (the process overview was illustrated in FIG. 51D). The deposition of the aluminum oxide film was conducted by a sputtering method under the conditions where a target of aluminum oxide was used, a 2.5 kW RF power source was used as a power source, the pressure was 0.4 Pa, and the deposition gas was 25 sccm argon and 25 sccm oxygen. The distance between the target and the substrate was 60 mm.

The deposition conditions of the silicon oxynitride film were as follows. The substrate temperature was 450° C., a 60 MHz RF power source was used, the electric power was 150 W, the pressure was 40 Pa, and the gas was 1 sccm monosilane and 800 sccm dinitrogen monoxide.

As for the subsequent process, FIGS. 5B to 8C may be referred.

Next, a resist mask was formed over the insulating film 585, and an opening was formed in the insulating film 585, the insulating film 571, and the insulating film 584b over the conductive layer 512. The removal of part of the insulating film 585, the insulating film 571, and the insulating film 584b was conducted by dry etching.

The etching of the insulating film 585, the insulating film 571, and the insulating film 584b was conducted in five steps.

The treatment conditions of the first step were as follows. The distance between an upper electrode and the substrate was 40 mm, the pressure was 6.5 Pa, the electric power of an RF power source was 1000 W on the upper side and 100 W on the lower side, the etching gas was 100 sccm tetrafluoromethane, the treatment time was 39 sec, and the temperature of the chamber was 20° C.

The treatment conditions of the second step were as follows. The distance between an upper electrode and the substrate was 25 mm, the pressure was 3.3 Pa, the electric power of an RF power source was 1800 W on the upper side and 2000 W on the lower side, the etching gas was 800 sccm argon, 30 sccm oxygen, and 22 sccm hexafluoro-1,3-butadiene, and the treatment time was 7 sec.

The treatment conditions of the third step were as follows. The distance between an upper electrode and the substrate was 25 mm, the pressure was 5.2 Pa, the electric power of an RF power source was 300 W on the upper side and 1200 W on the lower side, the etching gas was 275 sccm argon and 50 sccm trifluoromethane, and the treatment time was 3 sec.

The treatment conditions of the fourth step were as follows. The distance between an upper electrode and the substrate was 25 mm, the pressure was 2.6 Pa, the electric power of an RF power source was 300 W on the upper side and 1200 W on the lower side, the etching gas was 275 sccm argon and 50 sccm trifluoromethane, and the treatment time was 30 sec.

The treatment conditions of the fifth step were as follows. The distance between an upper electrode and the substrate was 25 mm, the pressure was 3.3 Pa, the electric power of an RF power source was 1800 W on the upper side and 2000 W on the lower side, the etching gas was 800 sccm argon, 30 sccm oxygen, and 22 sccm hexafluoro-1,3-butadiene, and the treatment time was 43 sec.

Next, a 5-nm-thick film of titanium nitride was deposited in the opening of the insulating film 585 and over the insulating film 585, as a conductive film to be the conductive layer 543*a*. Then, as a conductive film to be the conductive layer 543*b*, a 250-nm-thick film of tungsten was deposited in the opening of the insulating film 585 and over the insulating film 585, over the titanium nitride film, so as to fill the opening.

The deposition conditions of the titanium nitride film were as follows. Titanium tetrachloride was introduced at a flow rate of 50 sccm for 0.05 sec so as to be adsorbed onto the insulating film 585, and a nitrogen gas was introduced at a flow rate of 4500 sccm for 0.2 sec for purge treatment. Next, an ammonia gas was introduced at a flow rate of 2700 sccm for 0.3 sec so as to be adsorbed onto the insulating film 585, and then a nitrogen gas was introduced at a flow rate of 4000 sccm for 0.3 sec. This is one cycle for depositing the titanium nitride film. The thickness was adjusted by controlling the number of cycles. The temperature of the substrate stage was set at 412° C., the pressure was 667 Pa, and the distance between the substrate stage and the gas emission stage was 3 mm.

The deposition of the tungsten film was conducted in three steps.

In the first step, a 3-nm thick film was deposited by performing three cycles under the conditions where the gas for deposition was 160 sccm tungsten hexafluoride, 400 sccm silane, 6000 sccm argon, 2000 sccm nitrogen, and 4000 sccm argon for the rear side of the stage, the pressure in the chamber was 1000 Pa during the deposition, and the temperature of the substrate stage was 390° C.

In the second step, a 41-nm thick film was deposited in 15 sec under the conditions where the gas for deposition was 250 sccm tungsten hexafluoride, 2200 sccm and 1700 sccm hydrogen (for two gas lines), 2000 sccm argon, 200 sccm nitrogen, and 4000 sccm argon for the rear side of the stage, the pressure in the chamber was 10666 Pa during the deposition, and the temperature of the substrate stage was 390° C.

In the third step, the gas for deposition was 250 sccm tungsten hexafluoride, 2200 sccm and 1700 sccm hydrogen (for two gas lines), 2000 sccm argon, 200 sccm nitrogen, and 4000 sccm argon for the rear side of the stage, the pressure in the chamber was 10666 Pa during the deposition, and the temperature of the substrate stage was 390° C.

Next, top surfaces of the tungsten film and the titanium nitride film were polished by a CMP method so as to expose the insulating film 585; thus, the conductive layer 543*a* and the conductive layer 543*b* over the conductive layer 543*a* were formed.

The polishing conditions in the CMP method were as follows. As a polishing cloth, IC1000/SUBA (registered trademark) using polyurethane foam, which was produced by Nitta Haas Incorporated, was used. As slurry, W7300-B21 using colloidal silica, which was produced by Cabot Microelectronics, was used. The flow rate of the slurry was 150 mL/min and the polishing pressure was 3.0 psi. The numbers of rotations of a polishing head and a table were 93 rpm and 90 rpm, respectively. The polishing treatment was performed while the processed object was attached to the polishing head and the polishing cloth was attached to the table. After the polishing, megasonic cleaning and cleaning with a diluted hydrofluoric acid was performed.

Next, as the insulating film 586, a 120-nm-thick film of silicon oxynitride was deposited over the insulating film 585 and the conductive layer 543*b*. For the deposition conditions of the silicon oxynitride film, the deposition conditions of the insulating film 585 were referred to. The substrate temperature was set here at 500° C.

Next, a resist mask was formed over the insulating film 586, and an opening was formed in the insulating film 586 and the insulating film 585. The removal of part of the insulating film 586 and the insulating film 585 was conducted by dry etching. The dry etching was conducted in two steps.

The treatment conditions of the first step were as follows. The distance between an upper electrode and the substrate was 40 mm, the pressure was 6.5 Pa, the electric power of an RF power source was 1000 W on the upper side and 100 W on the lower side, the etching gas was 100 sccm tetrafluoromethane, the treatment time was 39 sec, and the temperature of the chamber was 20° C.

The treatment conditions of the second step were as follows. The distance between an upper electrode and the substrate was 40 mm, the pressure was 3.3 Pa, the electric power of an RF power source was 500 W on the upper side and 1150 W on the lower side, the etching gas was 800 sccm argon, 30 sccm oxygen, and 22 sccm hexafluoro-1,3-butadiene, and the treatment time was 32 sec.

Next, as a conductive film to be the conductive layer 513*a*, a titanium nitride film was deposited in the opening of the insulating film 586 and over the insulating film 586. Then, as a conductive film to be the conductive layer 513*b*, a 250-nm-thick film of tungsten was deposited in the opening of the insulating film 586 and over the insulating film 586 so as to fill the opening. Here, samples 1 and 2 with different thicknesses of the conductive layer 513*a* were fabricated. The conductive film of titanium nitride to be the conductive layer 513*a* has a thickness of 5 nm in the sample 1 and 10 nm in the sample 2. For the deposition conditions of the titanium nitride film, the deposition conditions of the conductive layer 543*a* were referred to. Furthermore, for the deposition conditions of the tungsten film, the deposition conditions of the conductive layer 543*b* were referred to.

Next, top surfaces of the tungsten film and the titanium nitride film were polished by a CMP method so as to expose the insulating film 586; thus, the conductive layer 513*a* and the conductive layer 513*b* over the conductive layer 513*a* were formed.

The CMP conditions were as follows. As a polishing cloth, IC1000/SUBA (registered trademark) using polyurethane foam, which was produced by Nitta Haas Incorporated, was used. As slurry, W7300-B21 using colloidal silica, which was produced by Cabot Microelectronics, was used. The flow rate of the slurry was 150 mL/min and the polishing pressure was 3.0 psi. The numbers of rotations of a polishing head and a table were 93 rpm and 90 rpm, respectively. The polishing treatment was performed while the processed object was attached to the polishing head and the polishing cloth was attached to the table. After the polishing, megasonic cleaning and cleaning with a diluted hydrofluoric acid was performed.

Through the above-described process, the samples 1 and 2 were fabricated.

[Observation of Samples]

Next, as a coating layer 633 of the fabricated samples 1 and 2, a carbon film and a platinum film over the carbon film were deposited. Then, a cross section was processed with a focused ion beam (FIB).

Then, a cross section was observed by scanning transmission electron microscopy (STEM), specifically, with the use of Ultra-thin Film Evaluation System HD-2300 manufactured by Hitachi High-Technologies Corporation. The accelerating voltage was 200 kV. The observation results for the sample 1 are shown in FIGS. 52A and 52B and FIG. 53, and those for the sample 2 are shown in FIGS. 54A and 54B and FIG. 55.

Figure 52A:
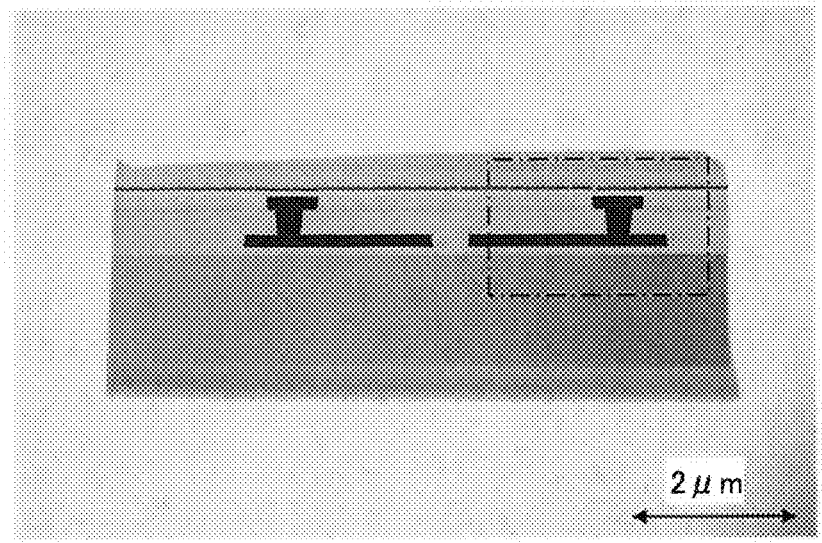
FIGS. 52A and 52B show cross sections observed by STEM.
Figure 52B:
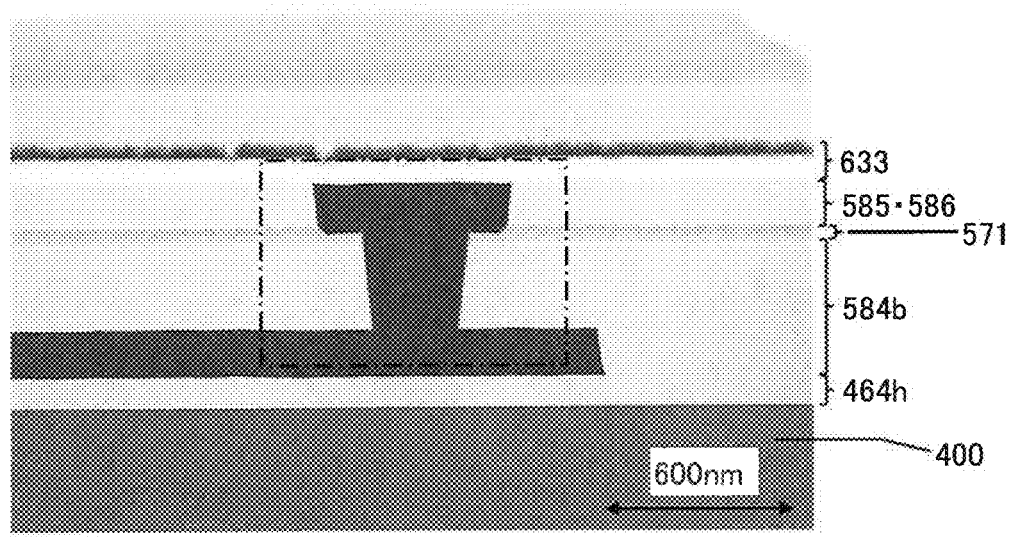
Figure 53:
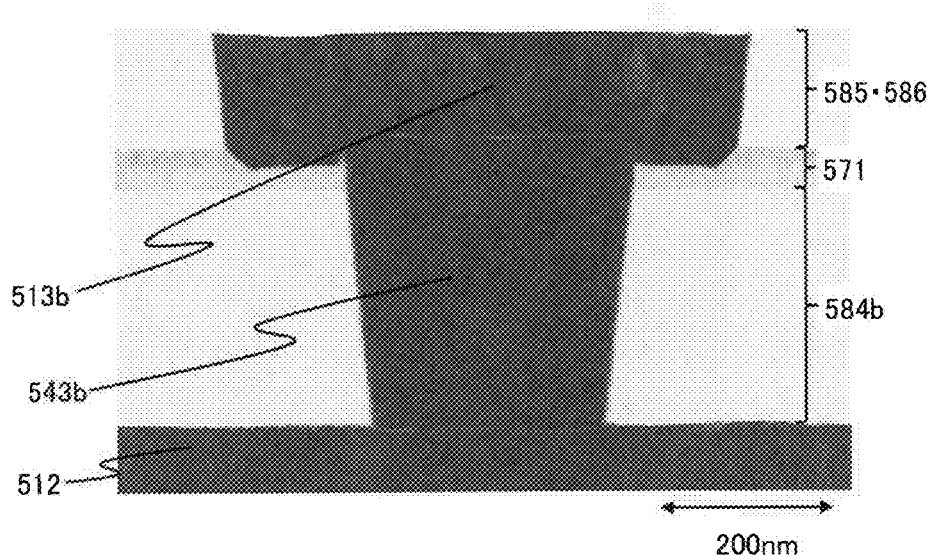
FIG. 53 shows a cross section observed by STEM.
Figure 54A:
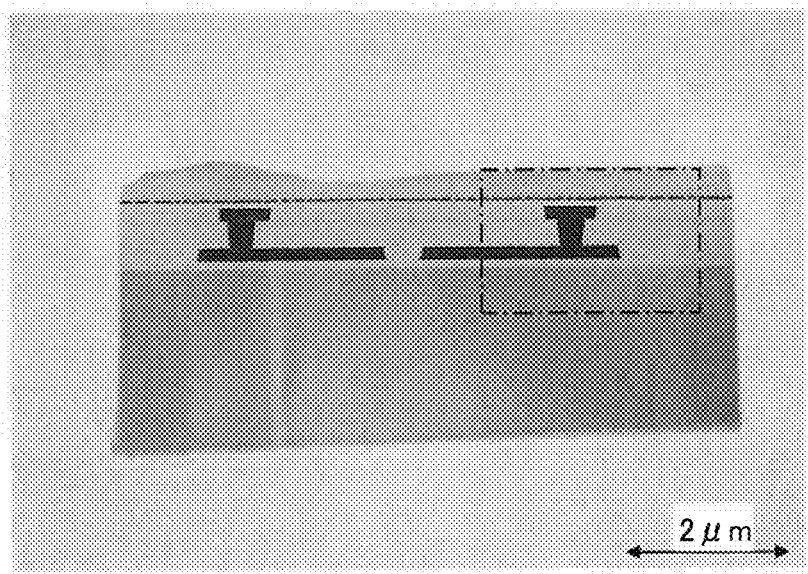
FIGS. 54A and 54B show cross sections observed by STEM.
Figure 54B:
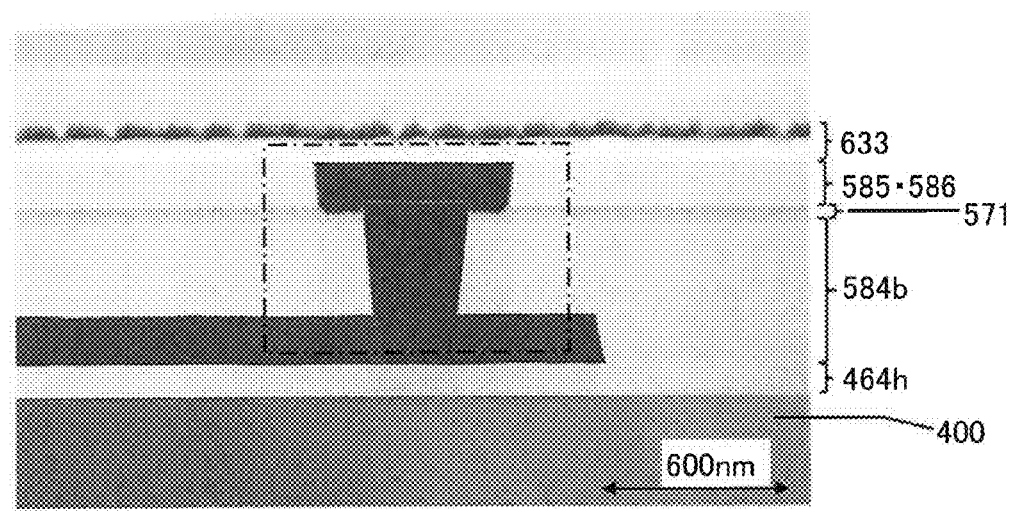

FIG. 52A shows the observed cross section of the sample 1, FIG. 52B shows an enlarged view of a region surrounded by the dashed-dotted line in FIG. 52A, and FIG. 53 shows an enlarged view of a region surrounded by the dashed-dotted line in FIG. 52B. FIG. 54A shows the observed cross section of the sample 2, FIG. 54B shows an enlarged view of a region surrounded by the dashed-dotted line in FIG. 54A, and FIG. 55 shows an enlarged view of a region surrounded by the dashed-dotted line in FIG. 54B. The magnification of FIG. 52A and FIG. 54A is 13,000 times, that of FIG. 52B and FIG. 54B is 50,000 times, and that of FIG. 53 and FIG. 55 is 150,000 times. In FIG. 53 and the like, reference numerals for the conductive layers 513a and 543a are omitted.

Figure 55:
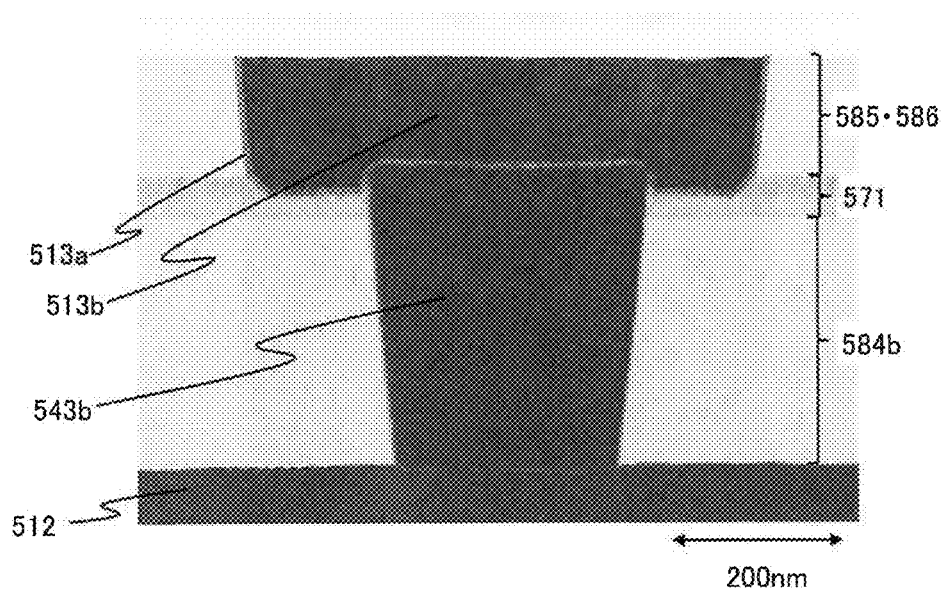
FIG. 55 shows a cross section observed by STEM.

In the cross sections in FIG. 53 and FIG. 55, top surfaces of the conductive layers 543a and 543b are positioned higher than the top surface of the insulating film 571.

As shown in FIG. 52A to FIG. 55, the conductive layer 543a and the conductive layer 543b favorably fill the opening formed in the insulating film 584b, the insulating film 571, and the like. Moreover, as shown in FIG. 55 and the like, the conductive layer 513a favorably covers the opening formed in the insulating film 585, the insulating film 586, and the like, and the conductive layer 513b is formed over the conductive layer 513a so as to fill the opening.

Example 2

In this example, the estimation of the resistance was performed for the case where two or more conductive layers are connected by a conductive layer functioning as a plug.
[Sample Fabrication]

First, samples T-1 to T-4 were prepared. For the samples T-1 to T-4, a plurality of semiconductor elements were formed over the substrate 400. As the substrate 400, a silicon wafer was used. As the semiconductor elements, transistors including silicon in channel regions and the like were formed. Then, the conductive layer 512 was formed and the insulating film 584 was formed over a top surface of the conductive layer 512. In the following description, unless otherwise specified, the same treatment was performed on the samples T-1 to T-4.

As the insulating film 571 over the insulating film 584, a 30-nm thick film of aluminum oxide was deposited. The aluminum oxide film was deposited by a sputtering method using an aluminum oxide target. Then, a 50-nm thick film of silicon oxide was deposited as the insulating film 585. The silicon oxide film was deposited by a plasma CVD method using $SiH_4$ and $N_2O$ gases.

Then, a mask was formed, and an opening was formed in the silicon oxide film, the aluminum oxide film, and the insulating film 584 by etching. The mask was formed in such a manner that films of tungsten and silicon nitride as a hard mask were deposited, an organic film was applied, and light exposure was performed. Then, part of the films of tungsten and silicon nitride were removed by dry etching; thus, the hard mask was formed.

Next, the insulating film 584 and the insulating film 585 were partly removed by dry etching. As a dry etching gas, hexafluoro-1,3-butadiene, oxygen, and argon were used. Then, hydrogen, octafluorocyclobutane, and argon were used. Then, hexafluoro-1,3-butadiene, oxygen, and argon were used.

Then, a 10-nm thick film of titanium nitride was deposited inside the opening and on a surface of the insulating film 585, as a conductive film to be the conductive layer 543a. Then, a 150-nm thick film of tungsten was deposited over the titanium nitride film, as a conductive film to be the conductive layer 543b so as to fill the opening.

Next, top surfaces of the films of tungsten and titanium nitride were polished by a CMP method so as to expose the insulating film 585. Thus, the conductive layer 543a and the conductive layer 543b over the conductive layer 543a were formed.

Next, as the insulating film 586, a 120-nm thick film of silicon oxide was deposited by a plasma CVD method using $SiH_4$ and $N_2O$ gases.

Then, a resist mask was formed over the insulating film 586, and an opening was formed in the insulating film 586 and the insulating film 585. For the removal of part of the insulating film 586 and the insulating film 585, dry etching was used.

Then, a conductive film to be the conductive layer 513a was deposited in the opening and over a surface of the insulating film 586. For the samples T-1 and T-2, a 20-nm thick film of tantalum nitride and a 5-nm thick film of titanium nitride over the tantalum nitride film were deposited. For the samples T-3 and T-4, a 5-nm thick film of titanium nitride was deposited. The tantalum nitride film was deposited by a sputtering method.

Then, as a conductive film to be the conductive layer 513b, a 250-nm thick film of tungsten was deposited in the opening and on a surface of the sample T-1 so as to fill the opening.

Next, the films of tungsten, titanium nitride, and tantalum nitride were polished by a CMP method so as to expose a surface of the insulating film 586, so that the conductive layer 513a and the conductive layer 513b were formed.
[Sample Measurement]

Figure 56A:
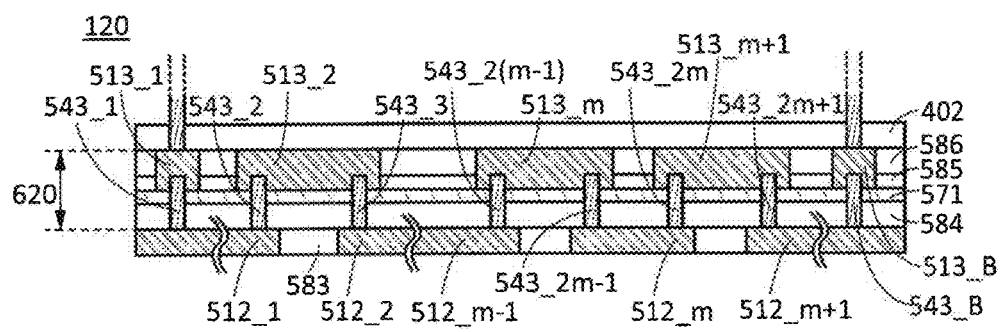
FIGS. 56A and 56B are a cross-sectional view and a top view, respectively, of an element.

Here, a schematic view of a cross section of an element 120 that was used in the measurement of this example is illustrated in FIG. 56A. The structure illustrated in FIG. 56A includes (m+2) conductive layers 513, (m+1) conductive layers 512, and (2m+2) conductive layers 543. For example, the m-th conductive layer 512 is connected to the (2m−1)-th conductive layer 543 and the 2m-th conductive layer 543. The (2m−1)-th conductive layer 543 is connected to the m-th conductive layer 513, and the 2m-th conductive layer 543 is connected to the (m+1)-th conductive layer 513. The number of conductive layers 543 included in the element used in this measurement of this example is 1488.

Figure 56B:
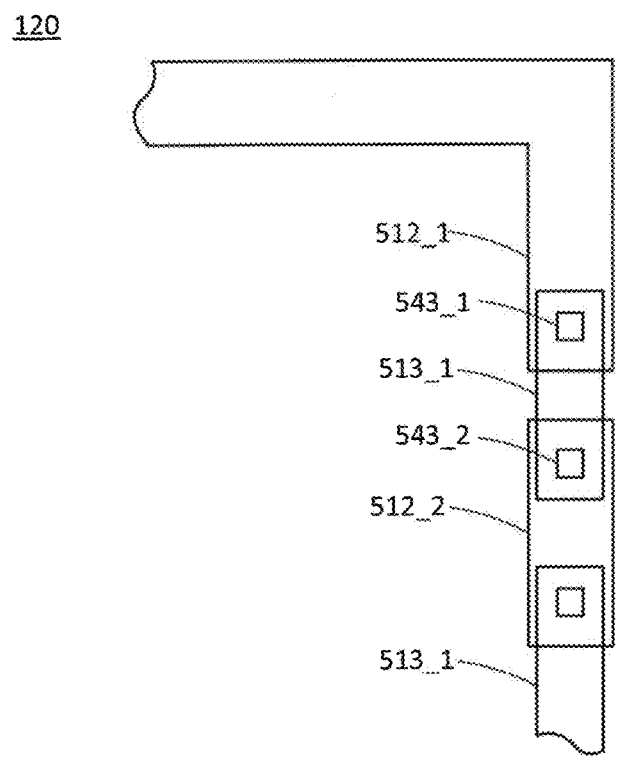

FIG. 56B illustrates part of a top surface of the element 120. In the top view, the conductive layer 543 substantially has a square shape with a side of approximately 170 nm. The conductive layer 543 functions as a plug, and the conductive layer 512 and the conductive layer 513 function as wirings. The line width of the conductive layer 512 is approximately 560 nm, and that of the conductive layer 513 is approximately 440 nm. Note that the first conductive layer 512 and the (m+2)-th conductive layer 512 have a wide region larger than or equal to a 50 µm square.

Figure 57:
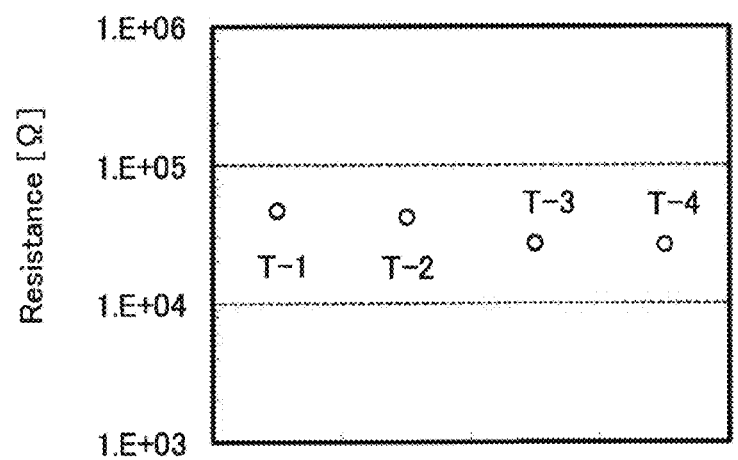
FIG. 57 shows measured resistance of elements.

Three elements 120 in each of the samples T-1 to T-4 were measured. FIG. 57 shows resistance at a voltage of 0.1 V in current-voltage characteristics. Each sample had sufficiently low resistance with little variation among elements.

REFERENCE NUMERALS

120: element, 150: capacitor, 400: substrate, 402: insulating film, 404: conductive layer, 406: semiconductor, 406a: semiconductor, 406b: semiconductor, 406c: semiconductor, 407: channel formation region, 408: insulating film, 412: insulating film, 413: conductive layer, 416a: conductive layer, 416b: conductive layer, 418: insulating film, 423a: low-resistance region, 423b: low-resistance region, 426a: conductive layer, 426b: conductive layer, 454: conductive layer, 460: element isolation region, 462: insulating film, 464a: insulating film, 464b: insulating film, 464h: insulating film, 470: insulating film, 474: region, 476: region, 490: transistor, 490b: transistor, 491: transistor, 492: transistor, 493: transistor, 500: device, 511: conductive layer, 512: conductive layer, 512b: conductive layer, 512c: conductive layer, 513: conductive layer, 513a: conductive layer, 513b: conductive layer, 513c: conductive film, 513d: conductive film, 513e: conductive layer, 514: conductive layer, 515: conductive layer, 516: conductive layer, 516b: conductive layer, 517: conductive layer, 518: conductive layer, 519: conductive layer, 521: conductive layer, 522: conductive layer, 522a: conductive layer, 522b: conductive layer, 523: conductive layer, 523a: conductive layer, 523b: conductive layer, 524: conductive layer, 526: conductive film, 527: conductive layer, 528: conductive layer, 529: conductive layer, 530: conductive layer, 530b: conductive layer, 541: conductive layer, 541c: conductive layer, 542: conductive layer, 543: conductive layer, 543a: conductive layer, 543b: conductive layer, 543c: conductive film, 543d: conductive film, 543e: conductive layer, 544: conductive layer, 544b: conductive layer, 544c: conductive layer, 545: conductive layer, 546: conductive layer, 547: conductive layer, 547b: conductive layer, 548: conductive layer, 571: insulating film, 572: insulating film, 581: insulating film, 581a: insulating film, 581b: insulating film, 582: insulating film, 583: insulating film, 583a: insulating film, 583b: insulating film, 584: insulating film, 584b: insulating film, 585: insulating film, 586: insulating film, 587: insulating film, 588: insulating film, 589: insulating film, 590: insulating film, 591: insulating film, 591b: insulating film, 592: insulating film, 593: insulating film, 594: insulating film, 595: insulating film, 598: insulating film, 599: insulating film, 601: opening, 602: opening, 603: opening, 604: conductive layer, 605: opening, 606: projection portion, 606a: semiconductor, 606b: semiconductor, 606c: semiconductor, 607: mask, 608: mask, 610: thickness, 611: mask, 612: insulating film, 613: conductive layer, 614: mask, 616a: conductive layer, 616b: conductive layer, 618: insulating film, 619: insulating film, 620: layer, 621: layer, 622: layer, 623: layer, 624: layer, 625: layer, 631: insulating film, 632: insulating film, 633: coating layer, 660a: capacitor, 660b: capacitor, 661a: transistor, 661b: transistor, 662a: transistor, 662b: transistor, 663a: inverter, 663b: inverter, 700: substrate, 701: pixel portion, 702: scan line driver circuit, 703: scan line driver circuit, 704: signal line driver circuit, 710: capacitor wiring, 712: gate wiring, 713: gate wiring, 714: source or drain electrode layer, 716: transistor, 717: transistor, 718: liquid crystal element, 719: liquid crystal element, 720: pixel, 721: switching transistor, 722: driver transistor, 723: capacitor, 724: light-emitting element, 725: signal line, 726: scan line, 727: power supply line, 728: common electrode, 800: RF tag, 801: communication device, 802: antenna, 803: radio signal, 804: antenna, 805: rectifier circuit, 806: constant voltage circuit, 807: demodulation circuit, 808: modulation circuit, 809: logic circuit, 810: memory circuit, 811: ROM, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: refrigerator door, 933: freezer door, 941: housing, 942: housing, 943: display portion, 944: operation keys, 945: lens, 946: joint, 951: car body, 952: wheels, 953: dashboard, 954: lights, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory device, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2000: imaging device, 2001: switch, 2002: switch, 2003: switch, 2010: pixel portion, 2011: pixel, 2012: subpixel, 2012B: subpixel, 2012G: subpixel, 2012R: subpixel, 2020: photoelectric conversion element, 2030: pixel circuit, 2031: wiring, 2047: wiring, 2048: wiring, 2049: wiring, 2050: wiring, 2053: wiring, 2054: filter, 2054B: filter, 2054G: filter, 2054R: filter, 2055: lens, 2056: light, 2057: wirings, 2060: peripheral circuit, 2070: peripheral circuit, 2080: peripheral circuit, 2090: peripheral circuit, 2091: light source, 2100: transistor, 2200: transistor, 2360: photodiode, 2361: electrode, 2362: electrode, 2363: low-resistance layer, 4000: RF tag, 5100: pellets, 5120: substrate, 5161: region.

This application is based on Japanese Patent Application serial no. 2015-022396 filed with Japan Patent Office on Feb. 6, 2015 and Japanese Patent Application serial no. 2015-053431 filed with Japan Patent Office on Mar. 17, 2015, the entire contents of which are hereby incorporated by reference.

The invention claimed is:

1. A method for manufacturing a device, comprising the steps of:
    forming a first insulating film over a substrate;
    forming a second insulating film over the first insulating film;
    etching part of the first insulating film and first part of the second insulating film to form a first opening;
    forming a first conductor in the first opening and over a top surface of the second insulating film;
    removing part of the first conductor by planarizing a surface of the first conductor to form a second conductor;
    forming a third insulating film over the second insulating film and the second conductor;
    removing second part of the second insulating film and part of the third insulating film to form a second opening, so that part of a top surface of the second conductor and part of a side surface of the second conductor are exposed;
    forming a third conductor over a top surface of the third insulating film and in the second opening, the third conductor being formed to be in contact with the second conductor; and
    removing part of the third conductor to form a fourth conductor,
    wherein an etching rate of the first insulating film is lower than an etching rate of the second insulating film.

2. The method for manufacturing a device according to claim 1, comprising the step of forming an element over the fourth conductor,
wherein the element comprises an oxide semiconductor.

3. The method for manufacturing a device according to claim 1,
wherein the first insulating film comprises aluminum,
wherein the second insulating film comprises silicon.

4. The method for manufacturing a device according to claim 1,
wherein the first insulating film has a lower hydrogen-transmitting property than the second insulating film.

5. A method for manufacturing a device, comprising the steps of:
forming a first insulating film over a substrate;
forming a second insulating film over the first insulating film;
etching part of the first insulating film and first part of the second insulating film to form a first opening;
forming a first conductor in the first opening and over a top surface of the second insulating film;
removing part of the first conductor by a chemical mechanical polishing method to make a surface of the first conductor parallel to a bottom surface of the substrate, so that a second conductor is formed in the first opening;
forming a third insulating film over the second insulating film and the second conductor;
removing second part of the second insulating film and part of the third insulating film to form a second opening, so that part of a top surface of the second conductor and part of a side surface of the second conductor are exposed;
forming a third conductor over a top surface of the third insulating film and in the second opening, the third conductor being formed to be in contact with the second conductor; and
removing part of the third conductor to form a fourth conductor,
wherein an etching rate of the first insulating film is lower than an etching rate of the second insulating film.

6. The method for manufacturing a device according to claim 5, comprising the step of forming an element over the fourth conductor,
wherein the element comprises an oxide semiconductor.

7. The method for manufacturing a device according to claim 5,
wherein the first insulating film comprises aluminum,
wherein the second insulating film comprises silicon.

8. The method for manufacturing a device according to claim 5,
wherein the first insulating film has a lower hydrogen-transmitting property than the second insulating film.

9. A method for manufacturing a device, comprising the steps of:
forming a first insulating film over a substrate;
forming a second insulating film over the first insulating film;
etching part of the first insulating film and first part of the second insulating film to form a first opening;
forming a first conductor in the first opening and over a top surface of the second insulating film;
removing part of the first conductor by a chemical mechanical polishing method to make a surface of the first conductor parallel to a bottom surface of the substrate, so that a second conductor is formed in the first opening;
forming a third insulating film over the second insulating film and the second conductor;
removing second part of the second insulating film and part of the third insulating film to form a second opening, so that part of a top surface of the second conductor and part of a side surface of the second conductor are exposed;
forming a third conductor over a top surface of the third insulating film and in the second opening, the third conductor being formed to be in contact with the second conductor; and
removing part of the third conductor by a chemical mechanical polishing method to make a surface of the third conductor parallel to the bottom surface of the substrate, so that a fourth conductor is formed in the second opening,
wherein an etching rate of the first insulating film is lower than an etching rate of the second insulating film.

10. The method for manufacturing a device according to claim 9, comprising the step of forming an element over the fourth conductor,
wherein the element comprises an oxide semiconductor.

11. The method for manufacturing a device according to claim 9,
wherein the first insulating film comprises aluminum,
wherein the second insulating film comprises silicon.

12. The method for manufacturing a device according to claim 9,
wherein the first insulating film has a lower hydrogen-transmitting property than the second insulating film.

* * * * *